(12) United States Patent
Micali et al.

(10) Patent No.: US 9,691,030 B2
(45) Date of Patent: *Jun. 27, 2017

(54) ASSISTED LABELING OF DEVICES WITH DISAGGREGATION

(71) Applicant: Sense Labs, Inc., Cambridge, MA (US)

(72) Inventors: Christopher M. Micali, Concord, MA (US); Michael S. Phillips, Belmont, MA (US); Vanessa Lee MacAulay, Cambridge, MA (US); Ryan T. Houlette, Cambridge, MA (US)

(73) Assignee: Sense Labs, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/217,420

(22) Filed: Jul. 22, 2016

(65) Prior Publication Data

US 2016/0328651 A1     Nov. 10, 2016

Related U.S. Application Data

(63) Continuation of application No. 14/707,665, filed on May 8, 2015, now Pat. No. 9,443,195, which is a
(Continued)

(51) Int. Cl.
*G06N 5/00* (2006.01)
*G06F 1/00* (2006.01)
(Continued)

(52) U.S. Cl.
CPC .............. *G06N 5/04* (2013.01); *G01R 21/133* (2013.01); *G06N 99/005* (2013.01); *G06Q 50/06* (2013.01); *G06Q 10/20* (2013.01)

(58) Field of Classification Search
CPC  G06N 5/02; G06N 5/04; G06N 5/048; G06N 7/005
See application file for complete search history.

(56) References Cited

U.S. PATENT DOCUMENTS 6,311,105 B1    10/2001  Budike
7,085,814 B1     8/2006  Gandhi et al.
(Continued)

FOREIGN PATENT DOCUMENTS

JP         2012016270 A      1/2012
KR   1020100111170 A    10/2010
(Continued)

OTHER PUBLICATIONS

Alles, et al., "A Commercial Disaggregation System for Residential and Light Commercial Buildings", Presented on Jun. 3, 2014 at the NILM Workshop 2014, University of Texas at Austin, http://nilmworkshop14.files.wordpress.com/2014/05/alles_commercial.pdf, accessed on Dec. 22, 2014, 4 pages.
(Continued)

*Primary Examiner* — Stanley K Hill
*Assistant Examiner* — Kalpana Bharadwaj
(74) *Attorney, Agent, or Firm* — GTC Law Group PC & Affiliates

(57) ABSTRACT

Electrical usage of devices in a building may be monitored to assist a user in labeling devices. In some implementations, a user may provide information about a first device, and this information may be used to obtain a plurality of mathematical models that each correspond to a device or a class of devices. The mathematical models may be used to process an electrical signal, and a score may be generated for each mathematical model. A mathematical model may be selected from the plurality of mathematical models using the scores, such as selecting a mathematical model with a highest score. The first device may be associated with the selected mathematical model.

20 Claims, 17 Drawing Sheets

Related U.S. Application Data continuation-in-part of application No. 14/554,962, filed on Nov. 26, 2014, now Pat. No. 9,057,746.

(51) Int. Cl.
  *G06N 5/04* (2006.01)
  *G06N 99/00* (2010.01)
  *G06Q 50/06* (2012.01)
  *G01R 21/133* (2006.01)
  *G06Q 10/00* (2012.01)

(56) References Cited

U.S. PATENT DOCUMENTS

| | | | |
|---|---|---|---|
| 7,353,182 | B1 | 4/2008 | Missinhoun et al. |
| 8,239,073 | B2 | 8/2012 | Fausak et al. |
| 9,057,746 | B1 | 6/2015 | Houlette et al. |
| 9,152,737 | B1 | 10/2015 | Micali et al. |
| 9,172,623 | B1 | 10/2015 | Micali et al. |
| 9,443,195 | B2 | 9/2016 | Micali et al. |
| 2002/0178047 | A1 | 11/2002 | Or et al. |
| 2003/0216971 | A1 | 11/2003 | Sick et al. |
| 2005/0034023 | A1 | 2/2005 | Maturana et al. |
| 2005/0085973 | A1 | 4/2005 | Furem et al. |
| 2005/0108582 | A1 | 5/2005 | Fung et al. |
| 2009/0222360 | A1 | 9/2009 | Schmitt et al. |
| 2010/0211222 | A1 | 8/2010 | Ghosn et al. |
| 2010/0217550 | A1 | 8/2010 | Crabtree et al. |
| 2010/0332373 | A1 | 12/2010 | Crabtree et al. |
| 2011/0066300 | A1 | 3/2011 | Tyagi et al. |
| 2012/0022713 | A1 | 1/2012 | Deaver et al. |
| 2012/0181869 | A1 | 7/2012 | Chapel et al. |
| 2012/0197448 | A1 | 8/2012 | Shin et al. |
| 2012/0197560 | A1 | 8/2012 | Kuhns et al. |
| 2012/0278272 | A1 | 11/2012 | Kim et al. |
| 2012/0290230 | A1 | 11/2012 | Berges Gonzalez et al. |
| 2013/0066479 | A1 | 3/2013 | Shetty et al. |
| 2013/0132009 | A1 | 5/2013 | Rolia et al. |
| 2013/0268357 | A1 | 10/2013 | Heath et al. |
| 2014/0207255 | A1 | 7/2014 | Tandon et al. |
| 2014/0278241 | A1 | 9/2014 | Jiang et al. |
| 2014/0303796 | A1 | 10/2014 | Jeong et al. |
| 2015/0012147 | A1 | 1/2015 | Haghighat-Kashani et al. |
| 2015/0112906 | A1 | 4/2015 | Gauthier et al. |
| 2015/0142695 | A1 | 5/2015 | He et al. |
| 2015/0149128 | A1* | 5/2015 | Baone ............... G06F 17/5009 703/2 |
| 2015/0271557 | A1* | 9/2015 | Tabe ............... H04N 21/4788 725/14 |
| 2015/0271575 | A1 | 9/2015 | Asao et al. |
| 2015/0324696 | A1 | 11/2015 | Hirschbold et al. |
| 2016/0132772 | A1 | 5/2016 | Little |
| 2016/0146866 | A1 | 5/2016 | Houlette et al. |
| 2016/0147243 | A1 | 5/2016 | Micali et al. |
| 2016/0148099 | A1 | 5/2016 | Micali et al. |

FOREIGN PATENT DOCUMENTS

| | | | |
|---|---|---|---|
| KR | 101448683 | B1 | 10/2014 |
| WO | 2013106923 | A1 | 7/2013 |
| WO | 2016085500 | A1 | 6/2016 |
| WO | 2016085942 | A1 | 6/2016 |

OTHER PUBLICATIONS

Anderson, et al., "Unsupervised Approximate Power Trace Decomposition Algorithm", Presented on Jun. 3, 2014 at the NILM Workshop 2014, University of Texas at Austin, http://nilmworkshop14.files.wordpress.com/2014/05/anderson_unsupervised.pdf , accessed on Dec. 22, 2014, 4 pages.

Armel, et al., "Is Disaggregation the Holy Grail of Energy Efficiency? The Case of Electricity", Precourt Energy Efficiency Center Technical Paper Series: PTP-2012-05-1, Stanford University, http://web.stanford.edu/group/peec/cgi-bin/docs/behavior/research/disaggregation-armel.pdf accpt./publ. in: Energy Policy, 2013, vol. 52, issue C, pp. 213-234, May 1, 2012, 50 pages.

Barker, et al., "NILM Redux: The Case for Emphasizing Applications over Accuracy", Presented on Jun. 3, 2014 at the NILM Workshop 2014, University of Texas at Austin, http://nilmworkshop14.files.wordpress.com/2014/05/barker_nilm.pdf , accessed on Dec. 22, 2014, 4 pages.

Barsim, et al., "An Approach for Unsupervised Non-Intrusive Load Monitoring of Residential Appliances", Presented on Jun. 3, 2014 at the NILM Workshop 2014, University of Texas at Austin, http://nilmworkshop14.files.wordpress.com/2014/05/barsim_approach.pdf , accessed on Dec. 22, 2014, 5 pages.

Batra, et al., "NILMTK: An Open Source Toolkit for Non-intrusive Load Monitoring", Presented on Jun. 3, 2014 at the NILM Workshop 2014, University of Texas at Austin, http://nilmworkshop14.files.wordpress.com/2014/05/batra_nilmtk.pdf , accessed on Dec. 22, 2014, 4 pages.

Bilski, et al., "Analysis of the artificial intelligence methods applicability to the non-intrusive load monitoring", Presented on Jun. 3, 2014 at the NILM Workshop 2014, University of Texas at Austin, http://nilmworkshop14.files.wordpress.com/2014/05/bilski_analysis.pdf , accessed on Dec. 22, 2014, 4 pages.

Dong, et al., "Energy Disaggregation via Adaptive Filtering", Presented on Jun. 3, 2014 at the NILM Workshop 2014, University of Texas at Austin, http://nilmworkshop14.files.wordpress.com/2014/05/dong_energy.pdf , accessed on Dec. 22, 2014, 4 pages.

Figueiredo, et al., "On the Optimization of Appliance Loads Inferred by Probabilistic Models", Presented on Jun. 3, 2014 at the NILM Workshop 2014, University of Texas at Austin, http://nilmworkshop14.files.wordpress.com/2014/05/figueiredo_optimization.pdf , accessed on Dec. 22, 2014, 4 pages.

Froehlich, et al., "Disaggregated End-Use Energy Sensing for the Smart Grid", Pervasive Computing, IEEE, vol. 10, iss. 1, Jan.-Mar. 2011, pp. 28-39.

Holmegaard, et al., "Towards Automatic Identification of Activity Modes in Electricity Consumption Data for Small and Medium Sized Enterprises", Presented on Jun. 3, 2014 at the NILM Workshop 2014, University of Texas at Austin, http://nilmworkshop14.files.wordpress.com/2014/05/holmegaard_towards.pdf , accessed on Dec. 22, 2014, 4 pages.

Jacquemod, et al., "Innovating current sensor for NILM application", Presented on Jun. 3, 2014 at the NILM Workshop 2014, University of Texas at Austin, http://nilmworkshop14.files.wordpress.com/2014/05/jacquemod_innovating.pdf , accessed Dec. 22, 2014, 4 pages.

Kelly, et al., "Metadata for Energy Disaggregation", Presented on Jun. 3, 2014 at the NILM Workshop 2014, University of Texas at Austin, http://nilmworkshop14.files.wordpress.com/2014/05/kelly_metadata.pdf , accessed on Dec. 22, 2014, 4 pages.

Li, et al., "Energy Disaggregation via Hierarchical Factorial HMM", Presented on Jun. 3, 2014 at the NILM Workshop 2014, University of Texas at Austin, http://nilmworkshop14.files.wordpress.com/2014/05/li_energy.pdf , accessed on Dec. 22, 2014, 4 pages.

Liao, et al., "Power Disaggregation for Low-sampling Rate Data", Presented on Jun. 3, 2014 at the NILM Workshop 2014, University of Texas at Austin, http://nilmworkshop14.files.wordpress.com/2014/05/liao_power.pdf , accessed on Dec. 22, 2014, 4 pages.

Maasoumy, et al., "Handling model uncertainty in model predictive control for energy efficient buildings", Energy and Building, vol. 77, Apr. 1, 2014 (online), pp. 377-392.

Makonin, et al., "Efficient Sparse Matrix Processing for Nonintrusive Load Monitoring (NILM)", Presented on Jun. 3, 2014 at the NILM Workshop 2014, University of Texas at Austin, http://nilmworkshop14.files.wordpress.com/2014/05/makonin_efficient.pdf , accessed on Dec. 22, 2014, 4 pages.

PCT/US2014/067662, "International Application Serial No. PCT/US2014/067662, International Search Report and Written Opinion mailed Aug. 12, 2015", Sense Labs, Inc., 13 pages.

PCT/US2015/062346, "International Application Serial No. PCT/US2015/062346 International Search Report and Written Opinion mailed Feb. 29, 2016", Sense Labs, Inc., 14 pages.

(56) References Cited

OTHER PUBLICATIONS

Perez, et al., "Nonintrusive Disaggregation of Residential Air-Conditioning Loads from Sub-hourly Smart Meter Data", Presented on Jun. 3, 2014 at the NILM Workshop 2014, University of Texas at Austin, http://nilmworkshop14.files.wordpress.com/2014/05/perez_nonintrusive1.pdf , accessed on Dec. 22, 2014, 4 pages.

Tang, et al., "Semi-Intrusive Load Monitoring for Large-Scale Appliances", Presented on Jun. 3, 2014 at the NILM Workshop 2014, University of Texas at Austin, http://nilmworkshop14.files.wordpress.com/2014/05/tang_semiintrusive.pdf , accessed on Dec. 22, 2014, 4 pages.

Trung, et al., "Event Detection and Disaggregation Algorithms for NIALM System", Presented on Jun. 3, 2014 at the NILM Workshop 2014, University of Texas at Austin, http://nilmworkshop14.files.wordpress.com/2014/05/trung_event.pdf , accessed on Dec. 22, 2014, 4 pages.

Tyler, et al., "Direct, Instantanious Identification of Home Appliances", Presented on Jun. 3, 2014 at the NILM Workshop 2014, University of Texas at Austin, http://nilmworkshop14.files.wordpress.com/2014/05/tyler_direct.pdf , accessed on Dec. 22, 2014, 4 pages.

"DC Electric Power", http://hyperphysics.phy-astr.gsu.edu/hbase/electric/elepow.html, (accessed on Aug. 5, 2016), 1 Page.

Brown, et al., "Using Wireless Power Meters to Measure Energy Use of Miscellaneous and Electronic Devices in Buildings", Proceedings of the Energy Efficiency in Domestic Appliances and Lighting (EEDAL) 20001 Conference, Copenhagen, Denmark, May 24-26, 2011, 14 Pages.

"Chapter 8. Remote OS Detection", Nmap Network Scanning, https://nmap.org/book/osdetect.html (accessed Mar. 13, 2017), 6 pages.

"Host Discovery, Chapter 15. Nmap Reference Guide", Nmap Network Scanning, https://nmap.org/book/man-host-discovery.html (accessed Mar. 13, 2017), 9 pages.

"Simple Service Discovery Protocol", Wikipedia, https://en.wikipedia.org/wiki/Simple_Service_Discovery_Protocol (accessed on Mar. 13, 2017), 3 pages.

Cheshire, et al., "Multicast DNS", Internet Engineering Task Force (IETF), Request for Comments: 6762, Category: Standards Track, ISSN: 2070-1721, Apple, Inc., https://tools.ietf.org/html/rfc6762 (accessed Mar. 13, 2017), Feb. 2013, 140 pages.

Cheshire, "Zero Configuration Networking (Zeroconf)", http://www.zeroconf.org/ (accessed Mar. 13, 2017), 4 pages.

Goland, et al., "Simple Service Discovery Protocol/1.0, Operating without an Arbiter, <draft-cai-ssdp-v1-03.txt>", Internet Engineering Task Force, Internet Draft, Microsoft Corporation, Shivaun Albright, Hewlett-Packard Company, https://tools.ietf.org/html/draft-cai-ssdp-v1-03, (accessed on Mar. 13, 2017), Oct. 28, 1999, 36 pages.

Zalewski, "p0f v3 (version 3.09b)", http://lcamtuf.coredump.cx/p0f3/ (accessed on Mar. 13, 2017), copyright 2012-2014, 4 pages.

\* cited by examiner

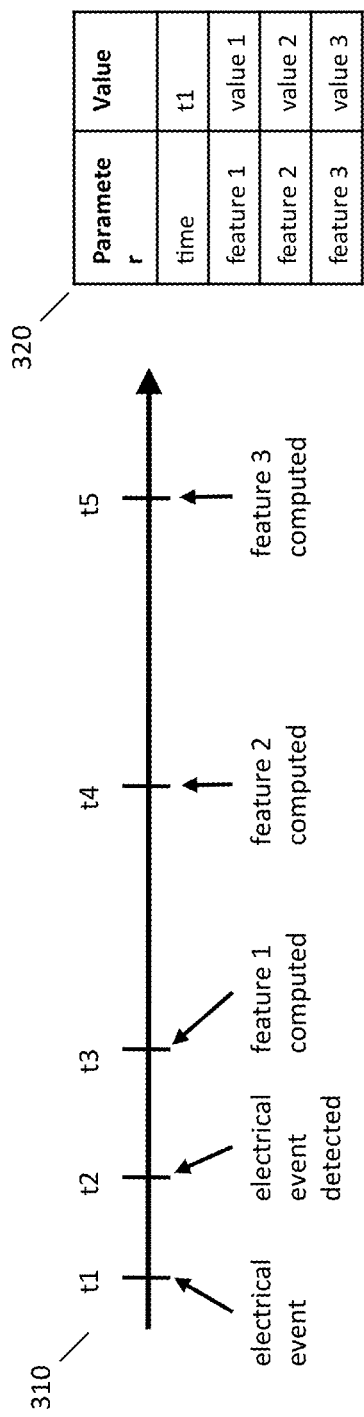
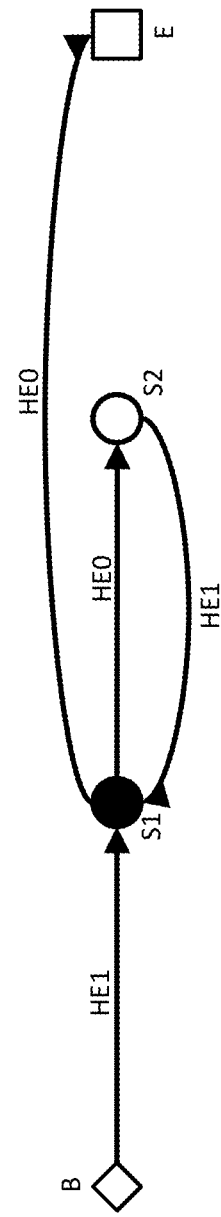
Fig. 3
Fig. 4

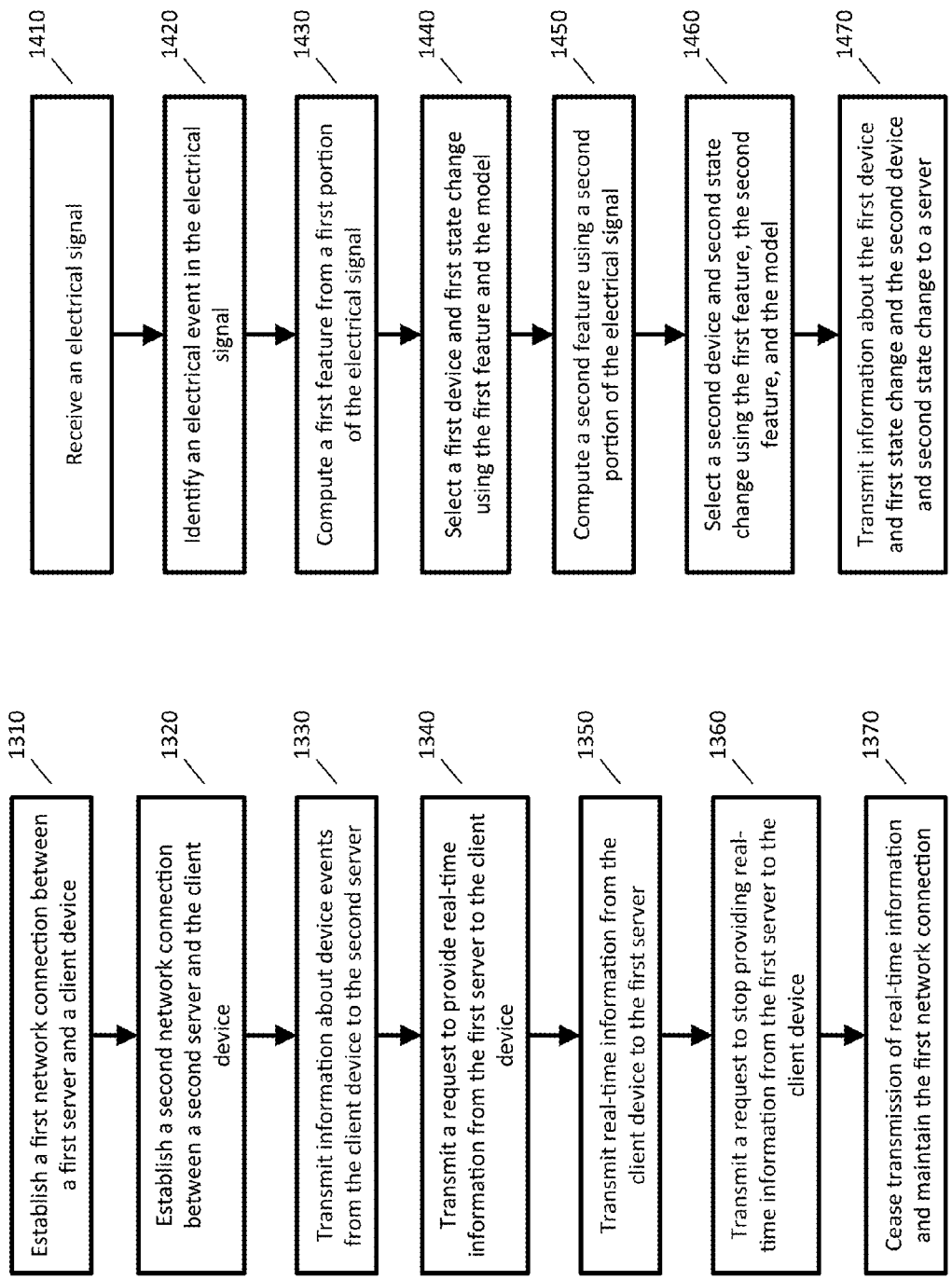

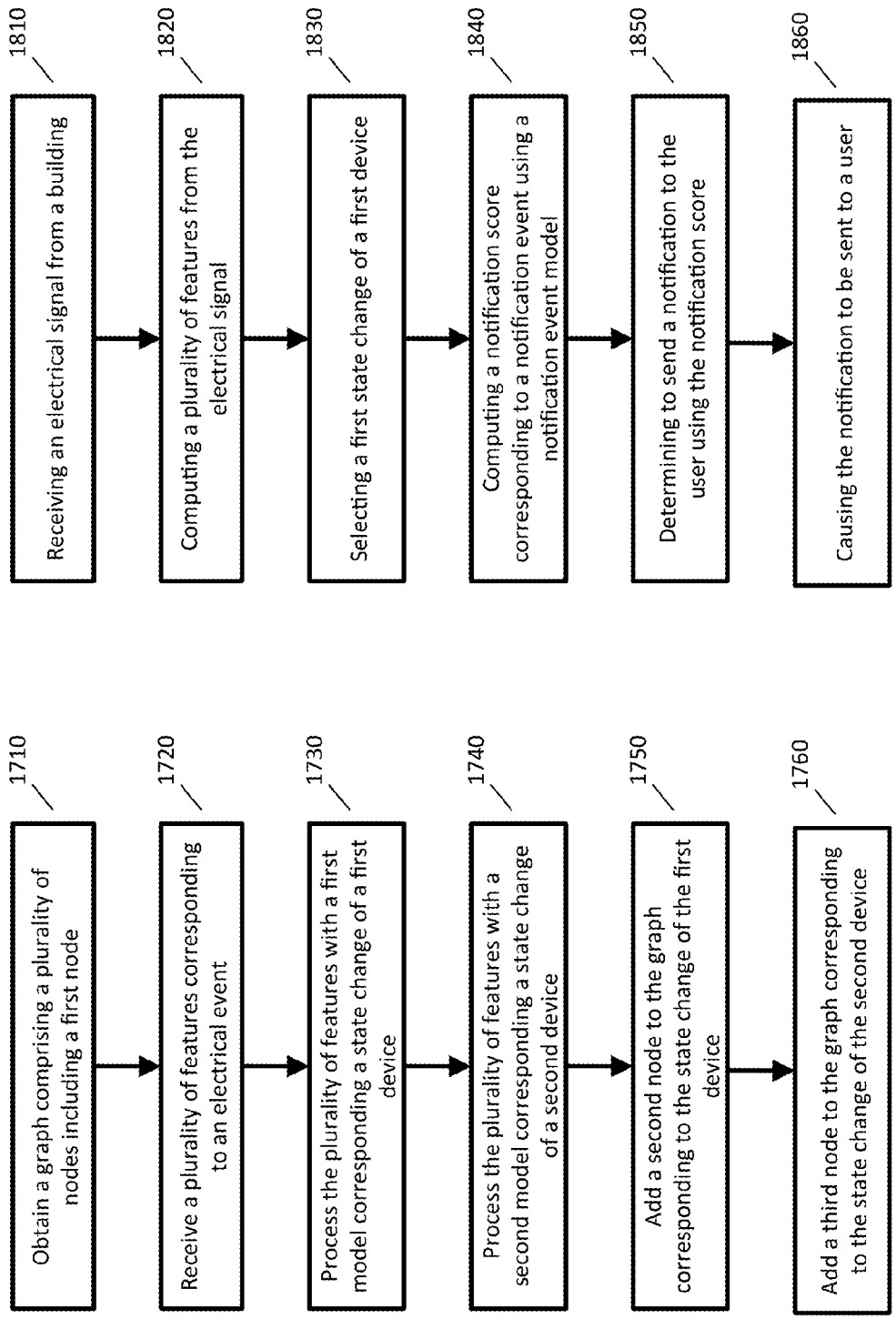

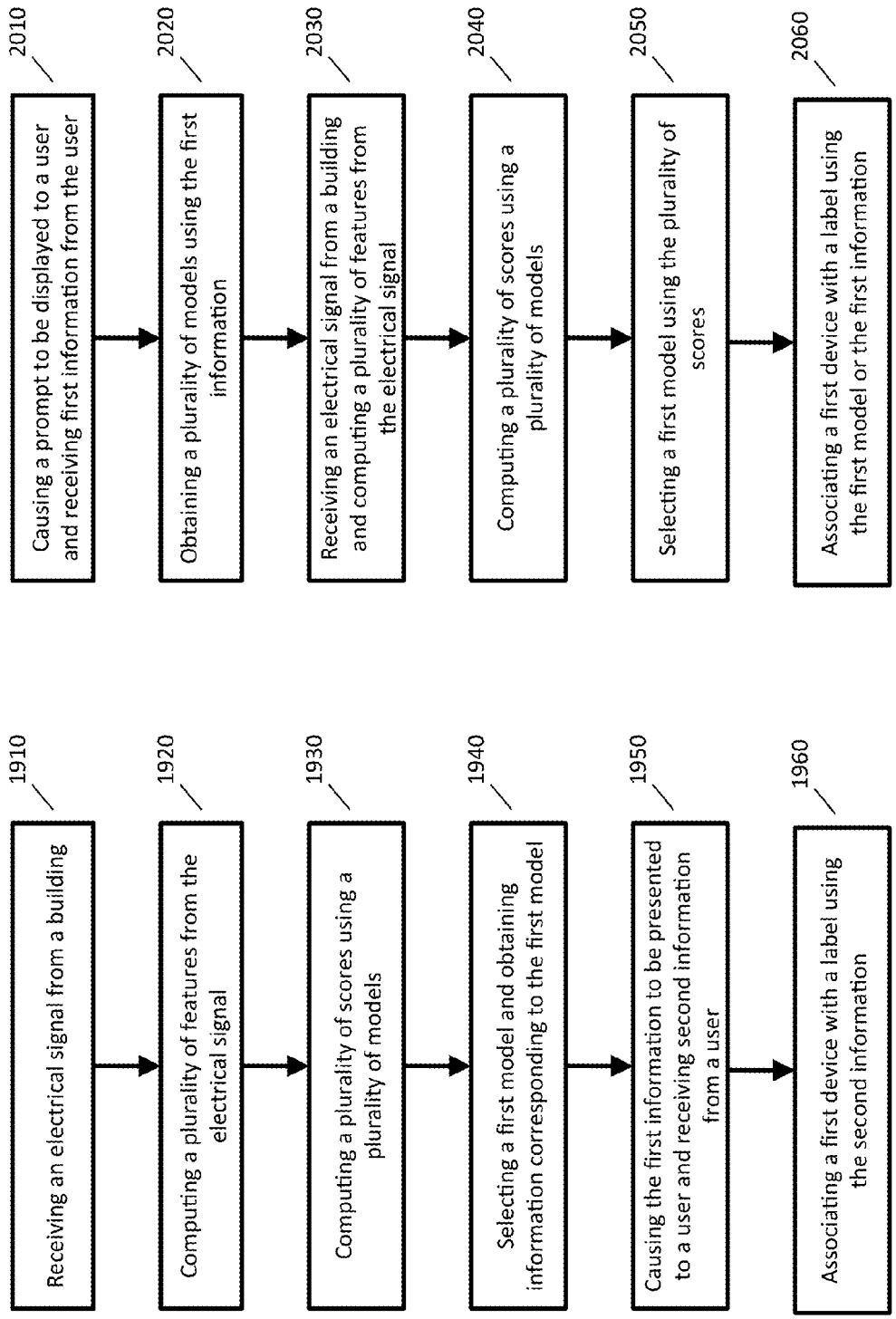

ASSISTED LABELING OF DEVICES WITH DISAGGREGATION

CROSS-REFERENCE TO RELATED APPLICATION

This application is a continuation of U.S. patent application Ser. No. 14/707,665 filed on May 8, 2015.

U.S. patent application Ser. No. 14/707,665 is a continuation-in-part of U.S. patent application Ser. No. 14/554,962, filed Nov. 26, 2014, now issued on Jun. 16, 2015, as U.S. Pat. No. 9,057,746.

The above applications are hereby incorporated by reference in their entirety.

BACKGROUND

Reducing electricity usage provides the benefits, among others, of saving money by lowering payments to electric companies and also protecting the environment by reducing the amount of resources needed to generate the electricity. Electricity users, such as consumers, businesses, and other entities, may thus desire to reduce their electrical usage to achieve these benefits. Users may be able to more effectively reduce their electricity usage if they have information about what devices (e.g., refrigerator, oven, dishwasher, furnace, and light bulbs) in their homes and buildings are using the most electricity and what actions are available to reduce electricity usage.

Electricity monitors for individual devices are available for measuring the electricity usage of a single device. For example, a device can be plugged into an electricity monitor, and the monitor can in turn be plugged into a wall outlet. These monitors can provide information about electricity usage for the one device they are attached to, but it may not be practical to monitor all or even many devices in a house or building with these monitors, because it would require a large number of devices that can be expensive and also require significant manual effort to install.

Instead of an electricity monitor for a single device, an electricity monitor can be installed at an electrical panel to obtain information about electricity used by many devices simultaneously. An electricity monitor on an electrical panel is more convenient because a single monitor can provide aggregate usage information about many devices. It is more difficult, however, to extract more specific information about usage of electricity by a single device, since the monitor typically measures one signal (or several signals for different zones of the house or building) that reflects the collective operation of many devices, which may overlap in complex ways. The process of obtaining information about the electricity usage of a single device from an electrical signal corresponding to usage by many devices may be referred to as disaggregation.

To provide the greatest benefits to end users, a need exists for more accurate disaggregation techniques, so that end users receive accurate information about the electrical usage of individual devices. A need also exists for faster disaggregation techniques, so that end users and others can receive information about electrical usage in real time.

BRIEF DESCRIPTION OF THE FIGURES

The invention and the following detailed description of certain embodiments thereof may be understood by reference to the following figures:

FIG. 3 illustrates a timeline of computing features for an electrical event and a data structure for storing the features.

FIG. 4 illustrates an example of a device model that may be used with a power monitor.

FIG. 13 is a flowchart showing an example implementation of a network architecture for providing real-time information about devices.

FIG. 14 is a flowchart showing an example implementation of determining information about device events.

FIG. 17 is a flowchart showing an example implementation of determining information about devices using a graph, such as a search graph.

FIG. 18 is a flowchart showing an example implementation of providing notifications corresponding to devices in a building.

FIG. 19 is a flowchart showing an example implementation of labeling devices using information provided by a user.

FIG. 20 is a flowchart showing an example implementation of labeling devices using information provided by a user.

DETAILED DESCRIPTION

Described herein are techniques for disaggregating electrical signals containing information about multiple devices to obtain information about electrical usage by individual devices, techniques for effectively presenting this information to end users, and techniques for allowing the end users to take actions, such as to conserve energy.

Figure 1:
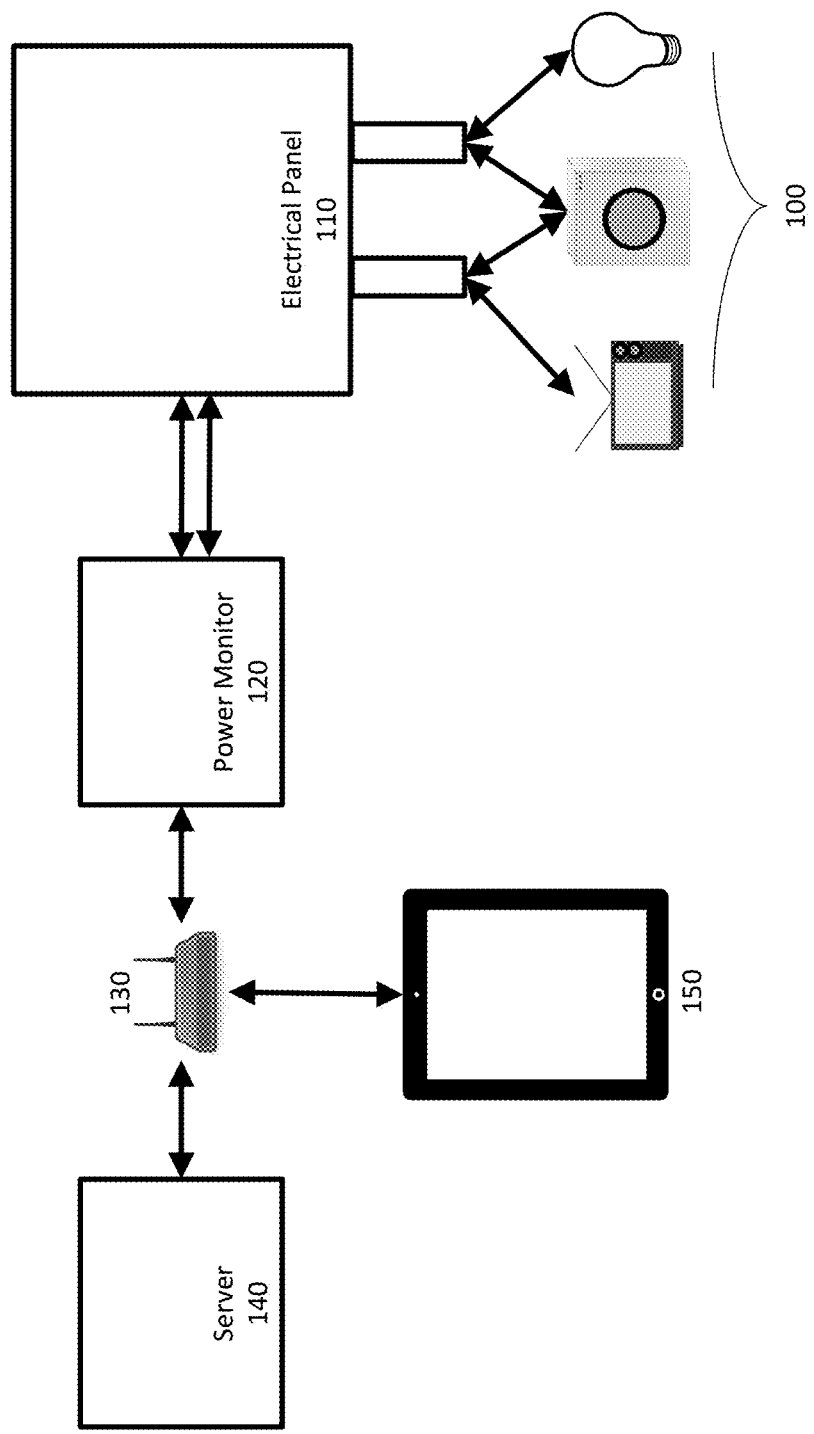
FIG. 1 illustrates one example of a system for performing disaggregation of electrical signals and providing information a user.

FIG. 1 illustrates one example of a system for performing disaggregation of electrical signals and providing information to a user relating to devices that are consuming the electrical signals. FIG. 1 and other figures will be described with reference to electricity usage in a home to simplify the explanation of the techniques described herein, but the techniques described herein are equally applicable to any environment where electricity is used, including but not limited to businesses and commercial buildings, government buildings, and other venues. References to homes throughout should be understood to encompass such other venues.

In FIG. 1, electrical panel 110 may be an electrical panel that is typical in many homes. Electrical panel 110 receives electricity from an electric utility and processes the electricity so that it may be used by devices in the home. Typically, the electricity is alternating current (AC). For example, electrical panel 110 may implement split-phase electric power, where a 240 volt AC electrical signal is converted with a split-phase transformer to a three-wire distribution with a single ground and two mains (or legs) that each provide 120 volts. Some devices in the house may use one of the two mains to obtain 120 volts; other devices in the house may use the other main to obtain 120 volts; and yet other devices may use both mains simultaneously to obtain 240 volts. Other voltage standards, such as for other countries or continents, are intended to be encompassed herein as would be understood by one of ordinary skill in the art.

Any type of electrical panel may be used, and the techniques described herein are not limited to a split phase electrical panel. For example, electrical panel 110 may be single phase, two phase, or three phase. The techniques are also not limited to the number of mains provided by electrical panel 110. In the discussion below, electrical panel 110 will be described as having two mains, but any number of mains may be used, including just a single main.

FIG. 1 shows devices 100 that are consuming electricity provided by electrical panel 110. For example, one device may be a television receiving electricity from a first main, another device may be a washing machine receiving electricity using two mains, and another device may be a light bulb receiving electricity from a second main.

FIG. 1 shows power monitor 120 that may perform disaggregation using information about one or more electrical signals provided by electrical panel 110. For example, power monitor 120 may determine voltage and/or current levels for electrical signals output by electrical panel 110 (e.g., one or more mains). The values may be determined using any available sensors, and the techniques are not limited to any particular sensors or any particular types of values that may be obtained from sensors.

In one example, power monitor 120 may sample the voltage signal of each main at a predetermined time interval or frequency, such as at 10 MHz, and the current signal for each main at another interval or frequency, such as 10 kHz. The voltage and current signals may be used directly or may be combined to determine other signals, such as power signals, and the constituent or combined signals, or other signals may have different sampling rates. Power monitor 120 may determine other values from the sampled signals, including but not limited to any of, or any combination of, real power, reactive power, power factor, power quality, apparent power, or phase between the voltage and current. Determined values may be root mean square (RMS) or peak.

Power monitor 120 processes electrical signals (such as voltage and current) to disaggregate them or to obtain information about individual devices in the home. For example, power monitor 120 may determine device events, such as that the television was turned on at 8:30 pm or that the compressor of the refrigerator started at 10:35 am and 11:01 am. Power monitor 120 may transmit information about device events to other computers, such as server computer 140 or user device 150. Power monitor 120 may also determine real-time information about power used by individual devices in the home and transmit this real-time information to other computers, such as server computer 140 or user device 150. For example, power monitor may determine on predetermined intervals, such as ten second intervals, three second intervals, one second intervals, or sub-second intervals, the power used by multiple devices in the home. As used herein, "real time" means that the information is transmitted to a user without significant delay. For example, when reporting to a user the wattage used by a light bulb, providing the information to the user within several seconds of measurement would be real time.

Power monitor 120 may be a device that is obtained separately from electrical panel 110 and installed by a user or electrician to connect to electrical panel 110. Power monitor 120 may be part of electrical panel 110 and installed by the manufacturer of electrical panel 110. Power monitor 120 may also be part of (e.g., integrated with or into) an electrical meter, such as one provided by the electric company, and sometimes referred to as a smart meter.

Power monitor 120 may transmit information to other computers using any known networking techniques. In FIG. 1 power monitor 120 is shown having a wireless connection to router 130, which in turn connects to server 140 and user device 150. Other networking techniques that may be used include, but are not limited to, wired connections, Wi-Fi, NFC, Bluetooth, and cellular connections. User device 150 need not be on the same local network and may instead receive information over a wide area network, such as a cellular network, or information served via a cloud-computing environment.

Server computer 140 may receive information about devices in the home from power monitor 120. For example, server computer 140 may receive information about device events or real-time power usage of devices in the home. Server computer 140 may store, further process, or facilitate presentation of the information to end users, including energy users, utility companies, third parties (e.g., parties tracking or regulating energy usage), and/or to the host of the methods and systems disclosed herein, such as for various analytic purposes.

User device 150 may be any device that provides information to a user including but not limited to phones, tablets, desktop computers, and wearable devices. User device 150 may present, for example, information about device events and real-time power usage to the user.

The arrangement and specific functions of the components of FIG. 1 provide just one example of how the techniques described herein may be implemented, but other configurations are possible. For example, power monitor 120 may perform all the operations of server 140, and power monitor 120 may directly provide information to user device 150. In another example, power monitor 120 may include some or all of the functionality of user device 150, and a user may interact directly with power monitor 120 to obtain information about device events and power consumption.

Power Monitor

Figure 2:
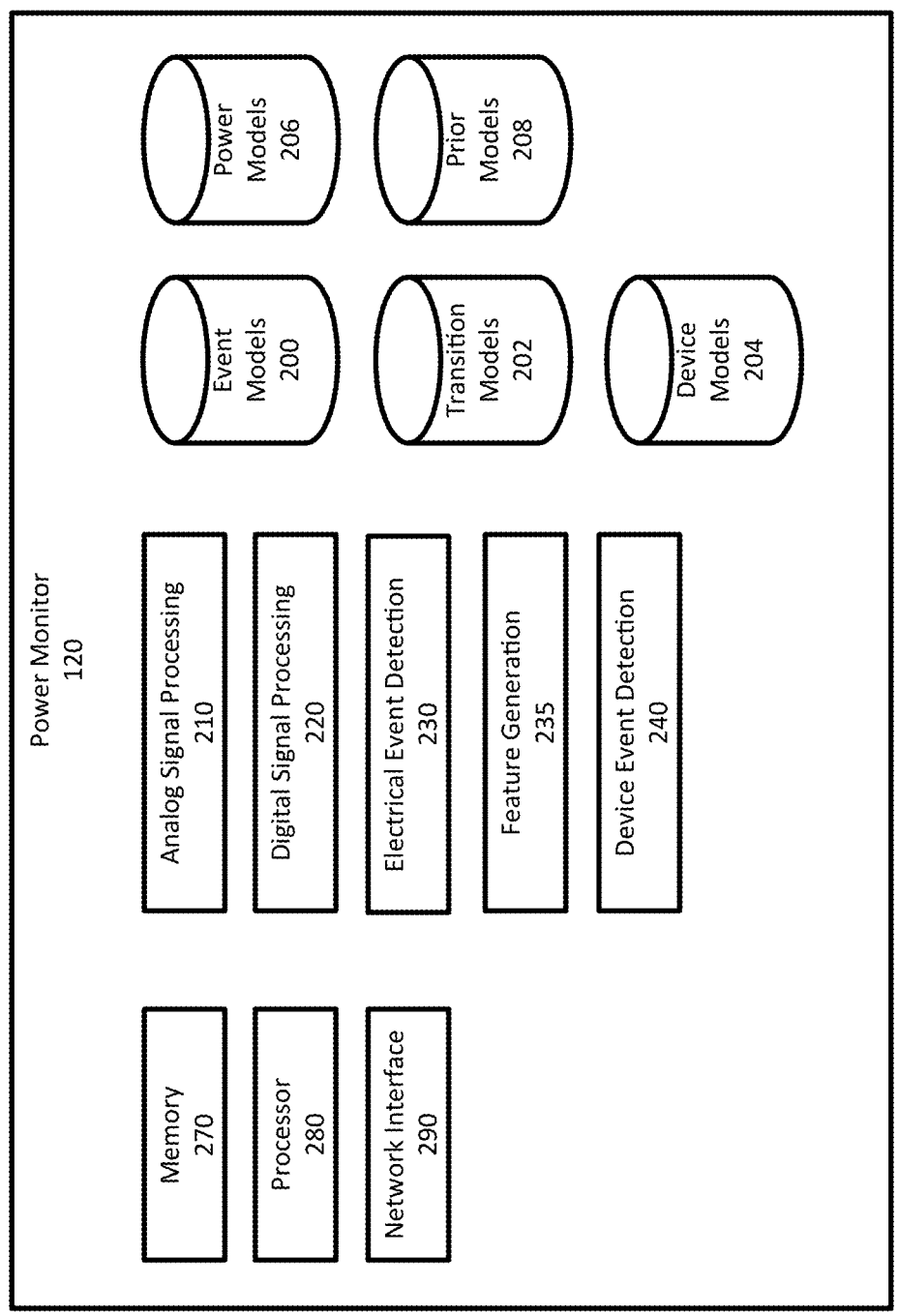
FIG. 2 illustrates components of one implementation of a power monitor.

FIG. 2 illustrates components of one implementation of power monitor 120. As noted above, power monitor 120 may be a separate device or be part of another device such as electric panel 110 or a power meter.

Power monitor 120 may include any components typical of a computing device, such one or more processors 280, volatile or nonvolatile memory 270, and one or more network interfaces 290. Power monitor may also include any known input and output components, such as displays, buttons, dials, switches, keyboards, and touch screens. Power monitor 120 may also include a variety of components or modules providing specific functionality, and these components or modules may be implemented in software, hardware, or a combination thereof. Below, several examples of components are described for one example implementation of power monitor 120, and other implementations may include additional components or exclude some of the components described below.

Power monitor 120 may include analog signal processing component 210. Analog signal processing component 210 may include sensors that obtain information about electrical signals in electrical panel 110, such as sensors for obtaining current and voltage. Analog signal processing component 120 may perform other operations as well, such as filtering to certain frequency bands or performing dynamic range compression, and may output one or more analog signals.

Power monitor 120 may include digital signal processing component 220. Digital signal processing component 220 may, for example, sample and quantize analog signals output by analog signal processing component 210. Digital signal processing component 220 may process multiple analog signals of different types and may process the different types of signals in different ways. For example, digital signal processing component 220 may receive two analog voltage signals and two analog current signals and apply different sampling rates and quantization schemes to the different signals. Digital signal processing component 220 may perform other operations as well, such as noise reduction or synchronization, and output one or more digital signals.

Electrical event detection component 230 may receive the one or more digital signals from digital signal processing component 220 and detect electrical events for further processing. Electrical events include any changes to electrical signals that may provide useful information about the operation of devices in the house or power usage of devices in the house. For example, an electrical event can correspond to manual operation of a device (such as a user turning on or off a device), automatic operation of a device (such as the dishwasher starting a pump as part of its operating cycle), a failure in the operation of a device (such as a failure of the dishwasher pump), a change in the mode of operation of a device (such as a vacuum cleaner switching from "rug" to "wood floor" mode), a change in operating level of a device (such as an oven increasing in cooking temperature), a change in the amount of electrical power used by a device (such as a change in electrical usage in response to a heating or cooling of a component), or other device-related electrical events.

Some electrical events may occur over a relatively short period time or be transient electrical events. For example, turning on a light bulb may significantly change the amount of power or current in an electrical signal in a short period of time. Other electrical events may occur over a longer period of time and correspond to more gradual changes in electrical signals. For example, the fan of an air conditioner may have a longer and more gradual ramp up of power or current.

Electrical event detection component 230 may be implemented using any classification techniques known to one of skill in the art. In some implementations, a classifier may by trained in a machine learning environment, such as by using data that is already labeled or classified by event type. In some implementations, electrical signals may be obtained from houses, and specific electrical events in the data may be labeled automatically, semi-automatically, or manually. Automated or semi-automatic labeling may be validated or adjusted by manual feedback. Manual labeling may be validated by automatic labeling or by a validation process involving other individuals. With this data, one or more classifiers may be trained to automatically recognize electrical events. The classifiers may include, but are not limited to, neural networks, self-organizing maps, support vector machines, decision trees, random forests, and Gaussian mixture models. The input to the classifiers may be the digital signals themselves or features computed from the digital signals. The classifiers may use electrical event models 200, which may be stored in power monitor 120.

In some implementations, electrical event detection component 230 may look for changes in the values of electrical signals. For example, a simple change of value of an electrical signal greater than a threshold (volt, amp, watt, etc.) may indicate an electrical event. Changes in values over time (including rates of change and time-derivatives thereof) are also potentially relevant indicators of electrical events. Some changes in electrical signals may typically occur quickly and others more gradually. Multiple time scales and multiple thresholds may be used to identify both transient events and longer term events. For example, a 5-watt change in less than one second may indicate a transient event, and a 20-watt change over more than a minute may indicate a longer-term event.

In some implementations, electrical event detection is performed once per cycle (e.g., at a frequency of 60 Hz on a typical line). For each cycle, a window before and after a given cycle may be used to identify electrical events. For example, a 20-cycle window may be used to detect transient events and a 600-cycle window may be used to detect longer-term events. A value may be computed for each of the before and after windows (e.g., power) and the change (the change may additive, multiplicative, or other measure of change) in value may be compared to a threshold. The thresholds may be different for shorter and longer windows, and the thresholds may be different for different electrical measurements (power, amps, volts, etc.). The thresholds may also adapt over time. For example, where the recent history of an electrical signal indicates a significant oscillation in the electrical signal, a threshold may be increased so that each individual oscillation of the electrical signal does not trigger a new electrical event. Thus, the methods and systems disclosed herein contemplate dynamically changing at least one of a detection window and a recognition threshold in an automated, electrical event detection and classification system, to improve recognition of a particular types of event.

For a transient electrical event, the electrical event may be detected by the electrical event detection component 220 shortly after the occurrence of the electrical event. For example, the electrical event may be output within 20 milliseconds of the occurrence of the electrical event. For transient events, the electrical event may be detected quickly, because the information used to identify the electrical event may depend on the electrical signal for a short duration window around the electrical event.

For a longer-term electrical event, the electrical event may be detected by the electrical event detection component 220 significantly after the occurrence of the electrical event. For example, the electrical event may be output several seconds after the occurrence of the electrical event. For longer-term electrical events, the information required to detect the electrical event may depend on the electrical signal for a longer duration window around the electrical event.

Each of the electrical events may be associated with a time or times. For example, for a transient electrical event, a time may correspond to the approximate time of the commencement of the electrical event, and for longer electrical events, the time may correspond to an approximate mid-point of the electrical event, or to starting and ending points of the electrical event. More generally, electrical events may also be associated with a start time, an end time, a duration, a time that the electrical event was recognized, and a main or mains that the electrical event was detected from. Electrical events may also be associated with an event type. For example, electrical events may identified specifically as corresponding to certain types of devices, such as a motor, a heating element, a power supply for a consumer electronic device, a battery charger, a lamp, or the like. Later processing may use the event type for more efficient and/or accurate processing.

Electrical event detection component 230 may output a stream of electrical events for each electrical signal that is processed. For example, if the digital signals include two voltage signals and two current signals, the output may be four separate streams of electrical events. Alternatively, the output could include a first stream of electrical events for the current and voltage signals corresponding to the first main and a second stream of electrical events for the current and voltage signals corresponding to the second main. Alternatively, all the electrical events could be included in a single stream.

Following the electrical event detection, feature generation component 235 may determine features corresponding to electrical events. The features may be useful in subsequent processing for determining information about devices from the electrical events. These features may include some of the features used to detect the electrical event itself and may also include other features that were not used to detect the electrical event but which may be useful for the subsequent processing. The techniques described herein in are not limited to any particular features, and any features known to one of skill in the art may be used. Each of the features may be computed for individual mains or a combination of mains. Some features may also be computed at different scales or window lengths. Some features may be computed using a "residual" signal that is computed by subtracting steady state signal characteristics that existed before or after the electrical event. Some features may relate to changes to longer duration spectral properties of an electrical signal. For example, a state of a device may cause energy to appear in a spectral band, and a feature may relate to the energy or a change in the energy in that spectral band.

In some implementations, each electrical event may include multiple features, e.g., approximately 500 features, including but not limited to features relating to comparing power levels (e.g., average, median, maximum, minimum, or logarithmic of the foregoing) in a time period before an event to a time period after the event; a shape of an onset (average power of onset, peak height of an onset, power change over an onset); a value (e.g., average, median, maximum, or minimum) over one or more time periods; change in real or imaginary components of a spectrum (including at multiple harmonics) over two different time periods; matching a sinusoid to a signal; a maximum slope of a signal; a phase shift of a signal; a variability of a signal between cycles over a time period; a slope, error, or offset of an exponential decay of a signal; slope or duration of a startup surge; value (e.g., average, median, maximum, or minimum, or logarithmic of the foregoing) of a startup surge over a time period; ratio of a peak height of startup surge to a minimum value after a startup surge; phase offset change at frequency values or bands over two time periods; harmonic values; total magnitude of harmonic values; harmonic values relative to total magnitude of harmonics; and onset time differences between mains. These features may be computed from any of the electrical signals described above, including but not limited to current, voltage, and power signals. Some or all of these features may also be computed on a residual signal after subtracting a baseline cycle. Some or all of these features may be computed for any number of mains.

Features may be transformed either individually or in combination before being processed by the classifier. As an example of an individual feature transformation, the logarithm of a wattage measurement might be used instead of or in addition to the wattage measurement itself. As an example of a combination transformation, the electrical signal could be decomposed into a set of Fourier coefficients or a wavelet decomposition. Furthermore, a subset of the features may be transformed using techniques such as linear and quadratic discriminants and principal components. Features may also be derived from the pattern of event timing (for example, the number of events occurring in the past 5 seconds or a particular sequence of events, such as a voltage spike followed by steady-state current draw) or by adding features associated with one event with another event occurring before or afterwards. Thus, in addition to the many individual features that can be calculated according to the above disclosure, various sequence patterns may be identified and used for or to assist in classification.

Different features for the same electrical event may be computed at different times. For example, some features may require a short window of the electrical signal around the electrical event and can be computed shortly after the electrical event is detected. Other features may require a longer window around the electrical event and thus feature generation component 235 may need to wait and receive additional portions of the electrical signal before generating other features.

For example, a first feature may require a 10 millisecond window of the electrical signal, a second feature may require a 0.5 second window of the electrical signal, and a third feature may require a 5 second window of the electrical signal. FIG. 3 illustrates an example timeline 310 for the occurrence of an electrical event, detection of the electrical event, and computation of features of the electrical event. FIG. 3 also illustrates an example data structure 320 of an electrical event. In FIG. 3, an electrical event is generated at time t1. As described above, the electrical event may be detected by electrical event detection component 230 at time t2. Electrical event detection component 230 may then create data structure 320 for the electrical event and add the time of the electrical event. Note that at this point in the process, features may not yet have been computed and the values of the features may not yet be present in data structure 320. At time t3, feature generation component 235 may have received enough of the electrical signal to compute feature 1 and then add value 1 to data structure 320. Similarly, at time t4, feature generation component 235 may generate feature 2 and add value 2 to data structure 320, and at time t5, generate feature 3 and add value 3 to data structure 320.

Downstream processing of the electrical event may decide to process the electrical event before all features have been computed. For example, if it is desired to determine an outcome quickly, the electrical event may be processed after feature 1 is computed, even though not all possible information is available. If it is desired to have the most accurate outcome, downstream processing may not occur until all features of the electrical event have been computed. In other implementations, the electrical event may be processed and classification updated each time a new feature is computed.

Device event detection component 240 may receive the one or more electrical event streams from electrical event detection component 230 with features computed by feature generation component 235. Device event detection component 240 may also receive features that are not associated with electrical events. In some implementations, features, such as those described above, may be computed on a periodic basis (such as every 10 milliseconds or every time a new digital sample of the electrical signal is received) regardless of whether an electrical event has been detected. Some features may be computed only in response to receiving electrical events, some features may be computed only periodically, and some features may be computing periodically and also in response to electrical events. Device event detection component 240 may use the features to determine information about devices in the home, such as a light turning on or the amount of power used by a light that is on. The techniques described herein are not limited to any particular implementation of device event detection component 240, and one example implementation is described below.

Figure 5:
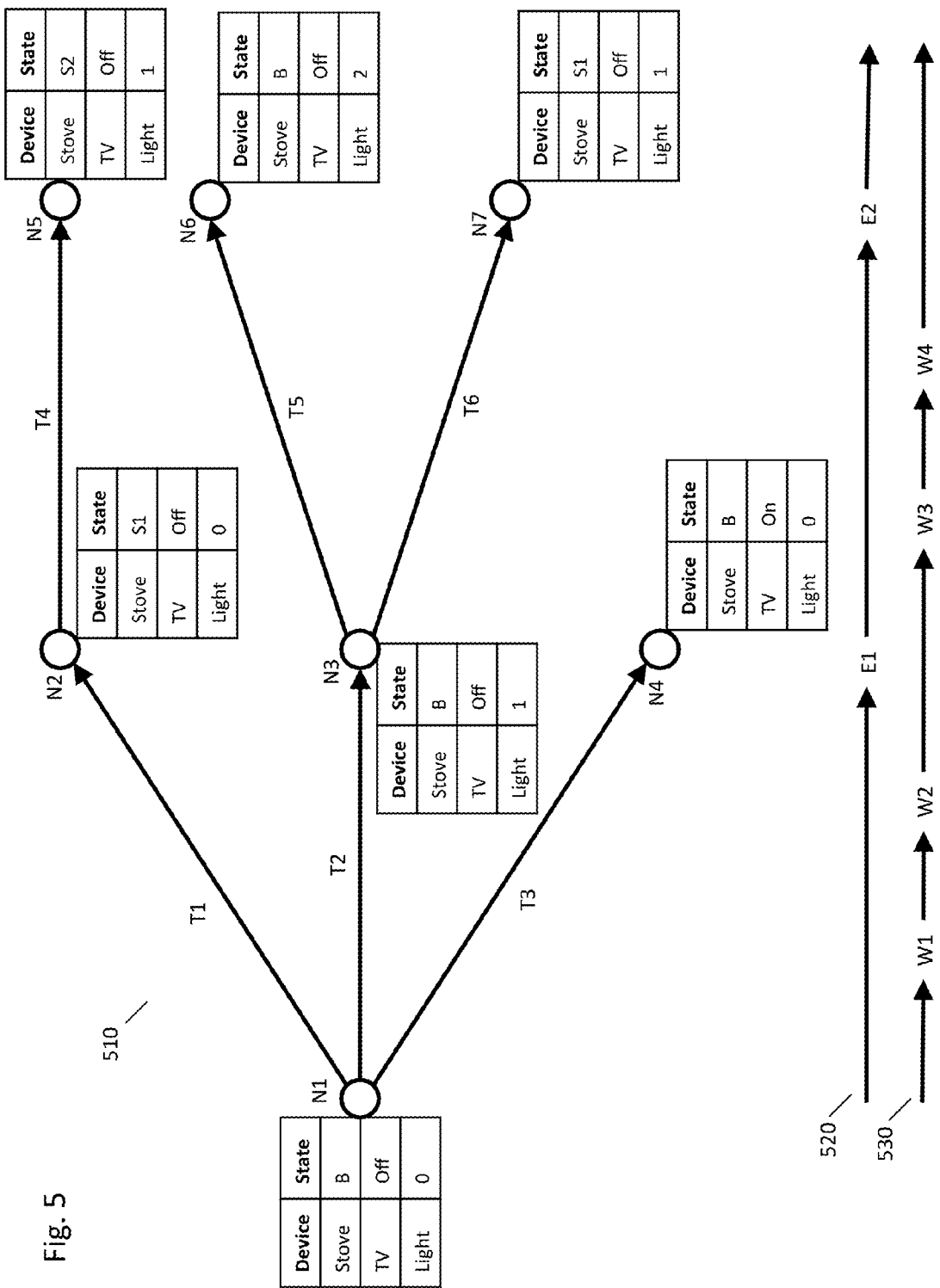
FIG. 5 illustrates an example of a search graph that may be used for determining information about devices.

In some implementations, device event detection component 240 may use a search process to determine device state changes using the electrical event stream and one or more models. One implementation of a search process is shown in FIG. 5, which includes search graph 510, electrical event stream 520, and wattage stream 530.

One example of a model that may be used is a transition model that describes changes in state of a device or an element of a device. In addition to a device changing state (a light turning on or off), an element of a device (a pump in a dishwasher turning on during the washing cycle, a light inside a refrigerator, a heating element or fan in an oven, and the like) can change state. To capture changes to elements of a device, a transition model may be created for elements of devices that can change state. Transition models may be created in a hierarchical fashion. At the highest level, transition models may be created for classes of devices or classes of elements, such as an incandescent lighting element, a fluorescent lighting element, an LED lighting element, a heating element, a motor element, a dishwasher, a dishwasher with one pump, or a dishwasher with two pumps. Transition models may further be created for classes of devices or elements by a particular manufacturer (e.g., all dishwashers by a particular manufacturer may have common features). Transition models may further be created for a specific version of a device by a specific manufacturer (e.g., Kenmore 1000 dishwasher). Transition models may even further be created for a specific device (e.g., the Kenmore 1000 dishwasher at 100 Main Street). In common usage, the "1000" in a Kenmore 1000 dishwasher may be referred to as a "model" of the dishwasher, but to avoid confusion with mathematical models, the "model" of a dishwasher will instead be referred to as a "version."

Some elements may have two states, such as an off state and an on state. For these elements, a transition model may be created for transitioning from the off state to the on state and vice versa. For an element with more than two states (e.g., "off, "low speed," and "high speed"), a transition model may be created for each allowed state change.

Transition models may be created using any appropriate techniques. In some implementations, transition models may be created with labeled training data (which may be labeled automatically, semi-automatically, or manually, with validation and feedback among combinations of these). The training data may comprise electrical events extracted from electrical signals (or optionally the signals themselves) taken from houses, which are then labeled as corresponding to an element and according the begin state and the end state of the transition. Features may be generated corresponding to the electrical events, and any classifier known to one of skill in the art may be used to create the transition model, including but not limited to neural networks, self-organizing maps, support vector machines, decision trees, logistic regression, Bayesian models (including naïve Bayes models), random forests, and Gaussian mixture models. A classifier may be trained in this manner for every state change of every element. The classifier may receive the features as input and provide as an output an indication of whether the electrical event corresponds to the state change of the element. Power monitor 120 may store the transition models 202 for each of the elements and state changes.

In addition to transition models 202, other, non-transition models (not shown in FIG. 2) may be used to identify useful electrical events that do not necessarily specifically correspond to a change in state of a device or element of a device. One type of other model may be a "noise" model. A noise model may recognize portions of electrical signals that correspond to patterns that are present but not useful for understanding the operation of devices. Once these patterns are detected, they may be removed from the electrical signal (for example, using subtraction), and removing these not useful portions of the signal may make it easier for the transition models to detect device state changes. Another type of other model may be an "operative" model. An operative model may relate to properties of devices or elements that are not necessarily changing state but which exhibit varying electrical characteristics while within a state. For example, a motor on a washing machine may cause a variety of electrical events without changing state. These recognized operational characteristics may be used to detect devices as further described below, even absent clear identification of a change in state.

Another example of a model is a device model that describes sequential changes to the operation of a device. Any appropriate model may be used for a device model. In some implementations, a directed graph (weighted or unweighted) may be used. In some implementations, a directed graph may allow loops that return to nodes representing particular states. In other implementations, the directed graph may be acyclical, without loops that return to particular nodes. FIG. 4 shows an example directed graph with a beginning state denoted "B," an end state denoted "E," and two intermediate states denoted "S1" and "S2." The directed graph of FIG. 4 could correspond to, for example, a burner of an electric stove. When a person turns on the burner of an electric stove, the heating element may not consume power continuously, and may instead consume power in cycles to maintain a desired temperature. In FIG. 4, the transition from state B to state S1 may correspond to the initial activation of the burner. The stove may automatically turn the heating element off to transition from state S1 to state S, and then back on to transition from state S2 back to state S1. When the person turns off the burner, the graph transitions from state S1 to state E. In some implementations, the directed graph may also indicate allowable transitions for proceeding from one state to another. For example, in FIG. 4, the transition HE1 (indicating that a heating element is turning on) is an allowable transition from state B to state S1, and the transition HE0 (indicating that a heating element is turning off) is an allowable transition from state S1 to state S2.

Similarly, other directed graphs may be constructed for other home devices. For example, a directed graph may be constructed for the heating elements and pumps of a dishwasher. Further, a dishwasher may have a different directed graph for each operating mode ("light wash," "pot scrubbing," etc.). Simpler devices, such as an incandescent light bulb, may have a very simple device model or may not have a device model at all. Device models may also be hierarchical, and device models may be created for classes of devices, classes of devices by a particular manufacturer, specific versions of devices by a particular manufacturer, or specific devices in a home. Power monitor 120 may store device models 204 or may access device models 204 that are stored externally to power monitor 120, such as in a cloud storage environment. In some implementations, device models may also include states corresponding to operative characteristics that do not necessarily involve transitions.

Another example of a model is a wattage model that indicates the expected power usage of a device or element over time. For example, when turning on a 60-watt incandescent light, it may initially consume 70 watts and transition to 60 watts over time according to an exponential decay at a particular rate. Any appropriate modeling technique may be used to create a wattage model for elements and devices. For example, techniques such as templates, state machines, time-series analysis techniques, Kalman filtering, regression techniques (including autoregressive modeling), and curve fitting techniques may be used.

In some implementations, a template may be used for a wattage model. A template may characterize the expected power use of a device over time. For example, a template may characterize power usage for each cycle after a device is turned on. In some implementations, a wattage model for a device may be modeled by a Gaussian (or Gaussian mixture model) with a mean and variance that is determined for each cycle since the device was turned on. In some implementations, the wattage model may also be configured so that the modeling of power usage at one cycle may depend on the actual or estimated power usage from a previous cycle. For example, the wattage model may model the difference between power usage at the current cycle and the previous cycle as another Gaussian distribution with another mean and variance. Power monitor 120 may store wattage models 206 or access externally stored wattage models 206, such as from a cloud storage environment.

Another example of a model is a prior model that indicates a likelihood that a device or element will be in a particular state given known information. The known information can include any relevant factors, such as time, weather, location, the state of other devices, and usage history. A prior model may also model expected durations of states of devices and repetitiveness of states of devices, and this information may be determined from an individual user's usage history or collectively from many users' usage history (or a combination thereof). Examples of information used to populate a prior model may include the following: a stove is most likely used during meal times, many devices are likely to be off in the middle of the night, the furnace is more likely to be on when it is cold, lights are more likely to be on after sunset which depends on location, a kitchen light is likely to be on if it is dark outside and the oven is on, and a person may turn on the bedroom light at 5 am every morning after the alarm goes off. A prior model may be created for each possible transition of each device or device element in the house. Prior models may be trained using labeled data and may use any appropriate classifiers, such as neural networks, self-organizing maps, support vector machines, decision trees, Bayesian models (including naïve Bayes models), linear and nonlinear regression, random forests, and Gaussian mixture models. Power monitor 120 may store prior models 208 for each of the devices and elements in the house and may access externally stored prior models 208. Prior models 208 may optionally be populated in part by other data sources, apart from data from an electrical signal, such as weather information, information about sunrise and sunset times, information about the operating state of devices acquired from other sources (e.g., by Wi-Fi or through the cloud), and information from other models, such as weather models.

The above models may be used in creating search graph 510, which indicates possible states of devices in the house over time as electrical events are processed. Initially, the graph may contain no nodes or just an initial node, such as N1, corresponding to a first time. Later, nodes N2-N4 may be added to the graph and indicate the state of devices in the house at a second time later than the first time. There may be some uncertainty as to which of nodes N2-N4 correspond to the actual state of the house and each of the nodes may be associated with a score (such as a likelihood or a probability). Even later, nodes N5-N7 may be added to the graph and indicate the state of devices in the house at a third time later than the second time. The graph may continue beyond nodes N5-N7 with additional edges and nodes. In some implementations, nodes may be added to search graph 510 corresponding to operative non-transitions, and a transition to an operative non-transition node may not change the state of any devices between that node and a previous node.

Node N1 shows an initial or current state of a house as shown by the table connected to node N1, where the table indicates the state of each device in the house. In this example, the house has a stove, a television, and multiple light bulbs. At node N1, the stove is at state B from FIG. 4, the television is in an off state, and there are 0 light bulbs on. In this example, the light bulbs in the house are not distinguished from one another, and only the number of light bulbs that are on is recorded. An implementation could choose to only record the number of light bulbs that are on (instead of identifying particular light bulbs that are on) because the state of specific light bulbs is not important to a user.

In FIG. 5, an electrical event stream 520 is shown beneath the search graph 510, with electrical events E1 and E2. Each of the electrical events E1 and E2 may include features from one electrical signal or from multiple electrical signals. For example, where the device that caused the electrical event depends on a single main, the electrical event may include feature determined from that main. Where the device that caused the electrical event depends on two mains, the electrical event may include featured determined from both mains.

When the device event detection component 240 receives electrical event E1, it processes the electrical event to determine possible state changes to the devices in the house. Nodes N2-N4 in FIG. 5 show possible state changes in response to E1. At node N2, the stove has moved from state B to state S1, at node N3, the number of lights on has increased from 0 to 1, and at node N4, the TV has transitioned from an off state to an on state.

When the device event detection component 240 receives electrical event E2, it processes the electrical event to determine further possible state changes to the devices in the house. In the example, of FIG. 5: node N2 is followed by node N5 where the stove transitions from state S1 to state S2; node N3 is followed by nodes N6 and N7, where N6 corresponds to a second light being turned on and N7 corresponds to the stove transitioning from state B to state S1; and no nodes follow node N4. No nodes may be added following node N4 because a score for N4 (discussed in greater detail below) may be low and it is desired to prune this portion of the search graph to save computations. Alternatively, no nodes may be added following node N4, because all of the possible transitions following node N4 have a low score. More generally, any pruning techniques may be used to remove nodes from search graph 510 to reduce computational complexity. For example, pruning techniques used for pruning speech recognition graphs may also be applied to search graph 510.

The transitions or nodes of search graph 510 may each be associated with a search score. The techniques described herein are not limited to use of any particular search score, and any appropriate search score may be used. In some implementations, each node may have a search score, and the search score may indicate a combination of all scores along a path from the beginning (e.g., node N1) to the current node. In some implementations, the search score may be computed using the transition models. For example, between N1 and N2, the stove has changed from state B to state S1. Using the transition model for this state change and electrical event E1, a transition score can be computed indicating whether E1 corresponds to this transition. In some implementations, the search score may be determined from a combination of all transition scores along a path to the current node.

In some implementations, the search score may be computed using other scores as well, such as a wattage score computed using the wattage model and a prior score computed using the prior model. For example, for each node that is added to search graph 510, the search score for that node may be determined by combining a search score for the previous node, a transition score for the current node, a wattage score for the current node, and a prior score for the current node. The search score may be determined from the other scores using any appropriate method. For example, the search score could be the sum, weighted sum, or product of the other scores.

Wattage stream 530 may include wattage values for the power used by all devices in the house at particular times, such as wattage values W1-W4 indicated in wattage stream 530 (wattage values W1-W4 could also be broken up into wattage values corresponding to individual mains and wattage values corresponding to simultaneous use of both mains). Wattage stream 530 may include wattage values at regular intervals, such as once per cycle or once per second. The wattage values may be apportioned among the devices consuming power at that time using the wattage model for each device that is consuming power (the apportionment of wattage values may also be used to provide a user with information about power usage of specific devices as explained in further detail below). For example, if the total wattage is 65 watts, and a node indicates a 40 watt incandescent light and a 25 watt incandescent light are on, then the 40 watt light would likely be apportioned 40 watts and the 25 watt light would likely be apportioned 25 watts.

A wattage score for a node may indicate a likelihood that the observed wattage value could be generated by the state of devices hypothesized by that node, and the wattage score may be determined using wattage stream 530 and wattage models. For example, if templates are used for wattage models as described above, the wattage values may be apportioned to devices that are consuming power by maximizing the joint probability of the Gaussian models for the appropriate cycle of the template. If the wattage values for each device are proportionate to the wattage model for that device, the wattage score will be higher, and if they are not proportionate, the score will be lower. In some implementations, the wattage score may be the joint probability (e.g., according to the Gaussian models from templates) that the devices consumed the apportioned wattage.

For example, consider W1 and W2 in FIG. 5. Before electrical event E1, all the devices are off so W1 and W2 should be approximately 0 (subject to residual power use not attributable to specific devices). After electrical event E1, a single device is now consuming power, and W3 should match, or nearly match, the expected wattage of the device that is consuming power. If W3 is 300 watts, then it may be more likely that the stove turned on, as opposed to concluding that a 60-watt light bulb turning on. After event E2, there may be two devices consuming power, and a pair of devices whose expected sum of wattages is close to the total will achieve a higher score than a pair of devices whose sum is not close.

In some implementations, the wattage scores may be stored with the preceding node of search graph 510. For example, for node N2, the wattage scores for W3 and W4 for the stove being in state S1, the TV being off, and no lights being on may be stored in association with node N2. If these wattage scores are low, then it may be less likely the N2 is the correct path, and node N2 may be pruned from the graph. Conversely, if the wattage scores are high, then it may be more likely that N2 corresponds to the correct path. Similarly, for node N3, the wattage scores for W3 and W4 may be stored in association with node N3. Since there are no paths following N4, there may not be any wattage scores stored in association with node N4.

The search score may also be computed using a prior score. As noted above, a prior model may be created for each transition of each device, and the prior score may be computed by inputting known information (time, location, etc.) into the prior model and obtaining the corresponding prior score.

Different techniques are available for selecting the nodes to follow an existing node in the search graph. In some implementations, all possible transitions are always added to the search graph. While this increases the computational complexity, it may also increase the accuracy of the search. In other implementations, only a subset of possible transitions will be added to the search graph. For example, the transitions corresponding to the three highest search scores may be added, or all transitions with search scores higher than a threshold may be added. In some implementations, only valid transitions may be added to the search graph (e.g., you cannot turn on a television that is already on).

The search implemented by device event detection component 240 may operate in different modes for achieving different objectives. For example, one mode may be a real-time mode where the search is implemented to determine as quickly as possible a transition corresponding to an electrical event. Another mode may be a historical mode where the search is implemented to have higher accuracy and it is acceptable to have higher latency. Device event detection component 240 may implement multiple modes simultaneously or start and stop individual modes upon request.

In real-time mode, the search may be modified to reduce the amount of time between receiving an electrical event and determining which node or nodes to add to search graph 510. One modification to the search relates to deciding when to process an electrical event. As described above, feature generation component 235 may output features of an electrical event at different times. For a real-time search, device event detection component 240 may add additional nodes to search graph 410 based on a subset of features that are available sooner and ignore other features that are not available until later. Alternatively, device event detection component 240 may add additional nodes to search graph 510 based on an earliest subset of features that provides a sufficient confidence level. For example, a first feature (or first set of features) for electrical event E1 may indicate that it is most likely that the stove transitioned from state B to state S1, but the confidence level may be low (such as below a threshold). Device event detection component 240 may choose to delay processing the electrical event until receiving a second feature (or second set of features) for electrical event E1. Processing the electrical event with both the first and second features may indicate that the stove transitioned from state B to state S1 with a higher confidence level (above a threshold), and nodes may be added to the search graph in response to processing the second feature for the electrical event.

Additionally, in real-time mode, the search may be modified to only add a single node in response to an electrical event. When adding a node in response to the electrical event, only the highest scoring node may be added. Adding only a single node for each electrical event may decrease required computations and increase speed.

In historical mode, the search may be modified to increase the accuracy of determining device events. One modification to the search may be to always wait for all features of an electrical event before processing the electrical event to add nodes to the search graph. By waiting for all features an electrical event, device event detection component 240 may have the greatest amount information available before deciding which nodes to add to search graph 410. Alternatively, the search may be modified to add additional nodes to the graph based on a subset of features of an electrical event that provide a sufficient confidence level where the confidence level is higher than the confidence level used for the real-time search.

Additionally, in historical mode, the number of nodes added to the graph may be increased or a pruning threshold may be reduced. By adding more nodes to graph and performing less pruning, it is more likely that device event detection component 240 will correctly determine the correct transition for an electrical event.

For both the real-time mode and the historical mode, the electrical events may be processed out of order with respect to the time at which the electrical events occurred. For example, electrical event E1 may occur at time 1, and features may be generated at time 5, 10, and 15. Electrical event E2 may occur at time 2, and feature may be generated at time 3, 4, and 5. In real-time mode, electrical event E2 may be processed at time 3 and electrical event E1 may be processed at time 5 even though electrical event E1 occurred first. Similarly, in historical mode, electrical event E2 may be processed at time 5 and electrical event E1 may be processed at time 15 even though electrical event E1 occurred first. Additionally, in some implementations, nodes for an electrical event may be added to search graph 510 at different times. For example, in response to electrical event E1, N2 may added at a first time based on a first set of features for E1, and N3 may be added at a second time based on a second set of features for E1.

In addition to determining state transitions of devices, device event detection component 240 can also determine the power used by each of the devices at regular (or irregular) time intervals. For example, device event detection component 240 may compute the power used by each device for each wattage value in wattage stream 530. As described above, device event detection component 240 can apportion a wattage value, such as W3, among the devices that are active at that time. Since different nodes of the graph correspond to a different set of active devices, the apportionment of power among active devices may be stored at a corresponding node as described above.

Device event detection component 240 may thus produce an estimate of power used by individual devices in addition to device events. Power monitor 120 may transmit this information to server 140 or user device 150.

Real-Time Architecture

Figure 6:
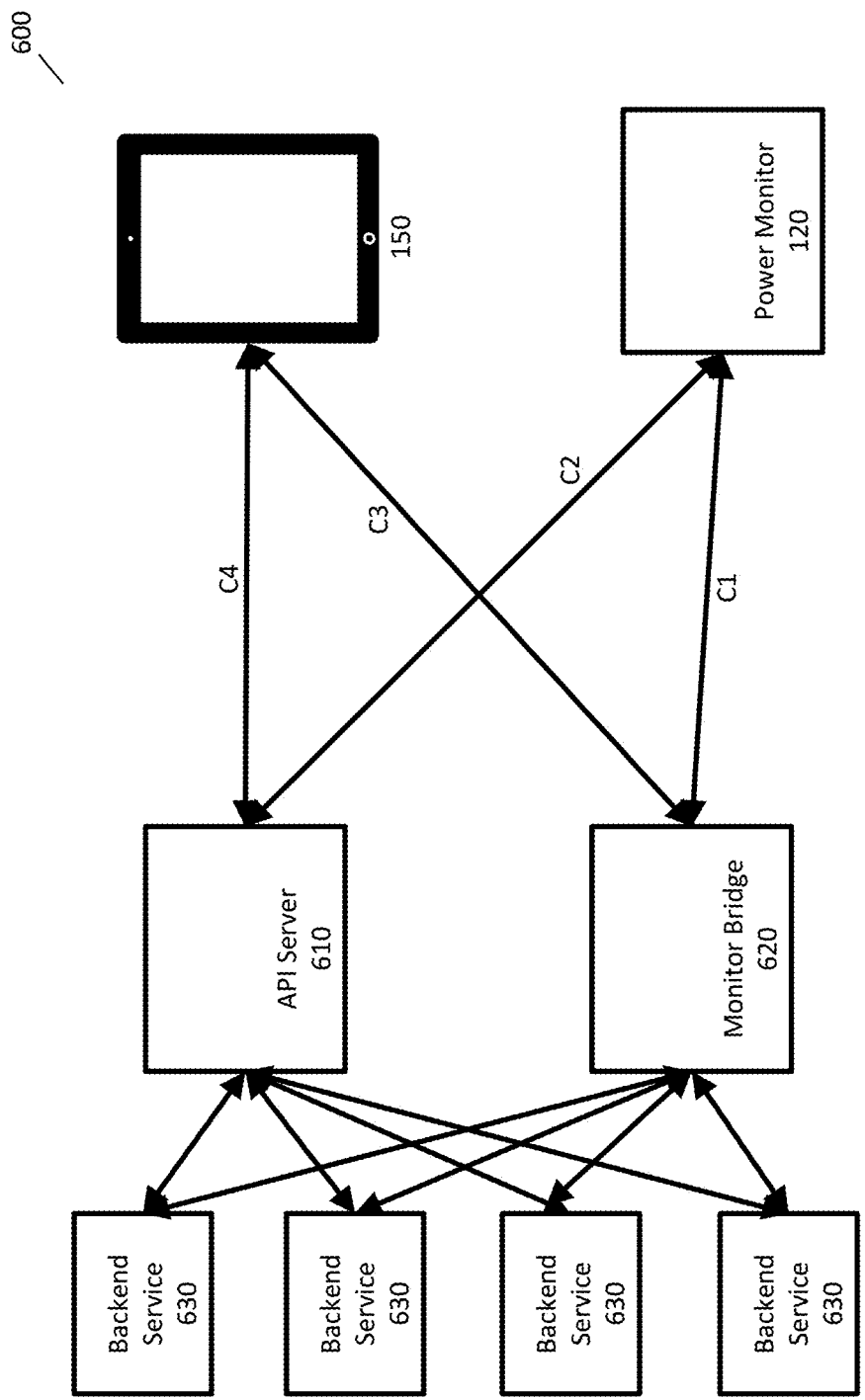
FIG. 6 illustrates an example of an architecture for providing information about devices from a power monitor to a user.

When power monitor 120 transmits device information to server 140, the architecture of the network connections between power monitor 120 and server 140 may be configured to enhance real-time transmission of information. FIG. 6 shows one implementation of a system 600 with network connections between power monitor 120 and two server computers, denoted API server 610 and monitor bridge 620. In addition, user device 150 may also have network connections between API server 610 and monitor bridge 620. API server 610 and monitor bridge 620 may include any of the components described below for server 140.

In some implementations, the information transmitted over the network connections may depend on whether a user is currently viewing information about devices, such as via an app on user device 150 or by viewing a web page with user device 150. When the user is not viewing device information, system 600 may operate in a historical mode and power monitor 120 may not need to provide real-time information. When a user is viewing device information, system 600 may operate in a real-time mode and power monitor 120 can provide real-time information so that the user is always viewing up to date information.

In some implementations, monitor bridge 620 facilitates the transmission of real-time information from power monitor 120 to user device 150. To allow faster switching between historical mode and real-time mode, network connection C1 may be a continuous network connection. For example, power monitor 120 can be configured so that the connection is maintained even when not in use. For example, it may automatically connect to monitor bridge after being powered on, and configured so that it if ever loses the connection to monitor bridge 620, it will immediately attempt to reestablish the connection. Other connections, such as connections C2-C4 may not be continuous connections, and these connections may be opened when a device needs to transmit information and closed upon the completion of the transmission (or shortly afterwards, upon expiration of a time out, or some other criterion).

In some implementations, when system 600 is in historical mode, connection C1 will not be used to transmit information even though connection C1 is maintained between power monitor 120 and monitor bridge 620. In the historical mode, power monitor 120 may periodically (e.g., every 15 minutes) open connection C2 to API server 610 and provide updated information since the last transmission via connection C2. After transmitting the information, power monitor 120 may close connection C2. API server 610 may store the information so that it may later be accessed by the user, such as by using user device 150.

When system 600 is in historical mode, the search by device event detection component 240 in power monitor 120 may also operate in historical mode and provide more accurate information about devices in the home. Although the historical mode search by power monitor 120 may increase a delay between the occurrence of electrical events and the determination of information about the electrical events, because power 120 is only providing information to API server 610 on a periodic basis, the delay caused by the historical mode search may be acceptable.

When a user accesses device information, such as by opening an app or viewing a web page with device 150 (or some other device), system 600 may switch to real-time mode. In some implementations, monitor bridge 620 sends an instruction to power monitor 120 to start sending device information in real time, and user device 150 is sent an instruction to connect to monitor bridge 620. Upon power monitor 120 receiving the instruction, the search by device event detection component 240 may begin to operate in real-time mode, and power monitor 120 may transmit real-time device information to monitor bridge 620. Monitor bridge 620 receives the information and may immediately send it to user device 150 so the real-time information may be presented to the user. Monitor bridge 620 may optionally modify or add to the real-time information that is sent to user device 150. For example, the real-time information received from power monitor 150 may include device identifiers for devices in the home but may not include device names. Monitor bridge 620 may add device names to the real-time information so that the information is more readily understood by the user.

When a user stops viewing device information, for example by closing an app or navigating to a different web page, system 600 may switch back to historical mode. In some implementations, monitor bridge 620 may instruct power monitor to stop transmitting real-time information, and the search by device event detection component 240 in power monitor 120 may also switch back to historical mode. Although continuous connection C1 may not be used in historical mode, the connection may remain open to facilitate a switch back to real-time mode in the future.

In some implementations, more than one monitor bridge 620 may be available, and power monitor 120 and user device 150 may need to identify a particular monitor bridge to connect to. In some implementations, power monitor 120 and user device 150 may query API server 610 to obtain an address of a monitor bridge to connect to, and power monitor 120 and user device 150 may then connect to monitor bridge 620 using that address. In some implementations, a first monitor bridge may need to instruct a power monitor 120 and user device 150 to reconnect to a second monitor bridge (e.g., for load balancing or maintenance of a monitor bridge). When a first monitor bridge needs to instruct a power monitor 120 and user device 150 to reconnect to a second monitor bridge, it may send a disconnect instruction along with an address for the second monitor bridge, and power monitor 120 and user device 150 may then connect to the second monitor bridge using the address.

Monitor bridge 620 and API server 610 may also interact with one or more backend services 630 to provide services to user device 150 and power monitor 120. Examples of backend services include providing alerts to user device 150, storing and retrieving information about specific users or devices that are stored in power monitor profiles 804 (discussed below), storing usage data 806 received from power monitors (discussed below), and providing updated models to specific power monitors (discussed below).

Presentation of Device Information

FIG. 7 shows several examples of information that may be presented to a user based on information received from power monitor 120. FIG. 7A shows a display 700 that may correspond to an initial display of an app or the main page of a website. The top portion 701 of display 700 presents several graphical elements 702 that indicate power usage of several devices in the house. As shown, graphical elements 702 are circles, but any suitable graphical representation may be used. The size, color, shading, highlighting, or other feature of the graphical elements 702 may indicate the amount of power used by the corresponding devices. For example, the area of the circle may indicate the amount of power. Alternatively, the volume of a sphere with the same diameter may correspond to the amount of power. By using a non-linear scale, it may be easier to represent devices with significantly different power usages. Where user device 150 is receiving information in real time, the graphical elements 702 may also be updated in real time so that the user is viewing the information without significant delay from the measurement of the information. In some implementations, graphical elements 702 may move or bounce into each other to provide the user with a visually appealing display. The top portion of the display may also include the total power 703 used by all devices in the house, and this may also be presented in real time. For example, if a user turns off a light in the house, total power 703 may indicate the reduced power without significant delay. The power values may correspond to an amount of energy consumed during a time interval, such as one second or once cycle.

The devices presented in the top portion 701 may be selected according to different criteria. For example, in some implementations, the devices presented in top portion 701 may represent the devices consuming the most power or may be devices selected by the user. In some implementations, the user may specifically exclude some devices from appearing in the top portion.

In some implementations, the specificity in naming the devices presented in the top portion 701 may be determined by a confidence in the correctness of the device identification, and hierarchical models may be used to determine the appropriate specificity. In some implementations, a lowest level model in hierarchy that has a sufficient confidence may be used to name a device. For example, if a general "lighting model" has a sufficiently high confidence score, but all lower level models (e.g., LED lighting, incandescent lighting, etc.) do not, then the device may be named as a light. If, however, the LED lighting model has a sufficient confidence score, the device may be named as an LED light.

The bottom portion 704 of display 700 may present device events or other information about devices as list items 705. For example, in some implementations the bottom portion 704 may present devices that have changed state (e.g., the coffee maker turned on), the current state of a device (e.g., the dryer is on), information about the number of uses of a device over a time period (e.g., that dryer has been used 5 times in the last week), an input element to create an alert based on a state change of a device (e.g., the user may want to create an alert to know when the clothes washer is completed so he or she can put the clothes in the dryer), or a warning that a device has been on for a certain period of time (e.g., that a hair straightener has been on for half an hour). Each item of the list may have additional information such as a time associated with the device event or power consumption relating to the device event.

In some implementations, a user may perform actions to view other information. For example, a user may select (touch via a touch screen or click or mouse-over with a mouse) one of the graphical elements 702 to view additional information about that device. A user may select list items 705 to view more information about them. A user may swipe in a direction to see other displays of information.

Figures 7A, 7B:
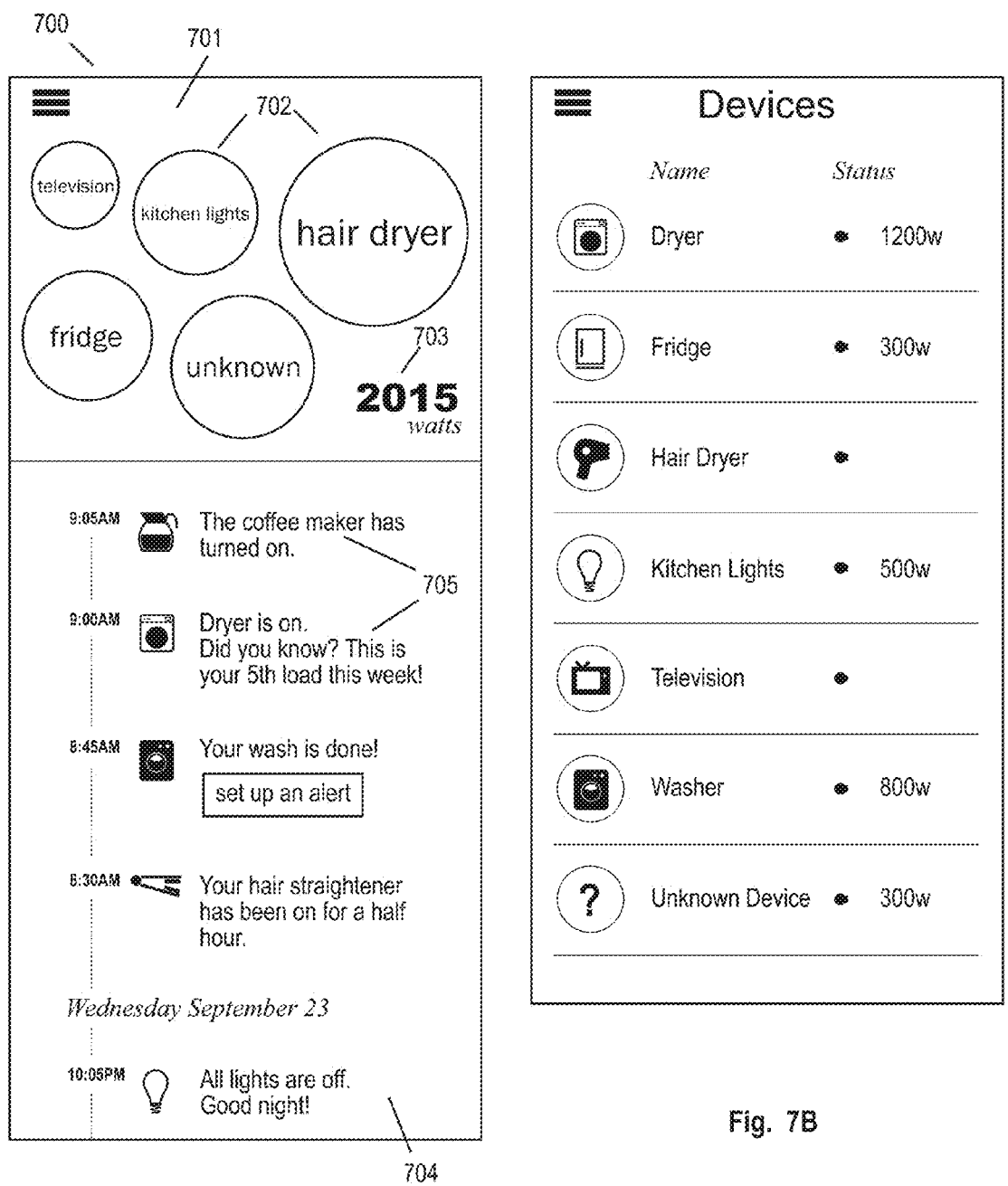
FIGS. 7A-7H illustrate example displays for providing information to a user about devices in the home.

FIG. 7B shows another display where the status of devices in the house is shown as a list. For example, all of the devices in the house may be presented in alphabetical order, devices selected by the user may be presented, or devices except those excluded by a user may be shown. Information about each device may be shown, such as whether the device is on or off or the amount of power being consumed by the device. In some implementations, a user may select a list item to see more information about that device.

Figure 7C:
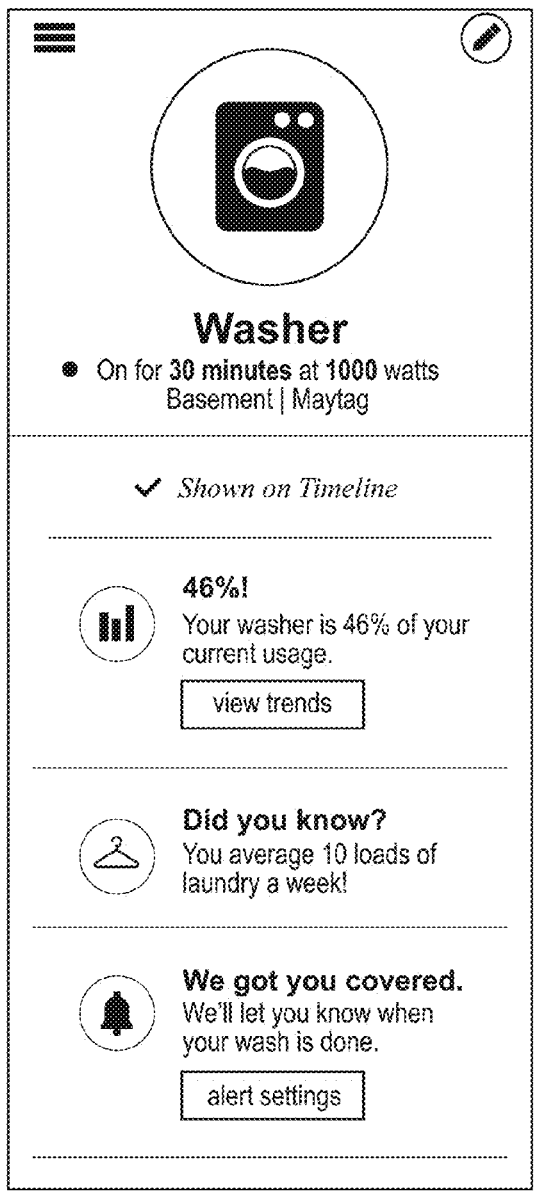
Figure 7D:

FIGS. 7C and 7D show examples of displays with additional information about individual devices. These displays may be accessed, for example, by selecting the corresponding devices in FIG. 7A or 7B. A display for information about a device may include, for example, a name indicating a type of device (e.g., washer), an icon indicating a type of device, a picture of the actual device, the manufacturer and/or version of the device, the location of the device in the house, the amount of power being consumed by the device, the state of the device (e.g., on or off), the last time the device was used, the length of time the device is being used, the percentage of power usage attributable to the device, or the number of times the device has been used over a time period. In addition, the display for information about a device may include user inputs to allow a user to indicate whether the device should appear on other displays (such as FIGS. 7A and 7B), to obtain further information about the device (such as power usage and other information relating to past usage of the device), and to allow the user to create alerts relating to the device (e.g., state changes of the device or if the device is left on for greater than a period of time).

Figure 7E:
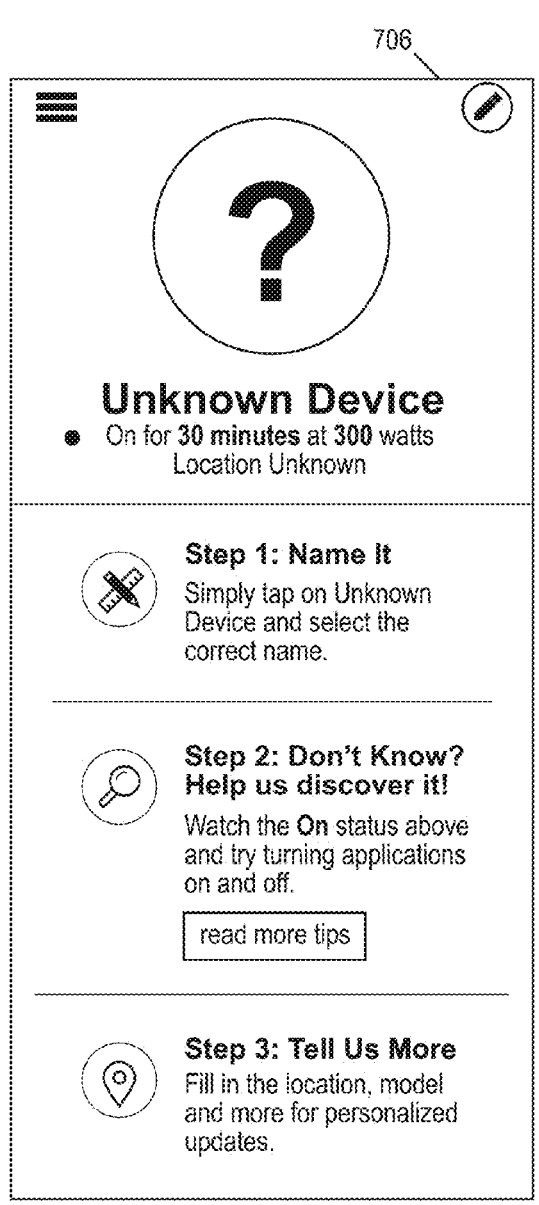

Some devices in a user's home may not be identifiable. For example, if a user purchases a new device, it may be referred to as an unknown device. Unknown devices may be listed in various displays with the name "Unknown Device" and a question mark for an image. An unknown device may not be identifiable, but power monitor 120 may be able to recognize it as a device and determine some information about it, such as when it is turned on or off and how much power it consumes. FIG. 7E shows an example display for an unknown device when the user selects "Unknown" or "Unknown Device" from FIG. 7A or 7B. The display for the unknown device may provide some information about the unknown device, such as whether it is on or off and how much power the unknown device is consuming. The display for the unknown device may also include a user interface for providing further information about the unknown device, such as the name, type of device, make, version, location, etc.

In some implementations, a user may be able to take pictures or video of devices in the house, and object recognition techniques may be used to automatically identify a user's devices. For example, a user could walk around the house and take pictures or video of kitchen appliances, water heater, furnace, washer, dryer, and television to quickly identify many of the large appliances in the house. The user may also take pictures of serial numbers, labels, or other text, and this information may be processed (e.g., with optical character recognition) to identify devices. The user could also be asked to provide a "tour" of the devices in the house, switching devices on and off and signifying through the user interface which device state was changed at the time of the change.

In some implementations, a user may be asked for assistance with identifying information about devices that are always on. Some devices are always on or nearly always on by their nature (e.g., refrigerator, Wi-Fi router, etc.), and other devices do not completely turn off even when they appear off to a user (e.g., television). For example, a user may be instructed to briefly unplug specific devices, such as the television and Wi-Fi router, wait for an amount of time, and then instructed to plug the device back in. With this information, power monitor 120 can determine information about electrical usage of devices that are always or nearly always on and then provide more informative reports to the user. For example, a switching power supply of a television may have specific characteristics, and once those characteristics are determined, power monitor 120 may be able to determine information about electrical usage of the television on an ongoing basis.

In some implementations, a user may be asked questions to help identify devices in the house. The questions may be asked before the user installs power monitor 120 or after power monitor 120 is installed and preliminary data is collected. Questions could be at a high level, such as yes/no questions regarding whether the user owns particular types of devices (e.g., hot tub, aquarium, humidifier, etc.). Questions could be more specific and ask the user to provide manufacturers and/or versions of devices in the house. Questions could also relate to asking a user to confirm whether power monitor 120 has accurately discovered devices in the house (device discovery is explained in further detail below).

In some implementations, the display for an unknown device may implement a procedure to assist a user in determining which device in the house the unknown device corresponds to. For example, the display for an unknown device may contain a button "Identify Me" (not shown in FIG. 7E). The user can push (or hold down, tap, or any other form of user input) this button and then change the state of a device in the house by turning it on or off. Power monitor 120 can then compare the electrical event received shortly after the button press with an electrical event from the unknown device to determine if the two are the same, and the results may then be presented on the display for the unknown device, such as "Yes, this is the unknown device" or "No, that is not the unknown device." In this manner, a user can repeatedly try devices until the unknown device is determined. Thus, more generally, a user may validate or negate information initially presented based on determinations made by a power monitor 120, such as confirming that a particular device is, in fact, the oven, a light bulb, or the like.

After determining which device the unknown device corresponds to, the user may edit information about the device. For example, in FIG. 7E, the user may press edit button 706 to activate an edit mode (not shown). In the edit mode, a user may enter information about the device, including but not limited to a name, type, manufacturer, version, and location (room or floor of the house). The user may then press edit button 706 a second time to save changes.

Power monitor 120 may have a device list corresponding to devices that have been identified in the house. When power monitor 120 is first installed, it may not know about any devices in the house and thus have an empty device list. In some implementations, power monitor 120 may already have a device list at the time of installation, such as based on information provided by a user in advance, based on information obtained from another source (such as transaction records indicating devices previously purchased by the user), or based on certain default assumptions (e.g., that the house will have a refrigerator, an oven, a stove, a washer, a dryer, and a dishwasher). A device in the device list may have information and/or labels associated with it. For example, labels may exist for types, makes, and/or versions of devices. Information and/or labels may include any relevant information, such as the location in the house, the age of the device, the size, shape or color of the device, and/or an association of the device with a particular individual within the house (e.g., "Mike's TV," or "Mom's Computer"). As used herein, a label includes any item of data that provides information about a device. Each device in the device list may be associated with one or models, such as transition models and device models.

Devices in the device list may be identified with varying levels of specificity. For example, the device list may include a first device that is specified simply as a dishwasher (with the make and version being unknown) and a second device that is specified as a Kenmore version 4000 refrigerator that is blue, 3 years old, and located in the second floor kitchen. The device list may have an interface by which a user may modify the device list, such as by adding devices, deleting devices, modifying device descriptions (such as to provide more specificity), associating a device with an individual, or the like. In embodiments the device list may be provided in a user interface that permits interaction with its elements, such as allowing a user to drill down for further information about a device (e.g., additional specificity about the device or data collected by the methods and systems disclosed herein), such as upon touching, clicking, or otherwise interacting with a particular element of the list.

Power monitor 120 may have additional models that are not associated with devices on the device list. For example, a newly installed power monitor may have an empty device list and include models for common classes of devices (e.g., dishwasher, refrigerator, etc.) or any other models described above.

As power monitor 120 is processing electrical signals, it may use models that are associated with devices on the device list and it may use models that are not associated with devices on the device list. By comparing scores and/or confidence levels generated using the various models, new devices may be added to the device list, new models may be associated with devices on the device list, or model associated with devices may be modified or adjusted based on the collected data. A score may indicate how well data fits a model. A confidence level may indicates a measure of the confidence that the data was generated by a device that is correctly associated with the model. For example, where only one model generates a high score, the confidence level may be high, as it is likely that the data was generated by a device that is correctly associated with that model. By contrast, where multiple models produced high scores, the confidence level may be low, because it is difficult to differentiate among the models sufficiently to associate a single model with the device. Confidence level computation may use information which was not used for scores, for example how well the hypothesis of an association between a given model and a device matches duration models, how well it corresponds to expected times of day for the usage of the device, how well it corresponds to the timing of other devices, information about purchases made by a user of the device, and so on. Confidence levels may also make use of patterns of error of the system in previous usage. From previous usage of a model, it may by known that the model often generates false matches of a certain type. For example, a model for Kenmore refrigerator may often provide a false match to a dehumidifier, and this information may be taken account in determining a confidence level.

In processing an electrical signal, scores and/or confidence levels may be generated using the models. From these scores and confidence levels, one or more models may be selected as most likely corresponding to an electrical event in the electrical signal. For example, a model having a highest score may be selected. In some implementations, confidence levels may be used. For example, the model corresponding to a highest score may not be selected if the confidence level indicates that there is low confidence that the electrical event matches the model, such as in situations where it is difficult to disambiguate between two or more models that have similar scores. Alternatively, multiple models may be selected if there is a high confidence that the electrical event matches the model for each of them. Where multiple models are selected, results from them can be handled in various ways. For example, results could be averaged to provide a single output, results can be tracked against further data, such that the best of a group of models is selected after additional data collection, or the like.

If the one or more selected models correspond to devices already on the device list, then no changes may need to be made to the device list. If the one or more selected models correspond to devices not on the device list, then a new device may be added to the device list or a device on the device list may be updated or replaced. In some situations, such as when there is a high confidence level, the device list may be updated without seeking confirmation from the user. In some situations, such as when the confidence level is low, the user may be prompted to confirm or provide additional information.

As more devices are added to the device list, the device list may reach a steady state (subject to device aging and other such variations). In this steady state, many or nearly all of the electrical events processed may correspond to devices on the device list. When the user adds a new device or replaces an existing device, models corresponding to the new device may provide a better match than the models for all of the devices on the device list, and the new device may be added to the device list (either with or without user confirmation).

In some implementations, a user may be asked to provide information about devices to assist in adding devices to the device list. For example, a user interface may be presented to the user on a device, such as user device 150. The user interface may include, for example, an input to allow the user to type in free form text describing devices in the house, and the text may be processed using natural language processing. In another example, the user interface may allow the user to select items from lists, such as drop down menus. Lists may include device classes, makes, versions, or any other relevant information. The options presented to the user may change after an initial input from the user. For example, a user may type or select a class of device and then makes and/or models corresponding to that class of device may be presented to the user. The options presented to the user may also depend on information learned from processing electrical signals. In some implementations, the list may include devices likely in the house based on a match of electrical signals to transition and device models. For example, if there is a possible match for Whirlpool dishwashers then the list may include versions of Whirlpool dishwashers.

In a first implementation, the user interface may first present the user with first (e.g., partial) information about a device and prompt the user to provide second information about the device. In a second implementation, the user may not be presented with partial information about a device and be asked to provide information about devices that have not yet been identified, such as by being put on a device list.

In the first implementation, the user may be presented with first information about a device and be prompted to provide second information. For example, using the techniques described above, it may be determined that the user has a device with a type of element, and the user may be prompted to enter further information about the device (e.g., prompt the user to enter more information about a device with a pump or a motor). Alternatively, it may be determined that the user has a class of device or a brand and class of a device (e.g., that the user has a dishwasher or a Kenmore dishwasher) and the user may be prompted to enter additional information (such as the version of the dishwasher). In some implementations, automated device discovery (described in greater detail below) may discover a device but may have a low confidence level or high degree of uncertainty between two possible device matches. For example, a device may be a possible match for an aquarium or a hot tub, and the user may be asked to provide further information about the device. In some implementations, a user may be presented with other information, such as an approximate time of a state change (e.g., the device turned on at 10:00 am), a number of state changes over a time period, average wattage, or a graph of electrical usage (e.g., wattage) over time.

When electrical events are received from a device that is at least partially unknown, the events may be processed with a set of existing models as described above. One or more models may be selected, e.g., by selecting one or more models that generated the highest scores. After selecting the one or more models, first information about the selected models may be obtained and presented to the user. In some implementations, the decision to present the first information to the user may be determined based at least partly on the first information itself. For example, the first information may indicate that additional information is needed or desired (the model could correspond to an aquarium or a hot tub and we should get clarification from the user). The user may then be prompted to provide second information about the device. The second information can include any relevant information about a device, such as a class of device, a make or version, a location in the house, or an age. The second information may be used to select a label to associate with the device. The label may be essentially the same as the second information provided by the user or may be different. For example, a user may be presented with a list of labels to choose from, or a user may be prompted to enter text and the text may be processed to determine an appropriate label using natural language processing techniques.

Before or after receiving the second information from the user, the device may be added to a device list as described above. The device in the list may be associated with information and/or labels, such as information corresponding to selected models, the second information received from the user, or labels generated from the information.

In a variation of the first implementation, the first information may not be presented to the user. The first information may be used to determine whether to request additional information from the user without presenting the first information to the user. For example, the first information may indicate that a new device is present in the house, and based on this information, the user may be requested to provide information about devices in the house.

In the second implementation, a user may be prompted to enter information about devices in the house without providing partial information about devices to the user. For example, after the initial setup, a user may be asked to provide information about devices in the house, or a user may want to enter information about a device that hasn't been detected using the techniques described herein.

The information provided by the user may include any of the information described above including, for example, a class, make, and/or version of a device. The information may be provided by the user via any appropriate techniques, such as entering free form text or making selections from lists. The information provided by the user may be used to obtain models for identifying devices. For example, the user may provide information indicating that he or she has a dishwasher, and models may be obtained that correspond to different types of dishwashers. The models may be obtained, for example, from storage of power monitor 120, or they may be obtained from an exterior source, such as a server computer that provides models via an API.

In some implementations, some or all of the obtained models may be used to process an electrical signal and a score may be generated for each model. Using these scores, one or models may be selected. For example, a model having a highest score may be selected. In some implementations, confidence levels may be used. For example, the model corresponding to a highest score may not be selected if the confidence level indicates that there is low confidence that the electrical event matches the model. Alternatively, multiple models may be selected if there is a higher confidence that the electrical event matches the model for each of them.

Before or after selecting the one or more models, a device may be added to the device list. The device in the list may be associated with information and/or labels, such as information corresponding to selected models, the information received from the user, or labels generated from the information.

When later providing information about the device to the user, such as via user device 150, the information and labels associated with devices in the device list may be used to provide the user with greater detail about the device, such as its location or make and version. The information and/or labels may also be used to obtain improved models for the device. For example, if the user provides the make and version of the device, then models may be obtained that are specific to that make and version.

Figure 7F:
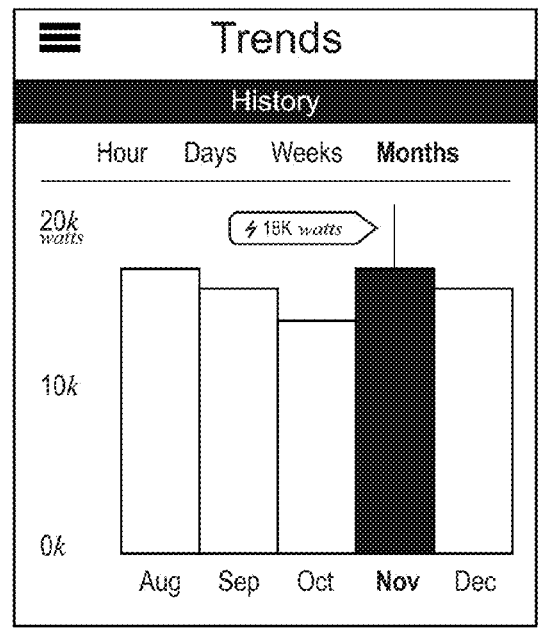

Additional information that may be presented to a user includes a display of historical power usage as shown in FIG. 7F. This display may be accessed, for example, by touching the number for total power 703 from FIG. 7A. In displaying historical power usage of all devices, any presentation format may be used, including but not limited to bar charts, line charts, or a list of numbers. Different granularities may be available, such as hourly, daily, weekly, or monthly. For example FIG. 7F shows monthly power usage for 5 months. In some implementations, a user may change the time scale, for example by pinching to show a larger time scale or splaying to show a smaller time scale. In some implementations, a user may touch one of the bars of a bar graph to obtain the number of watts corresponding to the bar.

Figure 7G:
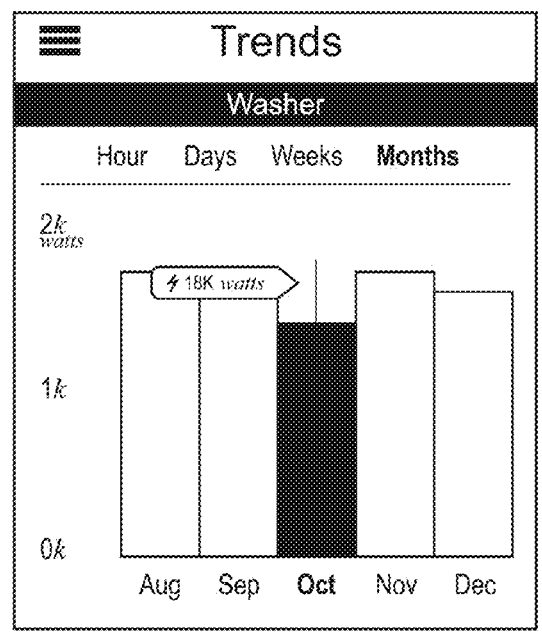

Historical power usage of individual devices may also be presented to a user as shown in FIG. 7G, where historical power usage of a washer is shown. Any of the techniques for presenting historical power usage for overall power usage in FIG. 7F may also be applied to present historical power usage of individual devices.

The relative power usage of individual devices may also be presented to help the user understand how much power devices are consuming compared to one another. In some implementations, pie charts may be used to show relative power usage. For example, a pie chart may be shown where the entire pie chart represents the total power usage over a period of time (e.g., the last month). The pie chart may present slices for each device in the house, and a user may touch an individual slice to obtain additional information about that device or the power usage by that device. In some implementations, a large number of devices may result in a complex pie chart, and classes of devices may be presented instead of some or all of the individual devices. For example, the slices for all of the incandescent light bulbs may be replaced with a single slice for incandescent light bulbs. In some implementations, a user may be able to zoom into a portion of the pie chart to more easily view the power consumption of individual devices.

Figure 7H:
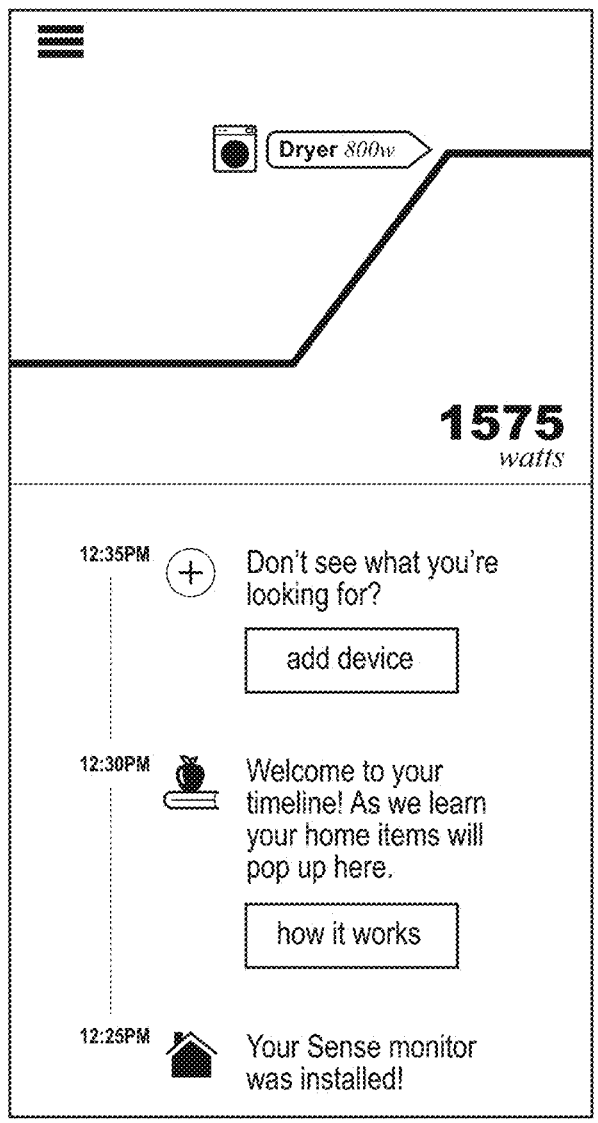

Additional information that may be presented to a user includes a display of changes in power usage over time as shown in FIG. 7H. This display may be accessed, for example, by touching the number for total power 703 from FIG. 7A, by swiping horizontally from FIG. 7A, or selecting it from a menu. In displaying changes in power usage over time, any presentation format may be used, including but not limited to bar charts, line charts, or a list of numbers. Different time scales may be available, such as the most recent hour, day, or week. In some implementations, a user may change the time scale, for example by pinching to show a larger time scale or splaying to show a smaller time scale.

In some implementations of FIG. 7H, the display may be annotated to indicate the device that caused a change in power consumption. For example, in FIG. 7H the line chart shows an increase in power usage and a dryer is shown as causing the increase. In some implementations, the line chart (or other presentation format) may use a stacked display with different colors indicating different devices (not shown in FIG. 7H). For example, the line chart may include a first line showing the power usage of a first device, a second line showing the combined power usage of the first device and a second device with the area between the first and second lines indicating the power usage of the second device. Additional lines may be added for other devices. In some implementations, the line chart may show one line for steady state power usage of all (or many) devices and a second line for a device that recently changed state to indicate the change in power consumption caused by the state change of the device. As time goes on, that second line may be merged with first line as the steady state includes the recent state change.

Device Discovery and Model Updating

The foregoing provides example implementations of how power monitor 120 may be able to recognize device events for devices in the home. The performance of power monitor 120 may be improved, however, by using models that are specific for or adapted to a particular home. First, power monitor 120 may have models that correspond to the types or classes of devices in the home. If it is known that the home includes a hot tub, then a model that is able to determine device information for a hot tub may be added to power monitor 120. Second, power monitor may have models corresponding to the specific make and/or version of devices in the home. For example, the home may have a Kenmore 1000 microwave, and models particular to this microwave may be added to power monitor 120. Third, a specific manufacturer and version of a device may operate differently in different homes due to variances in manufacture, the specific electrical grid in the home, and other factors. Power monitor 120 may additionally have models that are adapted to the specific operation of the Kenmore model 1000 microwave in a specific home.

Figure 8:
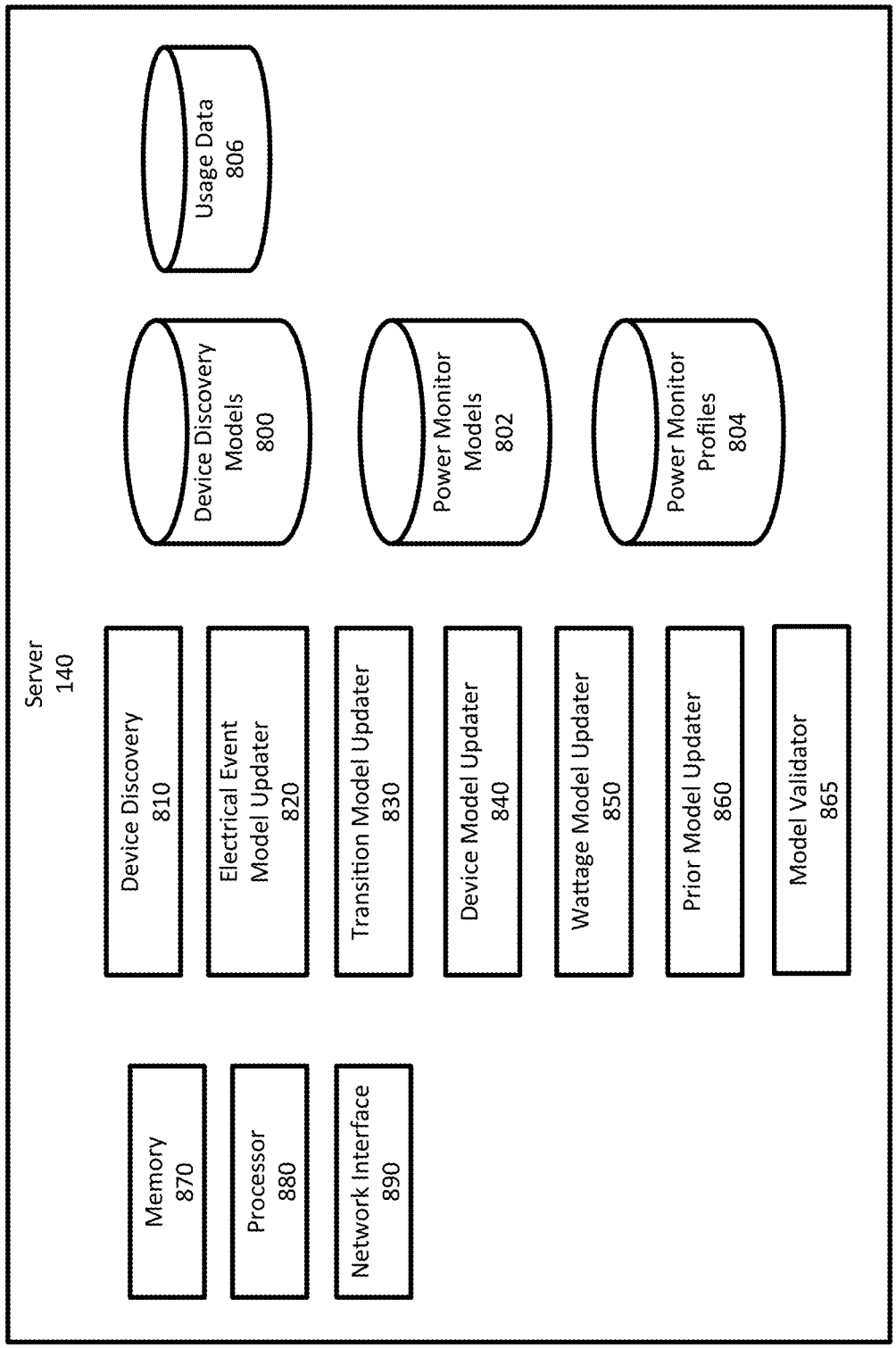
FIG. 8 illustrates components of one implementation of a server for discovering devices in a home and updating models for devices in a home.

FIG. 8 illustrates components of one implementation of a server 140 for discovering new devices in a home and updating models for devices in a home. In FIG. 8 the components are shown as being on a single server computer, but the components may be distributed among multiple server computers. For example, some servers could implement device discovery and other servers could implement model updating. Further, some of these operations could by performed by power monitor 120 or other devices in a home.

Server 140 may include any components typical of a computing device, such one or more processors 880, volatile or nonvolatile memory 870, and one or more network interfaces 890. Server 140 may also include any input and output components, such as displays, keyboards, and touch screens. Server 140 may also include a variety of components or modules providing specific functionality, and these components or modules may be implemented in software, hardware, or a combination thereof. Below, several examples of components are described for one example implementation, and other implementations may include additional components or exclude some of the components described below.

Server 140 may include device discovery component 810 for discovering information about devices in a home. For example, when power monitor 120 is first installed in a home, it may not have any information about devices in the home or it may only have information about classes of devices that are (or may be) in the home but not have information about specific devices. Device discovery component 810 can receive information about electrical signals in a home, determine information about devices in the home, and then send updated models to the home for use by power monitor 120.

In some implementations, device discovery component 810 may receive other information in addition to information about electrical signals. Where power monitor 120 is connected to a home network (either wired or wirelessly and with permission of the user), power monitor may be able to determine information about other devices on the home network. For example, power monitor may be able to determine information about the manufacturer and version of the wireless router is it connected to. Power monitor may also be able to determine information about other devices on the home network, such as home computers, mobile devices (e.g., phones, tablets, watches, glasses), and devices relating to home automation or the Internet of things (e.g., smart thermostats and other devices for controlling lights, locks, security systems, cameras, and home entertainment systems). Power monitor 120 may also be able to obtain information about devices in the home by monitoring other network protocols, such as Wi-Fi, NFC, Bluetooth and ZigBee. An app on user device 150 may also be configured to determine information about devices on local networks, such as Wi-Fi, Bluetooth and ZigBee. Device discovery component 810 can receive this information about devices on the local networks to improve the models sent to power monitor 120. For example, device models for a user's Wi-Fi router and for charging a user's particular smart phone may be added to the user's power monitor to improve the ability of the power monitor to determine the electricity usage of these devices.

Device discovery component 810 can receive any relevant information from power monitor 120 and the information received may vary over time. For example, when power monitor 120 is first installed in a home, device discovery component 810 may receive a continuous stream of electrical signals in the home to determine characteristics of electrical signals in the home and to discover devices in the home. Continuously streaming electrical signals from a home may consume significant network and processing resources and thus may be performed for only a limited period of time.

Device discovery component 810 may receive information about electrical events from power monitor 120. When power monitor 120 is first installed in a home, device discovery component 810 may receive a continuous stream of information about electrical events to discover devices in the home. As devices are discovered and power monitor 120 updated with additional models, the information about electrical events transmitted to device discovery component 810 may be reduced. For example, device discovery component 810 may receive only information about electrical events that do not correspond to devices known by power monitor 120.

Device discovery component 810 may also receive information about device events determined by power monitor 120. For example, power monitor 120 may determine that a dishwasher started at a particular time and this information may be received by device discovery component 810. This information may be used by device discovery component 810 to update and make corrections to power monitor models. For example, it may be that the device event was incorrectly determined to be a clothes washer starting, and device discovery component 810 can update the models to reduce the likelihood of this error from happening again. In some implementations, device discovery component 810 may receive all or a subset of search graph 510 in one or more modes. For example, device discovery component 810 may receive a best path through search graph 510 for a historical mode search.

Device discovery component 810 may also receive information generated by the user or feedback provided by a user. As described above, user device 150 may provide a user interface where the user is requested to help identify devices in the house. Power monitor 120 may thus provide electrical signals and/or electrical events that have been manually labeled by the user. This labeled data may be used to train models for this particular user and other users. A user may also provide feedback correcting identifications made by power monitor 120. For example, power monitor may have identified a dishwasher as a Kenmore dishwasher where the dishwasher was actually a Whirlpool dishwasher. The user feedback may be used in combination with the electrical signal and/or electrical event to improve models for both Kenmore and Whirlpool dishwashers.

Device discovery component 810 may use device discovery models 800 to discover devices in a home. Device discovery models 800 may include a hierarchy of models. For example, discovery models 800 may include models that generally correspond to the operation of most or all dishwashers, models that correspond to a subset of all dishwashers (e.g., dishwashers with one pump or dishwashers with two pumps), models that generally correspond to most or all versions of dishwashers by a specific manufacturer, and models for specific versions of dishwashers by a specific manufacturer. In this manner, device discovery component 810 may provide the best available information to power monitor 120. If a user purchases a version of a dishwasher that was just released, device discovery component 810 may not be able to determine the version of the dishwasher, but may be able to determine the manufacturer of the dishwasher, or at least determine correctly that the device is a dishwasher. In some implementations, device discovery component 810 may use transition models 202 and device models 204 for discovering new devices, and in some implementations, device discovery component 810 may use variations of transition models 202 and device models 204, or may use completely different models.

In some implementations, device discovery component 810 receives a stream of information about electrical events. The stream of electrical events could correspond to all electrical events detected by power monitor 120 or could include only electrical events that do not correspond to previously discovered devices. Device discovery component 810 may compare the stream of electrical events against one or more device discovery models 800 to determine a device corresponding to the electrical events. Device discovery component 810 may compare the electrical events against all device discovery models 800 to determine a device, or could proceed in a hierarchical fashion by first determining that the electrical events correspond to a dishwasher, then to a dishwasher by a particular manufacturer, and then to a specific version of a dishwasher by the particular manufacturer.

Figure 9:
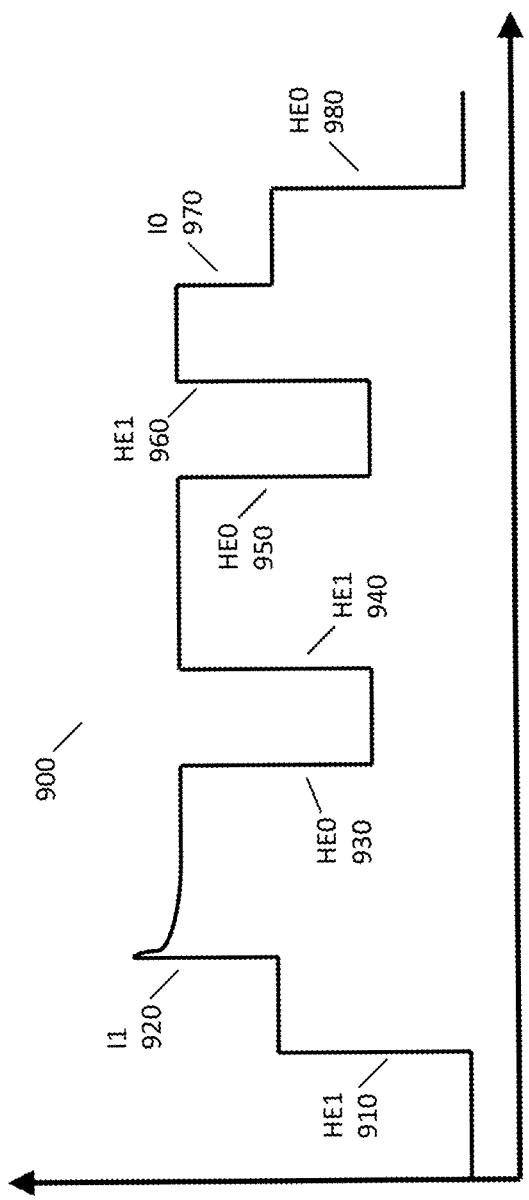
FIG. 9 illustrates an electrical signal with electrical events from two devices.
Figure 10:
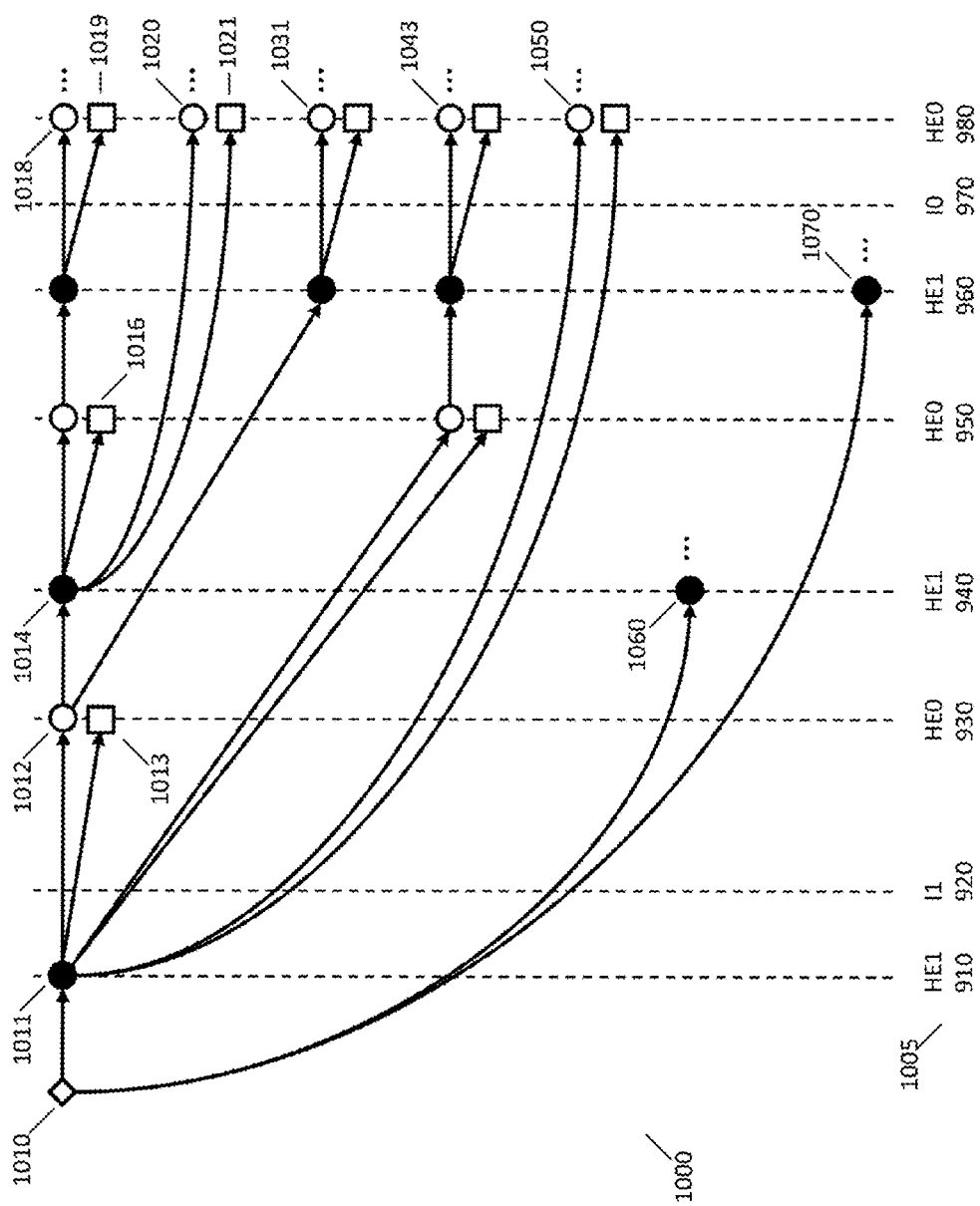
FIG. 10 illustrates an example of a discovery graph that may be used for discovering new devices.

In some implementations, device discovery component 810 may create a discovery graph using an electrical event stream, transition models, and device models. FIG. 9 shows an example electrical signal with electrical events from two devices, and FIG. 10 shows an example of discovery graph 1000 created for the electrical signal of FIG. 9. Device discovery component 810 may receive electrical signal 900 and determine electrical events in electrical signal 900 or may instead receive an electrical event stream where the electrical events are determined elsewhere. In the example of FIG. 9, the electrical signal may correspond approximately to electrical signals received from the burner of an electric stove and an incandescent light bulb. The burner may be represented by a heating element, and electrical event HE1 may correspond to the heating element transitioning from an off state to an on state and HE0 may correspond to the heating element transitioning from the on state to an off state. Electrical event I1 may correspond to an incandescent light bulb transitioning from an off state to an on state and electrical event I0 may correspond to the incandescent light bulb transitioning from an on state to an off state. Electrical events 910-980 show a possible sequence of electrical events generated by a heating element and an incandescent light bulb.

As described above, FIG. 4 illustrates an exemplary state model for an electric burner of a stove. Device discovery component 810 may create a discovery graph using an electrical event stream and the device model of FIG. 4 to determine if the sequence of electrical events in the electrical event stream includes a burner.

Discovery graph 1000 begins at node 1010, where node 1010 corresponds to the initial state, state B, of the device model for an electric burner, and state B is indicated with a diamond. The first electrical event in the electrical event stream is electrical event 910. The transition models may be used to determine that electrical event 910 corresponds to the transition HE1. For example, this may be accomplished by applying all of the transition models to electrical event 910 and selecting the transition whose transition model produces the highest score. The transition HE1 may be compared against discovery graph 1000 to determine if HE1 is an allowable transition from any current node in the discovery graph. Since node 1010 corresponds to state B and HE1 is an allowable transition from state B to state S1, node 1011 may be added to discovery graph 1000, where node 1011 corresponds to state S1 and is indicated with a solid circle.

The next electrical event is electrical event 920, and the transition models may be used to determine that electrical event 920 corresponds to the transition I1. Transition I1 does not correspond to any valid transitions from nodes of discovery graph 1000 so no nodes may be added in response to electrical event 920.

The next electrical event is electrical event 930, and the transition models may be used to determine that electrical event 930 corresponds to the transition HE0. Transition HE0 is not an allowable transition from node 1010 but it is an allowable transition from node 1011. Node 1011 corresponds to state S1, and HE0 is an allowable transition from state S1 to both state S2 and state E. Since both of these transitions are allowed, two nodes are added to discovery graph 1000: node 1012 and node 1013. Node 1012 corresponds to the transition to state S2 and is indicated with an empty circle. Node 1013 corresponds to the transition to state E and is indicated with a square.

The next electrical event is electrical event 940, and the transition models may be used to determine that electrical event 940 corresponds to the transition HE1. As above, HE1 is an allowable transition from node 1010, and thus node 1060 may be added to discovery graph 1000, where node 1060 corresponds to state S1. Electrical event HE1 is also an allowable transition from node 1012, and thus node 1014 is also added to discovery graph 1000, where node 1014 corresponds to state S1.

FIG. 10 continues to show allowable transitions for electrical events 950-980. For each of these electrical events, the corresponding transitions are determined, and nodes are added to discovery graph 1000 for allowable transitions. Note that for clarity, transitions following nodes 1018, 1020, 1031, 1043, 1050, 1060, and 1070 are indicated with ellipses.

Discovery graph 1000 may be used to identify a device corresponding to electrical event stream 1005. In some implementations, discovery graph 1000 reaching the end state of a device model indicates that the sequence of electrical events likely corresponds to the device of the device model. In some implementations, additional information may be considered. For example, other information may be available corresponding to a device model, such as an expected duration that a device remains in a particular state and an expected change in power consumption caused by an electrical event. For the device model of FIG. 4, the length of time that the device stays in state S1 may be limited to 1-5 seconds. For the transition from node 1011 to node 1050 in FIG. 10, the length of time that the device stays in state S1 may be 10 seconds. Because this duration exceeds the allowable duration, the transition from node 1011 to node 1050 may not be an allowable transition and this transition may be excluded from discovery graph 1000. Similarly, a change in power consumption caused by an electrical event and any other relevant factors may be used to determine whether a sequence of electrical events corresponds to a device. Any of the information used in creating search graphs may also be used with discovery graphs. For example, transition scores, wattages scores, and prior scores may all be used to determine whether a sequence of electrical events corresponds to a device.

Where discovery graph 1000 includes multiple paths that reach the end state of a device model, one of the multiple paths may be selected as a most likely path corresponding to the actual operation of the device. For example, in FIG. 10, the paths ending at nodes 1013, 1016, 1019, and 1021 may all correspond to valid state transitions for the burner. Other criteria may be used to select one of these paths as most likely corresponding to operation of the burner. For example, longer paths may be preferred over shorter paths, so the path ending at node 1019 may be preferred over the paths ending at nodes 1013 and 1016. Additionally, the path ending at node 1019 may be considered more likely than the path ending at 1021 based on the durations for the states of the device model. In some implementations, each path of a discovery graph that reaches an end state of a device model may be assigned a score. The score may be computed using any relevant information, including but not limited to scores produced by transition models, path lengths, state duration constraints, and power constraints. The path with the highest score may then be selected as the most likely path.

A consistency of nodes along a path may also be used to score a path or to select a path from several paths that reach an end state. For example, for each instance of the HE1 event, it may be expected the power consumed during the event and/or the length of time in state S1 is similar for each occurrence of state S1. Accordingly, a path with greater consistency may receive a higher score than a path with lower consistency.

Once a most likely path is determined from discovery graph 1000, the electrical events corresponding to the most likely path may be removed from electrical event stream 1005. For example, if the most likely path is the path ending at node 1019, then removing these electrical events from electrical event stream 1005 would leave only electrical event I1 920 and electrical event I0 970. These remaining electrical events may then be processed with another discovery graph 1000 to discover another device.

To determine that a device that corresponds to a sequence of electrical events, a discovery graph may be created for a variety of devices. In some implementations, discovery graphs may first be created for classes of devices to determine at a high level whether the device corresponds to a class of device, such as a refrigerator, stove, dishwasher, etc. Where only one discovery graph reaches an end state, the corresponding device class may be selected. Where more than one discovery graph reaches an end state, the device class may be selected according to a greatest score. After determining the class of device, additional discovery graphs may be created to determine more specific information about a device. For example, discovery graphs may be created for each manufacturer of dishwashers, or discovery graphs may be created for each known version of dishwasher. As above, the device may be selected by a highest scoring discovery graph that has a path that reaches an end state.

Once the device is determined from the sequence of electrical events, models may be selected for transmission to power monitor 120. For example, electrical event models, transition modes, device models, wattage models, and/or prior models that contain information about the discovered device may be transmitted to power monitor 120.

In addition to discovering new devices, server 140 may also update models for known devices and adapt models for known devices. Models may be updated for a variety of reasons: research and development efforts may determine new models that perform better than previous models, new models may be created as new devices become available on the market, models may be adapted to specific devices to account for variances in manufacturing, and models may be adapted as the electrical properties of devices drift over time (e.g., caused by wear of devices or changes in the quality of the electrical lines in the house). For example, a user may purchase the latest version of a Kenmore dishwasher. At the time that server 140 discovers the dishwasher, server 140 may not yet have a device model for the latest version of a Kenmore dishwasher. Server 140 may provide power monitor 120 with a device model for Kenmore dishwashers. Later, when server 140 has updated its device discovery models, it may again perform device discovery to determine the specific version of a Kenmore dishwasher and provide that device model to power monitor 120.

Server 140 may store power monitor models 802, which may include electrical event models, transition models, device models, wattage models, and prior models. Power monitor models 802 may include any of the type of models discussed above including but not limited to models for classes of devices and elements (e.g., dishwashers), models for devices and elements by a particular manufacturer (e.g., dishwashers by Kenmore), models for a particular version of a device by a particular manufacturer (e.g., a Kenmore version 1000 dishwasher of a certain vintage), and models for specific devices (e.g., the Kenmore version 1000 dishwasher at 100 Main Street). The models may be updated over time and adapted to specific power monitor users as described below.

Server 140 may store usage data 806 received from power monitors in homes. Usage data 806 may include, for example, electrical signals processed by power monitor 120, portions of electrical signals processed by power monitor 120, portions of electrical signal processed by power monitor 120 that correspond to electrical events, features generated from electrical signals or electrical events, device events detected by power monitor 120, or all or portions of search graphs created by power monitor 120. To ensure the privacy of end users, this usage data may be anonymized (removing personally identifying information) and/or retained for a limited period of time. Usage data 806 may be used to update or adapt models as described below.

Server 140 may store power monitor profiles 804 for users of power monitors. Power monitor profiles 804 may store any relevant data relating to the operation of a power monitor 120 by a particular user with the knowledge and permission of the user. Data that may be stored in a power monitor profile includes, for example, a purchase and/or installation date of a power monitor, a list of devices discovered by device discovery component 810, dates of discovery of devices, a geographic location of a power monitor, a number of people residing in a house and demographic information about the people, historical information about aggregate power usage and power usage by individual devices, and historical information about device events such as devices turning on or off or changing state.

A power monitor profile may also store models that are specific to a particular user. As described below, models may be updated or adapted to a specific user's house and specific devices in a user's house. The house-specific models may be stored (or a link to the models may be stored) in a user's power monitor profile. Usage data of a user may also be stored (or a link to the usage data may be stored) in the user's power monitor profile. The usage data may be labeled by the user or may be labeled automatically by a company that creates the power monitor models for a user. This usage data may be used to create house-specific models for a user as described below.

The model updaters 820-860 may be used to update and adapt existing models to create better house-independent models or to create better house-specific models. Model updaters 820-860 may do model updates on a periodic basis. Shortly after a user obtains a power monitor 120, model updaters 820-860 may operate more frequently, e.g., once a day, as it may be expected that receiving data from a new user will allow house-specific models to improve quickly.

When power monitor 120 is first installed, the models used may be more general, and by collecting house specific data, models can be constructed that perform better because they are built with data from the user. As time goes on, models may be updated less frequently, or when an indication is received that a user may have a new device in the house. Collecting data over long periods of time may generally allow for the improvement of both house-independent and house-specific models, and periodically providing these models to users may improve performance.

When power monitor 120 is first installed it may not have any models or may only have generic models that apply to classes of devices. For example, the initial models may include models that apply generally to a dishwasher, an oven, a motor, a pump, and a heating element. As more is learned about devices in a user's house, more specific models may be transmitted to a user's power monitor. For example, if it is learned that the user has a Kenmore version 1000 dishwasher, then models specific to a Kenmore version 1000 dishwasher pump and a Kenmore version 1000 dishwasher motor may be transmitted to the user's power monitor 120. Further, as time goes on, the electrical properties of known devices may drift as parts wear or evolve. Accordingly, the house-specific models for individual devices may be updated periodically so that house-specific models continue to match the devices as the properties of the devices drift over time.

Electrical event model updater 820 may create house-specific electrical event models. Houses may have different electrical characteristics including the noise levels and types of noise in electrical signals. Usage data received from a house may be used to create a house-specific electrical event model that is more reliable in detecting electrical events.

Transition model updater 830 may create house-specific transition models. Two identical devices (in terms of manufacturer and version) may behave differently in different houses. The differences may be caused by, for example, variances in manufacturing (e.g., a capacitor may have a slightly higher capacitance in one device than another device), the specific electrical configuration of a home (e.g., quality of wiring and electrical interference from other devices), and the age of a device (e.g., older parts may have different electrical characteristics). Because two identical devices may have different electrical properties, better transition models can be created by collecting usage data that is specific to a device. A house-specific transition model may be created using the same techniques as house-independent models, but with different data. House-independent models may be created with data from many houses, but house-specific models may use a greater amount of data from the house it is being created for.

Any appropriate techniques may be used to create a house-specific transition model. For example, a first model may be created with a general data set, a second model can be created with house specific data, and the two models may be interpolated to create a house specific model. The weights of each model in the interpolation may depend, for example, on the amount of house specific data that is available.

Device model updater 840 may create house-specific device models. Where device models are represented using directed graphs, such as the device model of FIG. 4, parameters of the directed graph may be adapted to match a specific device. For example, a directed graph for a dishwasher may have different paths for a normal wash and a pot scrubbing wash. If one user generally uses the pot scrubbing wash and not the normal wash, then path probabilities may be increased for the pot scrubbing wash to match the expected behavior of the user. Other parameters that may be adjusted include the expected duration and expected power usage corresponding to different states of the directed graph.

Wattage model updater 850 may create house-specific wattage models. Two identical devices may behave differently in different houses. Usage data specific to a house may be used to create a house-specific wattage model using the same techniques as for creating house-independent models discussed above.

Prior model updater 860 may create house-specific prior models. House-specific prior models may incorporate information specific to a house, such as location (which indicates daylight hours and temperature), number of people, number of floors, number of rooms, and type of building (single-family house, condo, apartment building etc.). This information may be provided by a user or automatically learned from historical usage data. Usage data from a house may also be used to better predict when individual devices are likely to be used. For example, a user's morning routine in getting ready to go to work (turning on the bedroom light, turning on the bathroom light, turning on the water in the shower, etc.) may be incorporated into a prior model to allow a power monitor to more accurately recognize these device events.

Model validator 865 may be used to evaluate the performance of any updated or adapted models before they are sent to individual power monitor devices. New models may only be sent where the new models perform better than old models. Model validator 865 may evaluate the updated or adapted models by running them against stored usage data (which may be house specific or house independent). Where the stored usage data is labeled, error metrics can be determined for both new models and old models, and the improved performance of the new models may be verified before being sent to individual power monitor devices.

Applications

The above techniques for informing users about home device usage provides many benefits to users and homeowners. For example, users can benefit by increasing energy efficiency, receiving warnings about devices that are not functioning correctly, and monitoring device events in the home from afar.

Understanding energy usage of individual devices in the home provides numerous opportunities for improving energy efficiency. Expert systems may be created that receive energy usage information for a home and automatically provide suggestions to users for actions they can take to improve energy efficiency. In some implementations, the expert systems may compare the energy usage of the devices currently in the home with replacement devices that are available and compare the cost of device replacement with the reduced energy costs provided by the replacement device. For example, an expert system may determine that the most effective action a user can take is to replace a ten-year old refrigerator with a new model and inform the user that new refrigerator will pay for itself in energy savings in 18 months. The expert systems may further be improved by receiving feedback about which suggestions users are actually implemented by users. With this additional feedback, an expert system can favor recommendations that are more likely to be implemented by users. Additionally, users may be informed about the best deals for purchasing devices and directed to a local or online merchant.

In addition, by collecting data about many different versions of devices, information about actual energy usage and efficiency of devices may be determined, and this information may be more accurate than information provided by manufacturers. Versions of devices may then be ranked according to efficiency and this information provided to the user to help the user select a new device.

In addition to informing users about their own energy usage, they may also be informed about how their energy usage compares to specific people (e.g., friends and family) or other people in similar situations (e.g., people in the same geographical location with similar sized houses). By learning about their own energy usage with respect to others, users may be more motivated to reduce their energy usage. In some implementations, time-specific reminders could be sent to users. For example, in July, users can be reminded or informed that they used more energy than their friends and family, and providing recommendations for reducing air conditioner usage.

In some implementations, social networks and social networking applications may be used. Users may post on social networks information about their energy usage, how energy usage has changed over time, and the effectiveness of specific changes in reducing energy usage. The user's posts may be backed by specific data obtained from a power monitor. Energy usage may be promoted by creating games based on energy usage, competitions, and featuring creative approaches for saving energy. Information about how a variety of users have taken actions to reduce energy usage and the resultant energy savings may also be used to improve, for example, the expert system for providing recommendations for saving energy.

Understanding electrical energy usage of devices in the home may also allow users to conserve other resources. For example, understanding the electrical usage of a furnace, boiler, dryer, stove, or hot water heater may allow the determination of water, oil, or gas used by these devices. For example, where the manufacturer and version of these devices may be determined by their electrical properties, models may be created that determine the amount of water, gas, or oil used by these devices in addition to their electrical usage. Other data may be used determine the amount of water, gas, or oil used by devices, including but not limited to information obtained from water, gas, or oil bills (e.g., manually entered by a user or obtained automatically) or usage information obtained from other sources, such as the utility company (e.g., using web scraping techniques, using an API provided by a utility company to obtain information from a server of the utility company, or obtaining information from a smart meter for water, gas, or oil).

The techniques described herein for disaggregating electrical signals may further be applied to disaggregating other types of signals. Sensors may be placed on water, oil, and gas inlets. By processing a gas signal, for example, the gas usage by a stove, furnace, and hot water heater may be determined by using models and search techniques described above. Disaggregation of water, oil, and gas signals may also be performed in conjunction with disaggregation of electrical signals as joint disaggregation may perform better than individual disaggregations.

In some implementations, power monitor 120 may be able to interact with and/or control other devices in the house. An increasing number of devices in a house are connected to a network. Where these connected devices have an API, and power monitor 120 can connect to them, power monitor 120 can control them for increased energy savings. For example, using expert systems, energy saving strategies may be determined, and power monitor 120 can control a thermostat, lights, or other devices to directly implement these energy saving strategies.

Understanding the operation of specific devices in the home may also allow for the automatic identification of devices that need maintenance, are broken, or are likely to break down in the near future. As components of devices wear out or break, the electrical properties of the components may change. In some implementations, these changes may be detected using models, such as transition models. For example, as the pump of a dishwasher deteriorates, the electrical properties may change in a predictable way. In some implementations, transition models may be created for the various stages in the lifetime of the dishwasher pump. As the dishwasher ages, a transition models for an old and worn out pump may provide a better match than the transition model for a new pump. When this happens, a notification may be sent to the user that the pump is likely to fail in the near future. A user may additionally be informed that routine maintenance should be performed to improve the energy efficiency of a device (e.g., that a furnace needs to be cleaned or a filter needs to be replaced on an HVAC system), that routine maintenance should be performed to prevent a device from breaking down, or that the dishwasher isn't working because the water pump broke.

In some implementations, fault models may be specifically created to detect known types of faults for devices or to detect known precursors for known types of faults. For specific devices or for classes of devices, the top faults or failure modes may be determined (e.g., by speaking to experts or collecting data). For each of these potential faults, electrical signals and events may be collected for the time period leading up to the fault, during the fault, and after the fault. This data may then be used to create one or models for fault detection. In some implementations, one model may indicate that a fault is likely to happen soon, another model may indicate that a fault is happening now, and another model may indicate that the fault has already happened. For example, a dishwasher may have known faults or failure modes, such as a capacitor in a motor failing or a bearing in a motor failing. Models can be created for these faults and applied by power monitor 120 to detect them and inform the user of likely reasons why the dishwasher is not working.

Understanding the operation of devices in the home also allows users to monitor activity in the home for informational purposes, including when they are away, such as at work or on vacation. Users can be provided with periodic reports (e.g., weekly) regarding uses of various devices. For example, a user may be informed that the television was watched for 30 hours in the past week, but the treadmill was only used for 20 minutes. For monitoring purposes, certain activities in the house may have repetitive patterns and models may be constructed to process sequences of device events to determine what activities are occurring. For example, when a house cleaner comes to clean the house, the sequence of device usage may be similar on each occasion. When this pattern is detected, a notification may be sent to inform a user when the house cleaners arrive and depart. In another example, use of the television by children may be detected and recorded, and the parents can be sent a notification indicating how much television the children watched each day. Notifications may be sent out for other conditions that may be dangerous or undesirable. For example, a notification may be sent out that the oven was left on or that the garage door was not closed after going to work. For senior citizens, patterns may be detected corresponding to emergencies or situations where help is needed, and notifications may be sent out to friends and family to provide assistance. When away on vacation, patterns may be detected that indicate that someone may be breaking into your home. These notifications (and any other notifications referred to herein) may be sent to any device, including but not limited to user device 150, and may be sent using email, text message, an application notification, or any other communication medium.

A user may desire to receive notifications for particular events that occur in a home (herein called notification events), including, for example, that a device is in a state for a long time (e.g., an oven being on or a refrigerator door being left open), that a device is in a state during a time of day when the device is expected to be in another state (e.g., that lights are on at two in the morning), that a device is in a state when no one is home (e.g., the air conditioner is on or the garage door is open while everyone is at work), that a device has changed state or completed an operation (e.g., the washer has finished washing clothes or the television has turned on), that a person has arrived or departed (e.g., kids return home from school or housecleaners enter), or that a device needs maintenance or repair (e.g., the water pump of the dishwasher broke). Notification events may be based on any combination of the above. Notification events that may be recognized may include a preconfigured set of notification events, notification events learned by monitoring the status of devices in the home, or notification events specified by a user.

A user may specify various settings for notification events. For example the user may turn on or off specific notification events and may specify parameters (such as an amount of time the hair straightener must be on before sending a notification). A user may set thresholds for triggering notifications. For example, determining whether an event has occurred may involve computing a notification score or a notification confidence level and only sending the notification if the score or confidence level exceeds a threshold. For example, a user may set a higher threshold for less important notification events (e.g., that the television has been left on) and a lower threshold for more important events (e.g., that an appliance is operating in a dangerous state or that the house is on fire).

To determine whether a notification event has occurred, notification event models may be used. Any appropriate classification techniques may be used for notification event models. Classifiers may include, but are not limited to, neural networks, self-organizing maps, support vector machines, decision trees, linear and non-linear regression, random forests, and Gaussian mixture models. These classifiers may be trained with labeled data to generate the notification event models. For example, a user may indicate a time or a period of time that a notification event occurred (such as days and times house cleaners came), and stored information (e.g., electrical signals or device state changes) may be retrieved and used to train a notification event model for that notification event. Such notification event models may be house specific or house independent.

In some implementations, directed graphs may be used for notification event models, similar to their use in connection with device models as described above. For example, one directed graph may be used to model the operation of a refrigerator while the door is closed and another directed graph may be used to model the operation of the refrigerator while the door is open (e.g., the compressor is operating more frequently). In some implementations, a timer may be used for a notification event model. The timer may be initiated when a device enters a particular state (e.g., a hair straightener being turned on) and the timer reaching a threshold may cause the event to occur. In some implementations, a decision tree may be used for a notification event model. Inputs to the decision tree may include any of the information described above including the time of day, presence of people in the house, and the states of devices. In some implementations, neural networks may be used for notification event models. Any of the information described herein, including the states and state changes of devices may be input to a neural network and the output of the neural network may indicate that a notification event occurred. Notification event models are not limited to these particular models, and any combination of models may be used for a notification event model.

Default notification event models may be provided for a user. For example, a user may be able to access a list of available notification event models and select the notification events he or she would like to receive. Individual notification event models may be applied to classes of devices (e.g., a notification event model that indicates when a refrigerator door has been left open for class or make of refrigerator), may apply to a version of a device (e.g., a notification event model that indicates when a refrigerator door has been left open for a specific make and version of a refrigerator), or may apply to a specific device (e.g., a model specifically for the refrigerator in a particular house).

Notification event models may be learned using data from a power monitor in a house. For example, a user can indicate that a notification event occurred at a time or over a period of time in a data. Alternatively, a user may specifically cause the event to occur (e.g., by leaving the refrigerator door open). The power monitor data (e.g., electrical events, features, and device events) from this time may be used to train an appropriate model to recognize the event in the future. The type of model to use (e.g., a decision tree versus a neural network) may be specified manually or automatically. For automatic model selection, each of the available model types may be trained with the available training data, and the model that performs the best may be used as the notification event model. Output from multiple models may be used to confirm a notification event, such as using a second model to confirm an event where the confidence level of the primary model is below a threshold value.

Additionally, a user may manually create notification event models. For example, a user interface, application programming interface, or programming language may be provided to allow the user to specify that a certain combination of device states or state changes (perhaps in combination with other information such as a time of day or whether people are present) should be a notification event and create a corresponding notification event model.

Notification event models may be evaluated continuously as the power monitor processes electrical signals. In some implementations, notification event models may be combined with the search graph of FIG. 5, and in some implementations the notification event models may be evaluated separately but simultaneously with the evaluation of the search graph of FIG. 5. For example, a notification event model that indicates that a refrigerator door has been left open may be implemented as a directed graph and combined with a search graph. In another example, a notification event model that indicates that a hair straightener has been left on for a period of time may be implemented using a timer and be evaluated separately but in parallel with the search graph.

Notification events may be determined using any combination of computers described above. For example, in some implementations, power monitor 120 may perform the processing to determine whether a notification event has occurred. In some implementations, power monitor 120 may provide information to another device (e.g., server 140, API server 610, or monitor bridge 620) for determining whether a notification event has occurred.

Notification event models may use any available data as inputs, including but not limited to the electrical signal, electrical events, and device events. Some notification events may be based on where one or more people are located. For example, some notification events may be triggered on no one being home, on a particular person being home or not, or a particular person being in another location (such as at work). Any suitable techniques may be used to obtain the location of people for notification events, including wirelessly detecting mobile devices or a car of a user (e.g., detecting Bluetooth or wifi radios), having a mobile device of a user transmit the location of the device to a computer where it may be used for determining notification events, or associating certain events (including notification events) with the presence of a user (e.g., determining that Jane is at home if the hair dryer in Jane's bathroom is in use).

Notification event models may use data obtained from personal area networks, local area networks, or wide area networks. For example power monitor 120 may implement a variety of network protocols, such as Bluetooth, Wi-Fi, and cellular communications. Power monitor 120 may be able to receive information from other devices in the house, such as smart devices or Internet-of-things devices. For example, power monitor 120 may be able to connect to a Nest® thermostat to obtain the temperature of the house or a variety of other sensors to detect, for example, light, sound, and humidity. Power monitor 120 may be able to receive information over the Internet using a variety of APIs. For example, power monitor 120 may be able to access weather data, weather forecasts, stock market quotes, or any other relevant data. Any of this data received from other devices in the house or from the Internet may be used as inputs to a notification event model.

A notification event model may provide an output that may indicate whether the corresponding notification event occurred. In some implementations, the output may be a simple "yes" or "no" (or other Boolean indicator) and in some implementations the output may be a score (e.g., a value from 1 to 10, a floating point value, or a likelihood). Depending on the value of the output and the user preferences, a notification may be sent. For example, a user may desire a notification when the value is "yes" or exceeds a threshold.

A notification may be sent to the user immediately or at a later time. When a notification event model indicates that a notification event has occurred, a priority for the notification event may also be determined. The priority of the notification may depend on the notification event itself. For example, the refrigerator door being left open may be a low priority event and the oven being left on may be a high priority event. The priority of a notification event may be determined using any of the data described herein. For example, a notification event may exist for the furnace shutting off and the temperature of the house may be factor in determining the priority of the event. In some implementations, higher priority events may be sent immediately and lower priority events may be batched together and sent at the end of the day, week, or month.

The timing of when to send a notification event may also depend on the time at which the notification event occurs. For example, if the dishwasher has finished at two in the morning, it may be preferred to send the notification after people have woken up rather than immediately. If the garage door opens at two in the morning, however, it may be preferred to send the notification immediately. The timing of a notification event may also be determined by the presence and activities of people. Some notifications may be transmitted when people wake up in the morning (e.g., by a first use of a mobile device in the morning or a motion sensor), when people are about to exit the house (e.g., by using door or motion sensors), or when people arrive home (e.g., by the presence or mobile devices or use of door or motion sensors).

Whether a notification event has occurred may also be determined using confidence levels or other parameters of previous processing. For example, a transition model or a device model may indicate that a device is in a particular state or has changed to a particular state with a confidence level. With a higher confidence level, it may be more likely that the transition or device model has output a correct answer and with a lower confidence level it may be more likely that the transition or device model has made an error. The confidence level of an output of a transition or device model may be determined based on the input data (e.g., a noise level or a fit of the features to the model) or it may be based on an accuracy of the model itself. For example, transition or device models for some devices may be known to produce more or less accurate results than transition or device models for other devices.

In some implementations, models may be trained for determining a confidence level of an output of a notification event model. For example, a notification event model may be applied to a wide variety of data sets where some of the data corresponds to a true notification event and some of the data corresponds to no notification event or a different type of notification event. By comparing different error types (e.g., false alarms and misses) a model can be created to determine a confidence level of the output of a notification event model.

The notification may be sent to the user in a variety of ways and according to the preferences of the user. For example, a user may receive events through phone calls (e.g., describing the event with recorded audio or text to speech), through text messages (e.g., email or SMS), via an interface of a home automation device in the house (e.g., a NEST® thermostat or security system controller), via an interface of an appliance, or by accessing a web page or an application such as an application for a mobile device. A web page or application may have an event log or event history that presents information about a sequence of events, such as the event and where or when the event occurred.

In some implementations, information obtained from power monitors may be shared with third parties (either anonymized or with the users' permission). For example, electric utilities may benefit from understanding the types of power consumed by users. Where many users are installing a new type of device (e.g., a dishwasher) that has different load properties (e.g., inductive instead of resistive), then the electric utility may be able to improve its services.

Illustrative Processes

In some implementations, information about electricity usage of devices may be transmitted to a user device as described in the following clauses and illustrated by FIG. 11.

1. A method for providing information about a plurality of devices in a building, the method comprising:
    accepting from a user device a first network connection;
    receiving an identifier from the user device;
    retrieving first information from a data store using the identifier, wherein the first information comprises historical information about a first device and a second device;
    transmitting the first information to the user device;
    receiving second information from a power monitoring device, wherein the second information comprises real-time information about power consumption of a third device at a first time and about power consumption of a fourth device at the first time; and
    transmitting the second information to the user device.

2. The method of clause 1, further comprising:
    using at least one of the first information and the second information to determine that a device needs maintenance or that a part of the device needs to be replaced;
    transmit information to the user device indicating that the device needs maintenance or that the part of the device needs to be replaced.

3. The method of clause 1, further comprising:
    using at least one of the first information and the second information to determine a recommendation for conserving energy;
    transmit the recommendation to the user device.

4. The method of clause 3, wherein using at least one of the first information and the second information to determine a recommendation for conserving energy comprises using an expert system.

5. The method of clause 1, further comprising:
    accepting from the user device a second network connection;
    wherein transmitting the first information to the user device comprises transmitting the first information using the first network connection; and
    wherein transmitting the second information to the user device comprises transmitting the second information using the second network connection.

6. The method of clause 1, wherein the first information comprises information about a state change of the first device.

7. The method of clause 1, wherein transmitting the second information to the user device comprises transmitting the information without significant delay from the first time.

8. A system for providing information about a plurality of devices, the system comprising:
    at least one server computer comprising at least one processor and at least one memory, the at least one server computer configured to:
        accept from a first client device a first network connection;
        receive an identifier from the first client device;
        retrieve first information from a data store using the identifier,
        wherein the first information comprises historical information about a first device;
        transmit the first information to the first client device;
        receive second information from a second client device, wherein the second information comprises real-time information about power consumption of a second device at a first time; and
        transmit the second information to the first client device.

9. The system of clause 8, wherein the at least one server computer is further configured to:
    use at least one of the first information and the second information to determine information about a comparison between power usage by a first building and by a second building or between the first building over a first time period and the first building over a second time period;
    transmit the information about the comparison to the user device.

10. The system of clause 8, wherein the at least one server computer is further configured to:

use at least one of the first information and the second information to determine the occurrence of an event in a building comprising the plurality of devices;

transmit the information about the event.

11. The system of clause 10, wherein the at least one server computer is further configured to transmit the information about the event as a notification to a device.

12. The system of clause 8, wherein the at least one server computer comprises a first server computer and a second server computer, the first information is transmitted by the first sever computer, and the second information is transmitted by the second server computer.

13. The system of clause 8, wherein at least a portion of the first information was previously received from the second client device.

14. The system of clause 8, wherein the second information is transmitted to the first client device without significant delay from the first time.

15. A non-transitory computer-readable medium comprising computer executable instructions that, when executed, cause at least one processor to perform actions comprising:

establishing a first network connection using a network interface;

establishing a second network connection using the network interface;

receiving first information via the first network connection, wherein the first information comprises historical information about a first device; and receiving second information via the second network connection, wherein the second information comprises real-time information about power consumption of a second device at a first time.

16. The computer-readable medium of clause 15, wherein the instructions further cause the at least one processor to perform actions comprising presenting the first information and the second information to a user.

17. The computer-readable medium of clause 15, wherein the first network connection is with a first server computer and the second network connection is with a second server computer.

18. The computer-readable medium of clause 15, wherein the first information comprises information about a state change of the first device.

19. The computer-readable medium of clause 15, wherein the second information is received without significant delay from the first time.

20. The computer-readable medium of clause 15, wherein the instructions further cause the at least one processor to perform actions comprising:

receiving a recommendation for conserving energy; and
presenting the recommendation to a user.

21. The computer-readable medium of clause 15, wherein the instructions further cause the at least one processor to perform actions comprising:

receiving third information via the first network connection, wherein the third information comprises historical information about the second device; and receiving fourth information via the second network connection, wherein fourth information comprises real-time information about power consumption of the first device at the first time.

Figure 11:
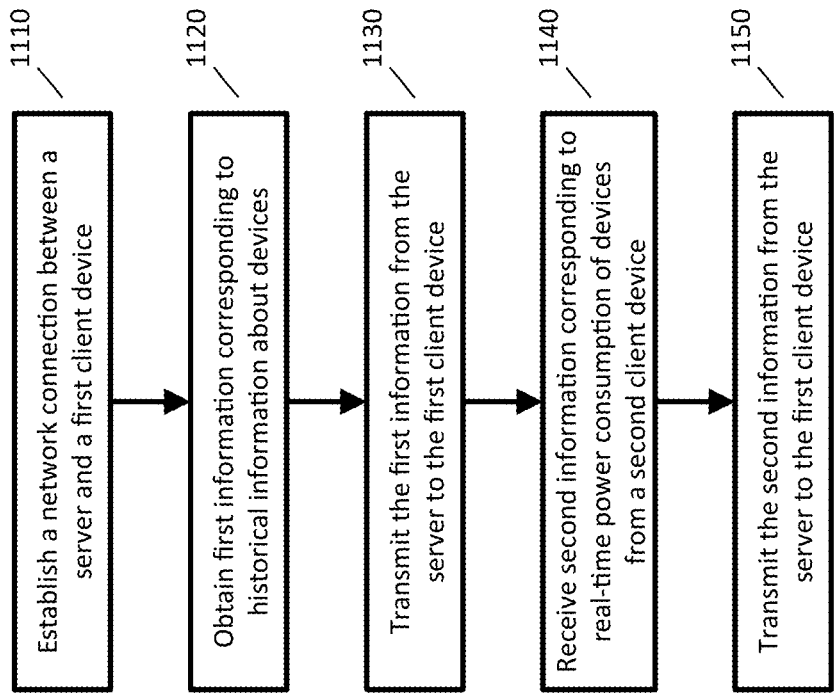
FIG. 11 is a flowchart showing an example implementation for providing historical and real-time information about devices.

FIG. 11 is a flowchart showing an example implementation for providing historical and real-time information about devices. Note that the ordering of the steps of FIG. 11 (as well as the steps for the other flowcharts described below) are exemplary and that other orders are possible. At step 1110, a network connection is created between a server and a first client device. The server may be, for example, server 140, API server 610, or monitor bridge 620. The first client device may be, for example, user device 150. The network connection may be initiated by either the server or first client device. The first client device may transmit an identifier to the server, such as a user ID, a house ID, or a device ID. At step 1120, the server obtains historical information about devices, such as devices in a house or building associated with the first client device. The historical information may be retrieved from a database using the identifier. The historical information may include any information about past operation of devices, for example, historical power usage by a building or individual devices in the building, device events of devices in the building, or any other information that may be derived from the processed electrical signals as described above. In some implementations, other information may be transmitted to the first client device, as described above, such as recommendations for conserving power, maintenance of devices, events occurring in the building, and comparisons of power usage. A comparison of power usage may be between two buildings (e.g., two homes) using information from a first power monitor in a first building and information from a second power monitor in a second building. A comparison may also be for a single building over two time periods, such as a first month and a second month. At step 1130, the historical information is transmitted to the first client device. The first client device may present the historical information to a user. At step 1140, the server or another server (such as monitor bridge 620) may receive information about real-time power consumption of devices from a second client device. The second client device may be power monitor 120. At step 1150, the real-time information about power consumption of devices is transmitted to the first client device. This transmission may be performed using the same network connection as step 1130 or a different network connection. The historical information and the real-time information may be regarding the same set of devices, two completely different sets of devices, or overlapping sets of devices. For example, the historical information may be about a refrigerator and a furnace, and the real-time information may be about a light bulb and the refrigerator. The network connection may be a continuous connection in that it is maintained even when not in use.

Figure 12:
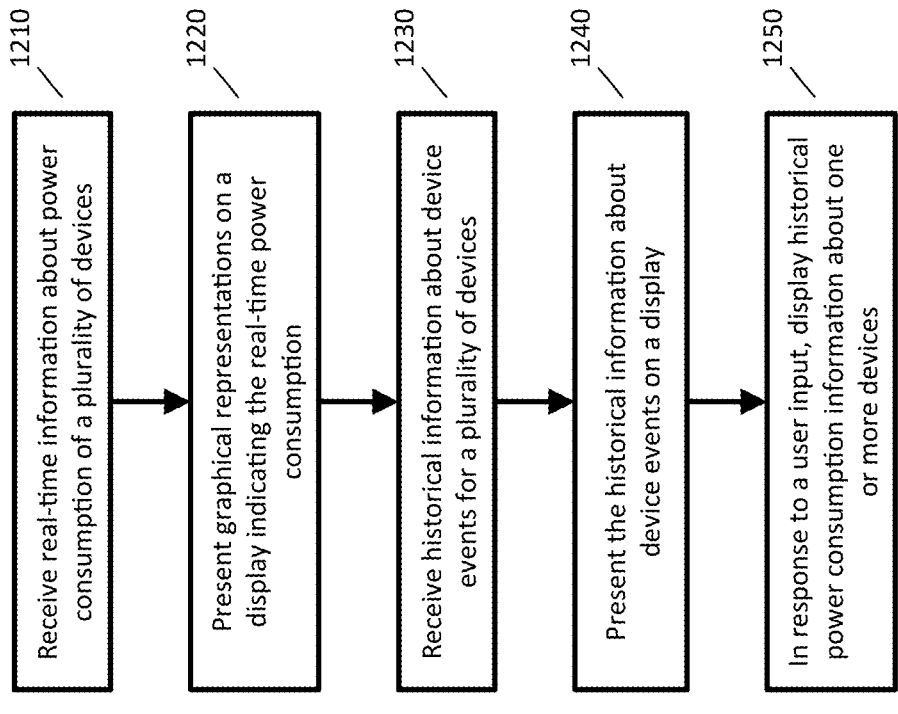
FIG. 12 is a flowchart showing an example implementation of presenting historical and real-time information about devices to a user.

In some implementations, information about electricity usage of devices may be presented to a user as described in the following clauses and as illustrated in FIG. 12.

1. A method for presenting on a user device information about electricity usage of a plurality of devices, the method comprising:

receiving first power consumption information corresponding to power consumption of a first device and second power consumption information corresponding to power consumption of a second device, wherein the first power consumption information and the second power consumption information correspond to power consumption at substantially a first time;

presenting the first power information and second power information on a first portion of a display of the user device using a first graphical representation corresponding to the first power consumption information and a second graphical representation corresponding to the second power consumption information;

receiving first device event information corresponding to a change in device state for a third device and second device event information corresponding to a change in device state for a fourth device; and presenting the first device event information and the second device event information on a second portion of the display of the device.

2. The method of clause 1, wherein the first graphical representation includes a name of the first device, the first graphical representation includes a circle, and an area of the circle corresponds to the first power information.

3. The method of clause 1, wherein the first power consumption information corresponds to an amount of energy consumed by the first device during a first time interval, a peak power consumption during the first time interval, or an average power consumption during the first time interval.

4. The method of clause 1, further comprising:
receiving third power consumption information corresponding to power consumption of the first device and fourth power consumption information corresponding to power consumption of the second device, wherein the third power consumption information and the fourth power consumption information correspond to power consumption at substantially a second time;
modifying the first graphical representation to correspond to the third power consumption information; and
modifying the second graphical representation to correspond to the fourth power consumption information.

5. The method of clause 1, wherein the first power consumption information is received without significant delay from the first time.

6. The method of clause 1, wherein presenting the first device event information and the second device event information comprises presenting the first device event information and the second device event information in chronological order.

7. The method of clause 1, wherein the first device event information comprises a first time and a name of the third device.

8. The method of clause 1, wherein the first device event information comprises at least one of an indication that the first device was turned on, an indication that the first device was turned off, a number of times the first device was used over a first time period, an indication that the first device has completed a task, an amount of time the first device has been on, a suggested action for a user to conserve energy with the first device, an indication that the first device needs maintenance, an indication that the first device should be replaced, or an indication that a component of the first device is broken.

9. The method of clause 1, further comprising:
receiving third power consumption information corresponding to power consumption of the third device and fourth power consumption information corresponding to power consumption of the fourth device, wherein the third power consumption information and the fourth power consumption information correspond to power consumption at substantially a first time; and
receiving third device event information corresponding to a change in device state for the first device and fourth device event information corresponding to a change in device state for the second device.

10. A user device for presenting information about electricity usage of a plurality of devices, the device comprising:
a network interface;
a display;
at least one processor;
at least one memory storing processor-executable instructions that, when executed by the at least one processor, cause the at least one processor to:
receive, via the network interface, first power consumption information corresponding to power consumption of a first device, wherein the first power consumption information corresponds to power consumption at substantially a first time;
present the first power consumption information on the display using a first graphical representation corresponding to the first power consumption information;
receive, via the network interface, second power consumption information corresponding to power consumption of the first device, wherein the second power consumption information corresponds to power consumption at substantially a second time;
modify the first graphical representation to correspond to the second power consumption information.

11. The user device of clause 10, wherein the first power consumption information and the second power information are received without significant delay.

12. The user device of clause 10, wherein the first power consumption information corresponds to a first time period of an electrical signal, the second power consumption information corresponds to a second time period of the electrical signal, and wherein the second time period immediately follows the first time period.

13. The user device of clause 10, wherein the first power consumption information is presented within one second of the first time.

14. The user device of clause 10, wherein the first graphical representation includes a circle, and wherein the area of the circle corresponds to the first power consumption information.

15. The user device of clause 10, wherein the at least one memory storing processor-executable instructions that, when executed by the at least one processor, further cause the at least one processor to:
receive, via the network interface, a first number of watts consumed by a plurality of devices at substantially the first time;
present the first number of watts on the display;
receive, via the network interface, a second number of watts consumed by the plurality of devices at substantially the second time; and
present the second number of watts on the display.

16. A non-transitory computer-readable medium comprising computer executable instructions that, when executed, cause one or more processors to perform actions comprising:
receiving first power consumption information corresponding to power consumption of a first device, wherein the first power consumption information corresponds to power consumption at substantially a first time;
presenting the first power consumption information on a display using a first graphical representation corresponding to the first power consumption information;
receiving a first user input; and
presenting, in response to receiving the first user input, first historical power consumption information corresponding to a first time period and second historical power consumption information corresponding to a second time period.

17. The non-transitory computer-readable medium of clause 16, wherein the first user input comprises requesting historical power consumption information about the first device or a plurality of devices.

18. The non-transitory computer-readable medium of clause 16, wherein presenting first historical power consumption information corresponding to a first time period and second historical power consumption information corresponding to a second time period comprises presenting at least one of a bar chart or a line chart.

19. The non-transitory computer-readable medium of clause 16, wherein the first time period corresponds to a day, a week, a month, or a year.

20. The non-transitory computer-readable medium of clause 16, the actions further comprising:

receiving second power consumption information corresponding to power consumption of the first device, wherein the second power consumption information corresponds to power consumption at substantially a second time;

modifying the first graphical representation to correspond to the second power consumption information.

21. The non-transitory computer-readable medium of clause 16, the actions further comprising:

receiving a second user input; and presenting, in response to receiving the second user input, third historical power consumption information corresponding to a proportion of power used by a first device and fourth historical power consumption information corresponding to a proportion of power used by a second device.

FIG. 12 is a flowchart showing an example implementation of presenting historical and real-time information about devices to a user, which may be performed, for example, by user device 150. At step 1210, real-time information about power consumption of a plurality of devices is received. For example, this information may be received from power monitor 120 via monitor bridge 620. The real-time information may be received at regular intervals, such as every second or every electrical cycle and may correspond to a number of watts consumed over a time interval. The real-time information about power consumption may correspond substantially to a first time. For example, the information may relate to energy used over a time period, average power over a time period, or peak power over a time period. The time of the information may correspond approximately (subject to small errors and uncertainties in timing) to the beginning, middle, or end of the time period, or to a range of time. At step 1220, graphical representations are displayed to indicate to a user the power consumption information. For example, graphical representations, such as circles, may be displayed, wherein each circle corresponds to a device, and the circles may be updated in real time. At step 1230, historical information about device events is received. The devices corresponding to the device events may be the same devices or some of the same devices as step 1210 or may be different devices, and device events may include any information described above. At step 1240, the information about device events is presented on a display, such as by presenting a chronological list of device events. At step 1250, a user may provide a user input, such as touching/clicking on a graphical element or device event, to obtain historical information about power consumption. For example, a bar chart may be presented indicating power consumption of one or more devices over a time period or a pie chart may be presented indicating relative power consumption of one or more devices.

In some implementations, information about electricity usage of devices may be transmitted to a user device using a network architecture as described in the following clauses and illustrated in FIG. 13.

1. A method for providing information about a plurality of devices in a building, the method performed by a power monitoring device in the building and comprising:

establishing a first network connection between the power monitoring device and a first server computer, wherein the first network connection is maintained when not in use;

determining that a first device event occurred using an electrical signal, wherein the electrical signal comprises at least one of a voltage signal, a current signal, a power signal, or a reactive power signal;

transmitting information about the first device event to a second server computer using a second network connection, wherein the second network connection is closed after transmitting the information about the first device event;

receiving a request, from the first server via the first network connection, to provide real-time information about power consumption of the plurality of devices in the building;

determining information about power consumption of the plurality of devices at a first time;

transmitting, to the first server via the first network connection, the information about power consumption of the plurality of devices;

receiving a request, from the first server via the first network connection, to stop providing real-time information about power consumption of the plurality devices in the building; and maintaining the first network connection with the first server.

2. The method of clause 1, wherein the first device event corresponds to a device of the plurality of devices transitioning from an on state to an off state or transitioning from an off state to an on state.

3. The method of clause 1, wherein the electrical signal is obtained using at least one of a voltage sensor or a current sensor.

4. The method of clause 1, wherein the information about power consumption of the plurality of devices at a first time comprises an amount of energy consumed by the first device over a time period.

5. The method of clause 1, further comprising:

receiving a request from the first server computer to disconnect and connect to a third server;

disconnecting the first connection to the first server; and establishing a third network connection between the power monitoring device and the third server computer, wherein the third network connection is maintained when not in use.

6. The method of clause 1, wherein transmitting information about power consumption of the plurality of devices comprises transmitting the information without significant delay from the first time.

7. The method of clause 1, wherein:

determining that a first device event occurred comprises processing electrical events from the electrical signal using a first processing mode; and determining information about power consumption of the plurality of devices at a first time comprises processing electrical events from the electrical signal using a second processing mode.

8. A system for providing information about a plurality of devices in a building, the system comprising:

a first server computer comprising at least one processor and at least one memory, the first server computer configured to:

accept, from a first client computer, a first network connection, wherein the first network connection is maintained when not in use, accept, from a second client computer, a second network connection;

transmit, to the first client computer, a request to provide real-time information about power consumption of the plurality of devices in the building, receive, from the first client computer, first information, where in the first information corresponds to power consumption of the plurality of devices at a first time, transmit, to a second client computer, the first information, transmit, to the first client computer, a request to stop providing real-time information, close the second network connection, and maintain the first network connection.

9. The system of clause 8, further comprising a second server computer comprising at least one processor and at least one memory, the second server computer configured to:

accept, from the first client computer, a third network connection, receive, from the first client computer, second information, and close the third network connection.

10. The system of clause 8, wherein the first server computer is further configured to modify the first information before transmitting to the second client computer.

11. The system of clause 8, wherein the first client computer comprises a power monitor that receives electrical signals from an electrical panel, and the second client computer is a user device.

12. The system of clause 8, further comprising a third server computer, wherein the first server computer is further configured to transmit, to the first client computer, an instruction to disconnect from the first server computer and connect to the third server computer.

13. The system of clause 8, wherein the first server is further configured to transmit, to the second client computer, the first information without significant delay from the first time.

14. A non-transitory computer-readable medium comprising computer executable instructions that, when executed, cause at least one processor to perform actions comprising:

establishing a first network connection between the device and a first server computer, wherein the first network connection is maintained when not in use;

receiving a request, from the first server via the first network connection, to provide real-time information about power consumption of the plurality of devices in the building;

determining information about power consumption of the plurality of devices at a first time;

transmitting, to the first server via the first network connection, the information about power consumption of the plurality of devices;

receiving a request, from the first server via the first network connection, to stop providing real-time information about power consumption of the plurality of devices in the building; and maintain the first network connection with the first server.

15. The computer-readable medium of clause 14, wherein the processor-executable instructions further cause the at least one processor to perform actions comprising:

determining that a first device event occurred using an electrical signal;

establishing a second network connection with a second server computer;

transmitting information about the first device event to the second server computer using the second network connection; and closing the second network connection.

16. The computer-readable medium of clause 14, wherein the electrical signal is obtained using at least one of a voltage sensor or a current sensor.

17. The computer-readable medium of clause 14, wherein the information about power consumption of the plurality of devices at a first time comprises an amount of energy consumed by the first device over a time period.

18. The computer-readable medium of clause 14, wherein the processor-executable instructions further cause the at least one processor to perform actions comprising:

receiving a request from the first server computer to disconnect and connect to a third server computer;

disconnecting the first network connection to the first server; and establishing a third network connection between the device and the third server computer, wherein the third network connection is maintained when not in use.

19. The computer-readable medium of clause 14, wherein the processor-executable instructions cause the at least one processor to perform actions comprising transmitting information about power consumption of the plurality of devices without significant delay from the first time.

20. The computer-readable medium of clause 15, wherein the processor-executable instructions further cause the at least one processor to perform actions comprising:

determining that a first device event occurred comprises processing electrical events from an electrical signal using a first processing mode; and determining information about power consumption of the plurality of devices at a first time comprises processing electrical events from the electrical signal using a second processing mode.

FIG. 13 is a flowchart showing an example implementation of an architecture for providing real-time information about devices. At step 1310, a network connection is established between a client device and server computer. For example, between power monitor 120 and server 140 or monitor bridge 620. The first network connection may be a continuous network connection in that it is maintained when not in use. At step 1320, a second network connection is established between a client device and a second server computer. For example, between power monitor 120 and server 140 or API server 610. At step 1330, the client device may determine information about device events, such as any of the device event information discussed above, and transmit this information to the second server using the second network connection. As described above, the device event information may be sent periodically, and the second network connection may be terminated after transmitting the device event information. At step 1340, the first server may transmit a request to the client device to provide real-time information, such as real-time information about power consumption by a plurality of devices or real-time information about device events. At step 1350, the client device may transmit the requested real-time information to the first server. At step 1360, the first server may transmit a request to the client device to stop transmitting real-time information. At step 1370, the client device may stop transmitting real-time information, but maintain the first network connection with the first server as described above.

In some implementations, device events may be determined as described in the following clauses and illustrated in FIG. 14.

1. A method for determining state changes of devices in a building, the method performed by a monitoring device in the building, the method comprising:

receiving an electrical signal, wherein the electrical signal corresponds to electrical usage of a plurality of devices, and wherein the electrical signal comprises at least one of voltage signal, a current signal, a power signal, or a reactive power signal;

identifying an electrical event in the electrical signal, wherein the electrical event corresponds to a first time;

computing a first feature using a first portion of the electrical signal, wherein the first portion comprises the first time;

computing a second feature using a second portion of the electrical signal, wherein the second portion comprises the first time and wherein an end time of the second portion is later than an end time of the first portion;

performing first processing comprising:
computing a first score using the first feature and a model, wherein the model corresponds to one or more devices and a state change of the one or more devices and wherein computing the first score does not use the second feature, and
selecting, using the first score, a first device and a first state change; and performing second processing comprising:
computing a second score using the first feature, the second feature, and the model, and
selecting, using the second score, (i) the first device and the first state change, or (ii) a second device and a second state change.

2. The method of clause 1, wherein identifying the electrical event in the electrical signal comprises computing a first value for a first window of the electrical signal prior to the first time, computing a second value for a second window of the electrical signal after the first time, and comparing the first value to the second value.

3. The method of clause 1, wherein the first feature is computed before the end time of the second portion of the electrical signal.

4. The method of clause 1, wherein:
the first processing further comprises transmitting, to a first server computer, first information about the first device and the first state change; and
the second processing further comprises transmitting, to a second server computer, second information about (i) the first device and the first state change or (ii) the second device and the second state change.

5. The method of clause 1, wherein the first processing further comprises computing the first score using a transition model that corresponds to a state change of an element of the first device and a directed graph describing a plurality of state changes of the first device.

6. The method of clause 1, wherein the first processing further comprises selecting the first device and the first state change by generating a directed graph with a plurality of nodes, wherein a first node of the graph corresponds to the first device and the first state change.

7. The method of clause 4, wherein the first processing further comprises transmitting the first information to the first server without significant delay from the first time.

8. A monitoring device for determining state changes of devices in a building, the device comprising:
at least one processor;
at least one memory storing processor-executable instructions that, when executed by the at least one processor, cause the at least one processor to:
receive an electrical signal, wherein the electrical signal corresponds to electrical usage of a plurality of devices;
identify an electrical event in the electrical signal, wherein the electrical event corresponds to a first time;
compute a first feature using a first portion of the electrical signal, wherein the first portion comprises the first time;
compute a second feature using a second portion of the electrical signal, wherein the second portion comprises the first time and wherein an end time of the second portion is later than an end time of the first portion;
perform first processing comprising:
computing a first score using the first feature, wherein computing the first score does not use the second feature, and
selecting, using the first score, a first device and a first state change; and
perform second processing comprising:
computing a second score using the first feature and the second feature, and
selecting, using the second score, (i) the first device and the first state change, or (ii) a second device and a second state change.

9. The monitoring device of clause 8, wherein the at least one processor identifies the electrical event in the electrical signal by computing a first value for a first window of the electrical signal prior to the first time, computing a second value for a second window of the electrical signal after the first time, and comparing the first value to the second value.

10. The monitoring device of clause 8, wherein the first feature is computed before the end time of the second portion of the electrical signal.

11. The monitoring device of clause 8, wherein:
the first processing further comprises transmitting, to a first server computer, first information about the first device and the first state change; and
the second processing further comprises transmitting, to a second server computer, second information about (i) the first device and the first state change or (ii) the second device and the second state change.

12. The monitoring device of clause 8, wherein the first processing further comprises computing the first score using a transition model that corresponds to a state change of an element of the first device and a directed graph describing a plurality of state changes of the first device.

13. The monitoring device of clause 8, wherein the first processing further comprises selecting the first device and the first state change by generating a directed graph with a plurality of nodes, wherein a first node of the graph corresponds to the first device and the first state change.

14. The monitoring device of clause 11, wherein the first processing further comprises transmitting the first information to the first server without significant delay from the first time.

15. A non-transitory computer-readable medium comprising computer executable instructions that, when executed, cause at least one processor to perform actions comprising:
receiving an electrical signal, wherein the electrical signal corresponds to electrical usage of a plurality of devices;
identifying an electrical event in the electrical signal, wherein the electrical event corresponds to a first time;
computing a first feature using a first portion of the electrical signal, wherein the first portion comprises the first time;
computing a second feature using a second portion of the electrical signal, wherein the second portion comprises the first time and wherein an end time of the second portion is later than an end time of the first portion;
  performing first processing comprising:
    computing a first score using the first feature, wherein computing the first score does not use the second feature, and
    selecting, using the first score, a first device and a first state change; and
  performing second processing comprising:
    computing a second score using the first feature and the second feature, and
    selecting, using the second score, (i) the first device and the first state change, or (ii) a second device and a second state change.

16. The computer-readable medium of clause 15, wherein identifying the electrical event in the electrical signal comprises computing a first value for a first window of the electrical signal prior to the first time, computing a second value for a second window of the electrical signal after the first time, and comparing the first value to the second value.

17. The computer-readable medium of clause 15, wherein the first feature is computed before the end time of the second portion of the electrical signal.

18. The computer-readable medium of clause 15, wherein:
  the first processing further comprises transmitting, to a first server computer, first information about the first device and the first state change; and
  the second processing further comprises transmitting, to a second server computer, second information about (i) the first device and the first state change or (ii) the second device and the second state change.

19. The computer-readable medium of clause 15, wherein the first processing further comprises computing the first score using a transition model that corresponds to a state change of an element of the first device and a directed graph describing a plurality of state changes of the first device.

20. The computer-readable medium of clause 18, wherein the first processing further comprises transmitting the first information to the first server without significant delay from the first time.

21. The computer-readable medium of claim 18, wherein the first information is used to provide real-time information about the first device to a user and the second information is used to provide historical information about the first device or the second device to the user.

FIG. 14 is a flowchart showing an example implementation of determining information about device events, which may be performed by a device such as power monitor 120. At step 1410, an electrical signal is received. For example, the electrical signal may be a power, current, or voltage signal. At step 1420 an electrical event is identified from the electrical signal, for example, by using any of the techniques discussed above. At step 1430, a first feature (or first set of features) is computed using a first portion of the electrical signal that includes the electrical event. At step 1440 a first device and first state change are selected using the first feature and a model and without using the second feature described below. For example, a real-time search process may be used as described above. At step 1450, a second feature (or second set of features) is computed using a second portion of the electrical signal that includes the electrical event. The second portion of the electrical signal may have an end time that is later than an end time of the first portion of the electrical signal, and thus it may not be possible to compute the second feature at the time the first feature is computed (because a needed portion of the electrical signal had not been received at that time). At step 1460, a second device and second state change are selected using the first feature, the second feature, and a model. For example, a historical search process may be used as described above. Selecting the second device and second state change may be more accurate than the selection of the first device and first state change because the second feature may have additional information that is not present in the first feature. At step 1470, information about the first device and first state change and the second device and second state change may be sent to a server. In some implementations, the information about the first device and first state change may be sent to a first server and the information about the second device and second state change may be sent to a second server.

Figure 15:
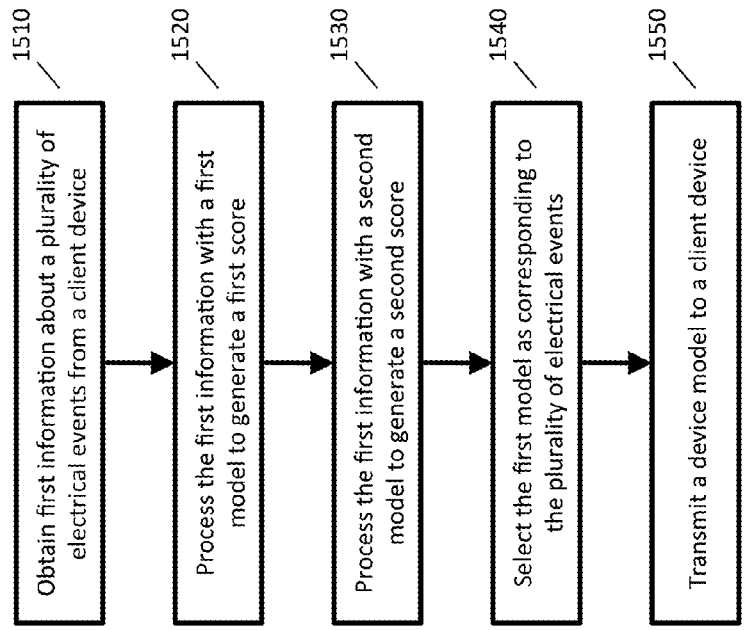
FIG. 15 is a flowchart showing an example implementation of discovering devices in a building.

In some implementations, devices may be discovered as described in the following clauses and as illustrated in FIG. 15.

1. A method for determining information about a device, comprising:
  obtaining first information about plurality of electrical events, wherein the first information comprises a plurality of features for each electrical event;
  processing the first information with a first model to generate a first score, wherein the first model comprises a first plurality of states, and wherein the first model corresponds to a first class of devices;
  processing the first information with a second model to generate a second score, wherein the second model comprises a second plurality of states, and wherein the second model corresponds to a second class of devices;
  selecting the first model as most likely corresponding to the plurality of electrical events.

2. The method of clause 1, wherein processing the first information with the first model comprises:
  determining that a first event matches a first state of the first plurality of states;
  determining that a second event does not match any state of the first plurality of states; and
  determining that a third event matches a second state of the first plurality of states.

3. The method of clause 1, wherein the first information is received from a client device and the second model is transmitted to the client device.

4. The method of clause 1, wherein processing the first information with the first model comprises:
  generating a graph, wherein each node of the graph corresponds an electrical event; and
  selecting a path from graph.

5. The method of clause 4, further comprising:
  identifying a plurality of paths of the graph that correspond to an end state of the first model;
  determining a score for each path of the plurality of paths; and
  wherein selecting a path from the graph comprises selecting a path of the plurality of paths with a highest score.

6. The method of clause 1, further comprising:
  generating second information from the first information by removing information corresponding to an electrical event that matches a state of the second model;
  processing the second information with a third model to generate a third score, wherein the third model comprises a third plurality of states; and
  selecting the third model as most likely corresponding to the second information.

7. The method of clause 1, wherein the first model and the second model are selected based on information provided by a user.

FIG. 15 is a flowchart showing an example implementation of discovering information about devices, which may be performed, for example, by server 140. At step 1510, first information about a plurality of electrical events is obtained. The electrical events may be identified by power monitor 120, or may be determined by server 140 using electrical signals received from power monitor 120. The first information may include features as described above. At step 1520, the first information is processed by a first model (such as a device discovery model or a device model as described above) to generate a first score. The processing of the first information with the first model may use any of the techniques described above, such as generating a discovery graph using device discovery models. The first model may correspond to, for example a class of devices, a class of devices by a manufacturer, or a version of a device by a manufacturer. At step 1530, the first information is also processed by a second model (which may have any of the characteristics of the first model) to generate a second score. The first information may further be processed by any number of models to generate additional scores. The models used may correspond to all available models or may be selected according to information provided by a user. For example, if a user indicates that he or she has a Kenmore dishwasher, then all models relating to Kenmore dishwashers may be used. At step 1540, a model is selected. For example, a model may be selected based on the model that produced a highest score. At step 1550, a device model is transmitted to a client device, wherein the device model corresponds to the same device or class of devices as the selected model. The device model transmitted to the client device may be the same as or different from the selected model. For example, the selected model may be better suited to discovering a device and a device model may be better suited for identifying transitions of a device using electrical events. The first information may include information about multiple devices, and the above process may be repeated to identify additional devices. For example, second information may be created from the first information where information about the previously identified device may be removed. This second information may then be processed to identify a second device.

Figure 16:
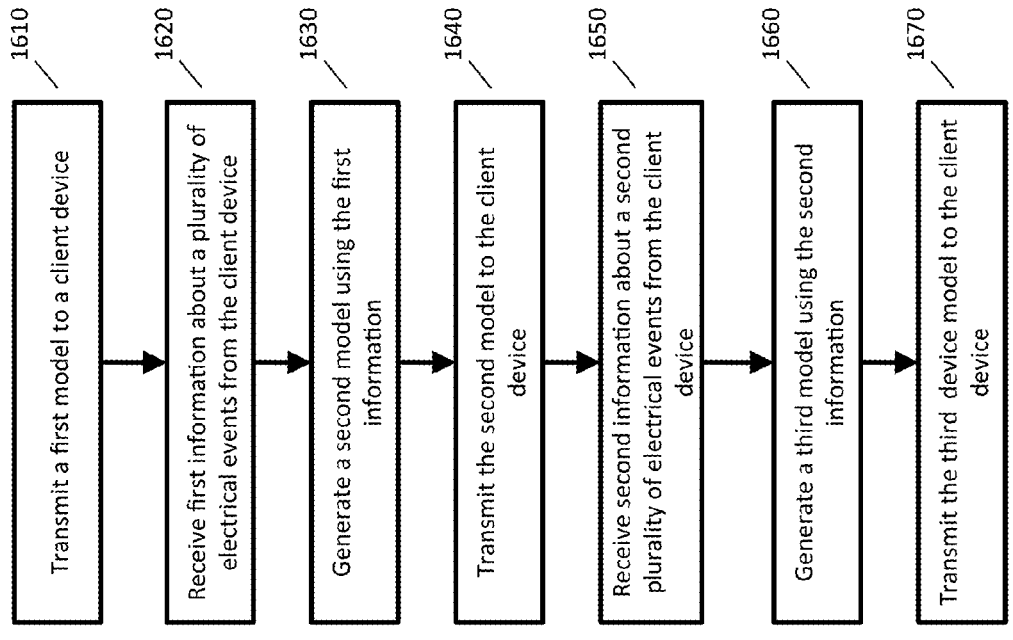
FIG. 16 is a flowchart showing an example implementation of determining house-specific models for determining information about devices.

In some implementations, house-specific models may be generated as described in the following clauses and as illustrated in FIG. 16.

1. A method for updating models for determining information about devices, the method comprising:
transmitting a first model to a client device, wherein the first model corresponds to a first class of devices;
receiving first information about a first plurality of electrical events from the client device, wherein each of the first plurality of electrical events is associated with the first model;
selecting a second model using the first information, wherein the second model corresponds to a specific device or a second class of devices; and
transmitting the second model to the client device.

2. The method of clause 1, further comprising:
receiving second information about a second plurality of electrical events from the client device, wherein each of the second plurality of electrical events is associated with the second model;
modifying the second model using the second information; and
transmitting the modified second model to the client device.

3. The method of clause 1, further comprising:
receiving second information about a second plurality of electrical events from the client device, wherein each of the second plurality of electrical events is associated with the second model;
training a third model using the second information; and
transmitting the third model to the client device.

4. The method of clause 3, further comprising:
receiving third information about a third plurality of electrical events from a second client device, wherein each of the third plurality of electrical events is associated with the second model; and
wherein training the third model comprises using the third information.

5. The method of clause 1, wherein selecting the second model comprises selecting the second model from a plurality of models using a score generated by processing the first information with the second model.

6. The method of clause 1, wherein the first model comprises a transition model or a device model.

7. The method of clause 1, wherein the specific device corresponds to a version of a device by a manufacturer.

FIG. 16 is a flowchart showing an example implementation of generating house-specific models, which may be performed, for example, by server 140. At step 1610, a first model is transmitted to a client device, such as power monitor 120. The first model may be transmitted to the client device during manufacture so that the model is present when the client device is purchased by a user, or the first model may be transmitted to the client device after the client device has been purchased and installed by the user. The first model may be any of the models discussed above, including, for example, a transition model or a device model. The first model may correspond to a class of devices because information is not yet available about devices in the home. At step 1620, first information about a first plurality of electrical events is received from the client device. The first information may comprise a plurality of features generated from an electrical signal. The first information may be generated during the normal operation of the client device to detect device events in the home or may be specifically generated for updating or adapting models. At step 1630, a second model is generated using the first information and using any of the techniques described above. For example, the second model may be generated by selecting from a plurality of models using a device discovery process as described above, modifying an existing model (such as the first model), or training a new model using the first information. The second model may be specific to a house in that it corresponds to a class of devices in the house (e.g., Whirlpool dishwashers), a specific version of a device (e.g., version 1000 Whirlpool dishwasher), or may be adapted to specific characteristics of the device in the home (e.g., a peculiarity of the motor of the user's dishwasher). At step 1640, the second model may be transmitted to the client device. At steps 1650-1670, the same process may be repeated to again generate another house specific model. Steps 1650-1670 may be repeated on an ongoing basis to continuously update models as new models and/or training data become available.

In some implementations, device events may be determined as described in the following clauses and as illustrated in FIG. 17.

1. A method for detecting device events, the method comprising:
obtaining a graph comprising a plurality of nodes including a first node;
receiving a plurality of features corresponding to an electrical event;

processing the plurality of features with a first model to generate a first score, wherein the first model corresponds to a state change of a first device;

processing the plurality of features with a second model to generate a second score, wherein the second model corresponds to a state change of a second device;

adding a second node to the graph, wherein the second node corresponds to the state change of the first device and wherein the second node follows the first node; and adding a third node to the graph, wherein the third node corresponds to the state change of the second device and wherein the third node follows the first node.

2. The method of clause 1, wherein the first score is generated using at least one of a transition model, a wattage model, or a prior model.

3. The method of clause 1, further comprising removing the third node from the graph based at least in part on the second score.

4. The method of clause 1, wherein the first node indicates a state for each of a plurality of devices.

5. The method of clause 1, wherein the first model is selected using a first device model for the first device, and wherein the first device model indicates allowable state transitions for the first device.

6. The method of clause 1, further comprising:

receiving a second plurality of features corresponding to a second electrical event;

processing the second plurality of features with a third model to generate a third score, wherein the third model corresponds to a state change of a third device;

processing the plurality of features with a fourth model to generate a fourth score, wherein the fourth model corresponds to a state change of a fourth device;

adding a fourth node to the graph, wherein the fourth node corresponds to the state change of the third device and wherein the fourth node follows the second node; and adding a fifth node to the graph, wherein the fifth node corresponds to the state change of the fourth device and wherein the fifth node follows the second node.

7. The method of clause 1, wherein the graph is a directed acyclic graph.

FIG. 17 is a flowchart showing an example implementation of determining device events, which may be performed, for example, by power monitor 120. At step 1710, a graph is obtained comprising a plurality of nodes including a first node. The graph may be, for example, a directed acyclic graph or a search graph as described above. Each node of the plurality of nodes may correspond to a possible or hypothesized state of a plurality of devices. At step 1720, a plurality of features is received corresponding to an electrical event. The features may be determined using any of the techniques described above. At step 1730, the plurality of features is processed with a first model corresponding to a state change of a first device, such as a light bulb transitioning from an off state to an on state. At step 1740, the plurality of features is processed with a second model corresponding to a state change of a second device. Similarly, the plurality of features may be processed with additional models corresponding to state changes of other devices. The processing of the features with the models may generate scores using any of the techniques described above, for example, using one or more of a transition score, a wattage score, or a prior score. The processing of the features with the models may correspond to either a real-time mode or a historical mode as described above. At step 1750, a second node is added to the graph following the first node, wherein the second node corresponds to the state change of the first device. At step 1760, a third node is added to the graph following the first node, wherein the third node corresponds to the state change of the second device. Steps 1720-1760 may be repeated to process features for subsequent electrical events to add additional nodes to the graph. Further, the nodes of the graph may later be pruned based on scores correspond to nodes and/or paths of the graph. For example, nodes corresponding lower scores may be removed to reduce computations.

FIG. 18 is a flowchart showing an example implementation of providing notifications by processing electrical signals, which may be performed, for example, by power monitor 120, either alone or combination with other computers, such as server 140. At step 1810, an electrical signal is obtained. For example, the electrical signal may be a power, current, or voltage signal. At step 1820, a plurality of features are obtained from the electrical signal using any of the techniques described above. The features may or may not be associated with an electrical event. At step 1830, a first state chance of a first device is selected using any of the techniques described above. In some implementations, the first state change of the first device is selected by processing the features with one or models, such as transition models and device models. In some implementations, models may be associated with specific devices or classes or types of devices, and the first state change of the first device may be determined by comparing scores produced by different models and selecting a highest score. At step 1840, a notification score is computing using a notification event model and the first state change of the first device. The notification event model may correspond to a notification event, such as the refrigerator door being left open for a longer than a threshold length of time. The notification event model may be created using any of the techniques described above and may use any of the information described above as inputs. At step 1850, it is determined to send a notification to the user. This determination may be made using any of the techniques and any of the data described above. In some implementations, the notification event model may output one or more of a score and a confidence level, and it may be determined to send a notification by comparing one or more of the score and the confidence level to a threshold. At step 1860, an action is taken to cause the notification to be sent to the user. The notification may be sent using any of the techniques described above. The notification may be sent immediately or may be scheduled for a later time.

FIG. 19 is a flowchart showing an example implementation of labeling devices in a building, which may be performed, for example, by power monitor 120, either alone or combination with other computers, such as server 140. At step 1910, an electrical signal is obtained. For example, the electrical signal may be a power, current, or voltage signal. At step 1920, a plurality of features are obtained from the electrical signal using any of the techniques described above. The features may or may not be associated with an electrical event. At step 1930, a plurality of scores are computed using a plurality of models. In some implementations, each model corresponds to a device or a class of devices. For example, a model corresponding to a device may include a make and version of a device, such as a Kenmore model 1000 dishwasher. A model may correspond to a class of devices, such as a Kenmore dishwashers or just dishwashers. The models may be implemented using any of the techniques described above and may use as inputs any of the information described above (e.g., the electrical signal, electrical events, or features). Each model may output a score and/or a confidence level indicating the match of the model to the inputs. At step 1940, one or models are selected, such as a first model, using the plurality of scores. For example, a model may be selected based on a highest score. Each model may be associated with information, such as information relating to a device or class of devices the model is associated with. The information relating to the first model may be retrieved from any appropriate storage location, such as the model itself or a database of model information. At step 1950, the first information is presented to the user, and second information is received from the user. The presentation and reception of the first and second information may use any known user interface techniques, such as those described above. At step 1960, a first device is associated with a label using the second information. For example, a first device may be added to a device list, and the first device in the device list may be associated with a label indicating information about the device, such as a make, version, or class.

FIG. 20 is a flowchart showing another example implementation of labeling devices in a building, which may be performed, for example, by power monitor 120, either alone or combination with other computers, such as server 140. At step 2010, an action is taken to cause a prompt to be displayed to a user and first information is received from the user. The prompt may be displayed to the user in response to the user taking an action, such as initiating a process to provide information about devices, or the prompt may be displayed to the user without the user taking an action, such as informing the user that a new device has been found. The reception of the first information may use any known user interface techniques, such as those described above. At step 2020, a plurality of models is obtained using the first information. For example, the first information may indicate that the user has a dishwasher, and models may be obtained corresponding to different classes or types of dishwashers. At step 2030, an electrical signal is received and features are computed from the electrical signal, using any of the techniques described above. At step 2040, a plurality of scores is computed using a plurality of models. In some implementations, each model corresponds to a device or a class of devices. For example, a model corresponding to a device may include a make and version of a device, such as a Kenmore model 1000 dishwasher. A model may correspond to a class of devices, such as a Kenmore dishwashers or just dishwashers. The models may be implemented using any of the techniques described above and may use as inputs any of the information described above (e.g., the electrical signal, electrical events, or features). Each model may output a score and/or a confidence level indicating the match of the model to the inputs. At step 2050, one or models are selected, such as a first model, using the plurality of scores. For example, a model may be selected based on a highest score. At step 2060, a first device is associated with a label using the first model or the first information. For example, a first device may be added to a device list, and the first device in the device list may be associated with a label indicating information about the device, such as a make, version, or class. In some implementations, a user may be requested to change the state of a device. For example, at step 2010, the user may indicate that he or she has a dishwasher, and after providing this information, the user may be prompted to start the dishwasher so that the dishwasher changes how it is consuming electricity. In some implementations, the user may also be requested to provide confirmation that he or she has completed changing the state of the device. A portion of the electrical signal, which is received between prompting the user to change the state of a device and receiving confirmation that the state of the device has been changed, may be used, for example, at step 2040 to generate scores for selecting a model and then labeling a device.

While only a few embodiments of the present invention have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The processor may be part of a server, cloud server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, cloud server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another, such as from usage data to a normalized usage dataset.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipments, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

All documents referenced herein are hereby incorporated by reference.

What is claimed is:

1. One or more non-transitory computer-readable media comprising computer executable instructions that, when executed, cause at least one processor to perform actions comprising:
   causing a prompt to be displayed to a user requesting that the user provide first information corresponding to a first device;
   receiving the first information from the user corresponding to the first device;
   obtaining a plurality of mathematical models using the first information, wherein each model of the plurality of mathematical models corresponds to a device or a class of devices;
   measuring an electrical signal from the building, wherein the electrical signal powers a plurality of devices;
   computing a plurality of features from the measured electrical signal;
   computing a plurality of scores using the plurality of mathematical models and the plurality of features, wherein (i) the plurality of mathematical models comprises a first mathematical model and (ii) the plurality of scores comprises a first score computed using the first model and the plurality of features;
   selecting the first mathematical model using the plurality of scores; and
   associating the first device with the first mathematical model.

2. The one or more non-transitory computer-readable media of claim 1, the actions further comprising:
   after causing the prompt to be displayed and before computing the plurality of features, causing a second prompt to be displayed to the user requesting that that user change a state of the first device.

3. The one or more non-transitory computer-readable media of claim 1, the actions further comprising:
   receiving an indication from the user that the user has changed a state of the first device.

4. The one or more non-transitory computer-readable media of claim 1, wherein the prompt is displayed to the user in response to the user performing an action.

5. The one or more non-transitory computer-readable media of claim 1, wherein the first information corresponds to a class of the first device, a make of the first device, or a version of the first device.

6. The one or more non-transitory computer-readable media of claim 1, wherein the first mathematical model comprises a transition model or a device model.

7. The one or more non-transitory computer-readable media of claim 1, wherein selecting the first mathematical model using the plurality of scores comprises selecting a model with a highest score.

8. A computer-implemented method for labeling devices in a building utilizing an electrical signal representative of the electrical usage of the devices, the method comprising:
   receiving first information from a user corresponding to a first device in the building;
   obtaining a plurality of mathematical models using the first information, wherein each model of the plurality of mathematical models corresponds to a device or a class of devices;
   computing a plurality of features from the electrical signal;

computing a plurality of scores using the plurality of mathematical models and the plurality of features;

selecting a first mathematical model from the plurality of mathematical models using the plurality of scores; and associating the first device with the first mathematical model.

9. The method of claim 8, further comprising requesting a user to change a state of the first device.

10. The method of claim 9 further comprising receiving an indication from the user that the user has changed a state of the first device.

11. The method of claim 8, wherein the first information corresponds to a class of the first device, a make of the first device, or a version of the first device.

12. The method of claim 8, wherein the first mathematical model comprises a transition model or a device model.

13. The method of claim 8, wherein selecting a first mathematical model from the plurality of mathematical models using the plurality of scores further comprises selecting a model from the plurality of models with a highest score.

14. The method of claim 8, wherein the first information indicates that a make or version of the first device is unknown.

15. A system for labeling devices in a building utilizing an electrical signal representative of the electrical usage of the devices, the system comprising:

one or more computers comprising at least one processor and at least one memory, the one or more computers configured to:

receive first information from a user corresponding to a first device in the building;

obtain a plurality of mathematical models using the first information, wherein each model of the plurality of mathematical models corresponds to a device or a class of devices;

compute a plurality of features from the electrical signal;

compute a plurality of scores using the plurality of mathematical models and the plurality of features;

select a first mathematical model from the plurality of mathematical models using the plurality of scores; and associate the first device with the first mathematical model.

16. The system of claim 15, wherein the one or more computers are further configured to request a user to change a state of the first device.

17. The system of claim 16, wherein the one or more computers are further configured to receive an indication from the user that the user has changed a state of the first device.

18. The system of claim 15, wherein the first information corresponds to a class of the first device, a make of the first device, or a version of the first device.

19. The system of claim 15, wherein the first mathematical model comprises a transition model or a device model.

20. The system of claim 15, wherein selecting a first mathematical model from the plurality of mathematical models using the plurality of scores further comprises selecting a model from the plurality of models with a highest score.

* * * * *

UNITED STATES PATENT AND TRADEMARK OFFICE
CERTIFICATE OF CORRECTION

| | | |
|---|---|---|
| PATENT NO. | : 9,691,030 B2 | Page 1 of 1 |
| APPLICATION NO. | : 15/217420 | |
| DATED | : June 27, 2017 | |
| INVENTOR(S) | : Christopher M. Micali | |

It is certified that error appears in the above-identified patent and that said Letters Patent is hereby corrected as shown below:

In the Specification

In Column 5, Line 58, delete "may by" and insert -- may be -- therefor.

In Column 21, Line 61, delete "may by" and insert -- may be -- therefor.

In Column 38, Line 13, delete "wifi" and insert -- Wi-Fi -- therefor.

In the Claims

In Column 62, Line 37, in Claim 2, delete "that that" and insert -- that the -- therefor.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*